(12) United States Patent (10) Patent No.: US 9,207,365 B2
Ueno et al. (45) Date of Patent: Dec. 8, 2015

(54) IMAGING LENS AND SOLID STATE IMAGING DEVICE

(71) Applicant: Kabushiki Kaisha Toshiba, Minato-ku (JP)

(72) Inventors: Risako Ueno, Meguro (JP); Hiroto Honda, Yokohama (JP); Mitsuyoshi Kobayashi, Oota (JP); Kazuhiro Suzuki, Minato (JP); Honam Kwon, Kawasaki (JP); Hideyuki Funaki, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/460,862

(22) Filed: Aug. 15, 2014

(65) Prior Publication Data

US 2015/0077622 A1   Mar. 19, 2015

(30) Foreign Application Priority Data

Sep. 18, 2013 (JP) ................................ 2013-193519

(51) Int. Cl.
*G02B 3/02* (2006.01)
*G02B 9/34* (2006.01)
(Continued)

(52) U.S. Cl.
CPC ............ *G02B 3/0056* (2013.01); *G02B 13/004* (2013.01); *G02B 13/0055* (2013.01);
(Continued)

(58) Field of Classification Search
CPC ............... H04N 5/2254; G02B 13/004; G02B 13/0015; G02B 9/34; G02B 13/18; G02B 13/16; G02B 13/001; G02B 5/005; G02B 9/02

USPC ................. 359/715, 738–740, 747, 773, 798; 348/360

See application file for complete search history.

(56) References Cited

U.S. PATENT DOCUMENTS

| 8,400,553 B2 * | 3/2013 | Yamashita et al. ............. 359/773 |
| 2005/0105194 A1 * | 5/2005 | Matsui et al. .................. 359/772 |

(Continued)

FOREIGN PATENT DOCUMENTS

| CN | 101883215 A | 11/2010 |
| CN | 101888481 A | 11/2010 |

(Continued)

OTHER PUBLICATIONS

Keith Fife, et al., "A 3D Multi-Aperture Image Sensor Architecture" IEEE Custom Integrated Circuits Conference, 2006, pp. 281-284.

(Continued)

*Primary Examiner* — Evelyn A Lester
(74) *Attorney, Agent, or Firm* — Oblon, McClelland, Maier & Neustadt, L.L.P.

(57) ABSTRACT

According to one embodiment, an imaging lens includes a first optical system and a microlens array. The first optical system includes an optical axis. The microlens array is provided between the first optical system and an imaging element. The microlens array includes microlens units provided in a first plane. The imaging element includes pixel groups. Each of the pixel groups includes pixels. The microlens units respectively overlap the pixel groups when projected onto the first plane. The first optical system includes an aperture stop, a first lens, a second lens, a third lens, and a fourth lens. The first lens is provided between the aperture stop and the microlens array. The second lens is provided between the first lens and the microlens array. The third lens is provided between the second lens and the microlens array. The fourth lens is provided between the third lens and the microlens array.

15 Claims, 49 Drawing Sheets

(51) Int. Cl.
*G02B 27/02* (2006.01)
*G02B 3/00* (2006.01)
*G02B 13/00* (2006.01)
*H04N 5/225* (2006.01)
*G02B 13/16* (2006.01)
*G02B 5/00* (2006.01)
*G02B 13/18* (2006.01)
*G03B 9/02* (2006.01)

(52) U.S. Cl.
CPC .............. *H04N5/2251* (2013.01); *G02B 5/005* (2013.01); *G02B 9/34* (2013.01); *G02B 13/001* (2013.01); *G02B 13/0015* (2013.01); *G02B 13/16* (2013.01); *G02B 13/18* (2013.01); *G03B 9/02* (2013.01); *H04N 5/2254* (2013.01)

(56) References Cited

U.S. PATENT DOCUMENTS

| | | | |
|---|---|---|---|
| 2008/0037131 A1* | 2/2008 | Steenblik et al. | 359/619 |
| 2008/0043346 A1 | 2/2008 | Sano | |
| 2008/0239138 A1 | 10/2008 | Sano | |
| 2009/0179142 A1* | 7/2009 | Duparre et al. | 250/208.1 |
| 2009/0257133 A1* | 10/2009 | Sano et al. | 359/715 |
| 2010/0060996 A1* | 3/2010 | Ozaki | 359/715 |
| 2011/0075271 A1 | 3/2011 | Tang et al. | |
| 2011/0134305 A1 | 6/2011 | Sano et al. | |
| 2012/0019705 A1 | 1/2012 | Sano et al. | |
| 2012/0021802 A1 | 1/2012 | Sano et al. | |
| 2012/0026369 A1 | 2/2012 | Sano et al. | |
| 2012/0026388 A1 | 2/2012 | Sano et al. | |
| 2012/0062771 A1 | 3/2012 | Ueno et al. | |
| 2012/0081596 A1 | 4/2012 | Tanaka et al. | |
| 2013/0075586 A1 | 3/2013 | Ueno et al. | |
| 2013/0169852 A1 | 7/2013 | Sano et al. | |
| 2013/0176469 A1 | 7/2013 | Sano et al. | |
| 2013/0335588 A1* | 12/2013 | Matsusaka et al. | 359/773 |

FOREIGN PATENT DOCUMENTS

| | | |
|---|---|---|
| JP | 2007-322844 A | 12/2007 |
| JP | 2008-46526 A | 2/2008 |
| JP | 2008-90150 A | 4/2008 |
| JP | 2008-242180 A | 10/2008 |
| JP | 2010-60835 A | 3/2010 |
| JP | 2010-96820 A | 4/2010 |
| JP | 2011-232772 A | 11/2011 |
| JP | 2012-65021 A | 3/2012 |
| JP | 2013-74009 A | 4/2013 |
| TW | 200825449 | 6/2008 |
| TW | 201307887 A1 | 2/2013 |
| TW | 201323917 A1 | 6/2013 |
| TW | 201323920 A1 | 6/2013 |
| WO | WO 2010/140515 A1 | 12/2010 |

OTHER PUBLICATIONS

Office Action issued Sep. 14, 2015 in Taiwanese Patent Application No. 103128302 (with English translation).

* cited by examiner

IMAGING LENS AND SOLID STATE IMAGING DEVICE

CROSS-REFERENCE TO RELATED APPLICATIONS

This application is based upon and claims the benefit of priority from Japanese Patent Application No. 2013-193519, filed on Sep. 18, 2013; the entire contents of which are incorporated herein by reference.

FIELD

Embodiments described herein relate generally to an imaging lens and a solid state imaging device.

BACKGROUND

Various methods are being used as imaging technology that can obtain lengths in the depth direction of a subject as two-dimensional information (a range image) such as technology that uses a reference beam to measure the reflected light intensity and/or return time from the subject, stereoscopic ranging technology using multiple cameras, etc. Better subject recognition is possible by using range image information than by using the image information obtained from a normal camera. Therefore, the demand is increasing for applications of range image information as new input information in relatively inexpensive products for appliances, games, industrial applications, etc.

Among distance imaging methods, a solid state imaging device that includes an imaging optical system and multiple optical systems has been proposed as a configuration in which a single camera is used to obtain many sets of parallax and the ranging is performed based on triangulation. In such a solid state imaging device, multiple optical systems are disposed as a re-imaging optical system between the imaging optical system and the imaging element. For example, a microlens array in which many microlenses are formed on a plane is used as the multiple optical systems.

Multiple pixels are disposed under each of the microlenses. The images that are demagnified by the imaging optical systems are imaged on the imaging element by the microlens array. The simple-eye images that are imaged have viewpoints shifted by the amount of parallax existing due to the arrangement position of each microlens.

The distance estimation of the subject is possible using the principle of triangulation by performing signal processing of the images of the parallax image groups obtained from many microlenses. Further, it is possible to reconstruct the images as a two-dimensional image by performing image processing to link the images together.

In an imaging lens and a solid state imaging device, it is desirable to acquire both a high-precision range image and a good visible image.

DETAILED DESCRIPTION

Figure 1:
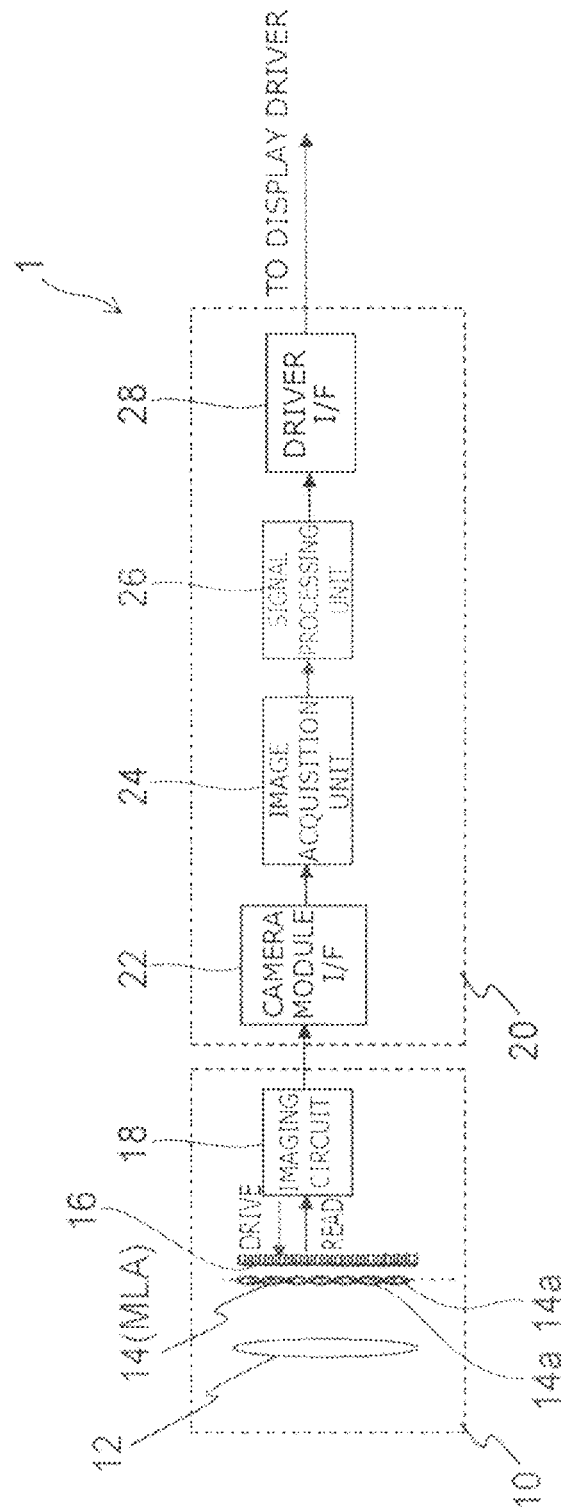
FIG. 1 is a block diagram illustrating a solid state imaging device according to the embodiment.

According to one embodiment, an imaging lens includes a first optical system and a microlens array. The first optical system includes an optical axis. The microlens array is provided between the first optical system and an imaging element. The microlens array includes a plurality of microlens units provided in a first plane. The imaging element includes a plurality of pixel groups. Each of the pixel groups includes a plurality of pixels. The microlens units respectively overlap the pixel groups when projected onto the first plane. The first optical system includes an aperture stop, a first lens, a second lens, a third lens, and a fourth lens. The first lens is provided between the aperture stop and the microlens array, and has a positive refractive power. The first lens has a first surface, and a second surface, the first surface opposing the aperture stop, the second surface being provided between the first surface and the microlens array. The second lens is provided between the first lens and the microlens array, and has a negative refractive power. The second lens has a third surface, and a fourth surface, the third surface opposing the second surface, the fourth surface being provided between the third surface and the microlens array. The third lens provided is between the second lens and the microlens array, and has a positive refractive power. The third lens has a fifth surface, and a sixth surface, the fifth surface opposing the fourth surface, the sixth surface being provided between the fifth surface and the microlens array. The fourth lens is provided between the third lens and the microlens array, and has a negative refractive power. The fourth lens has a seventh surface, and an eighth surface, the seventh surface opposing the sixth surface, the eighth surface being provided between the seventh surface and the microlens array. A curvature radius of the first surface is positive. A curvature radius of the third surface and a curvature radius of the fourth surface are positive. A curvature radius of the fifth surface and a curvature radius of the sixth surface are negative. A curvature radius of the seventh surface and a curvature radius of the eighth surface are positive. At least one selected from the first to eighth surfaces has an aspherical configuration. Formulas (1) to (5) are satisfied, where f is a focal length of the first optical system, f1 is a focal length of the first lens, f2 is a focal length of the second lens, f3 is a focal length of the third lens, TL is a distance between the aperture stop and the imaging element, R7 is a curvature radius of the seventh surface, R8 is a curvature radius of the eighth surface, and D34 is an air spacing distance along the optical axis between the third lens and the fourth lens:

$$0.85 \leq |f1|/f < 1.0 \qquad (1)$$

$$1.5 < |f2|/f < 3.0 \qquad (2)$$

$$TL/f < 1.3 \qquad (3)$$

$$1 < (R7+R8)/(R7-R8) < 5 \qquad (4)$$

$$0 < D34/f < 0.05 \qquad (5).$$

Various embodiments will be described hereinafter with reference to the accompanying drawings. In the description hereinbelow, similar members are marked with like reference numerals, and a description is omitted as appropriate for members once described.

Configuration of Camera Module

FIG. 1 is a block diagram illustrating a solid state imaging device according to the embodiment.

The solid state imaging device 1 shown in FIG. 1 is, for example, a camera module.

As shown in FIG. 1, the solid state imaging device 1 includes an imaging module unit 10 and an imaging signal processor (hereinbelow, also called an ISP (Image Signal Processor)) 20.

The imaging module unit 10 includes an imaging optical system (a first optical system) 12, a microlens array 14 (hereinbelow, also called the MLA (Micro Lens Array)), an imaging element (a solid-state imaging element 16), and an imaging circuit 18.

The imaging optical system 12 functions as an imaging optical system that guides the light from the subject onto the solid-state imaging element 16. The solid-state imaging element 16 functions as an element that converts the light guided by the imaging optical system 12 into a signal charge. Multiple pixels (e.g., photodiodes used as photoelectric conversion elements) are arranged in a two-dimensional array configuration along the light reception surface.

The microlens array 14 includes, for example, multiple microlens units 14a. The microlens units 14a may be micro-optical systems such as prisms, etc. The individual microlens units 14a of the microlens array 14 demagnify the light ray group that is imaged at the imaging plane (the virtual imaging plane) by the imaging optical system 12. The image that is demagnified by each of the microlens units 14a is imaged on a pixel block (a group of multiple pixels) corresponding to the microlens unit 14a.

The imaging circuit 18 includes a drive circuit unit (not shown) that drives the pixels of the pixel array of the solid-state imaging element 16, and a pixel signal processing circuit unit (not shown) that processes the signals output from the pixel region.

The drive circuit unit includes, for example, a vertical selection circuit that sequentially selects the pixels to be driven in the vertical direction by horizontal line (row) units, a horizontal selection circuit that sequentially selects the pixels to be driven by column units, and a TG (timing generator) circuit that drives the vertical selection circuit and the horizontal selection circuit by various pulses.

The pixel signal processing circuit unit includes an AD conversion circuit that performs digital conversion of the analog electrical signals from the pixel region, a gain control/amplifier circuit that performs gain control and/or amplifier operations, and a digital signal processing circuit that performs correction processing of the digital signals, etc.

The ISP 20 includes a camera module I/F (an interface) 22, an image acquisition unit 24, a signal processing unit 26, and a driver I/F 28. The image acquisition unit 24 acquires, from the camera module I/F 22, the raw image obtained by the imaging by the imaging module unit 10.

The signal processing unit 26 implements signal processing of the raw image acquired by the image acquisition unit 24. The driver I/F (the interface) 28 outputs the image signal that has undergone the signal processing of the signal processing unit 26 to a not-shown display driver. The display driver displays the image that is imaged by the solid state imaging device 1.

Member Configuration of Camera Module

Figure 2:
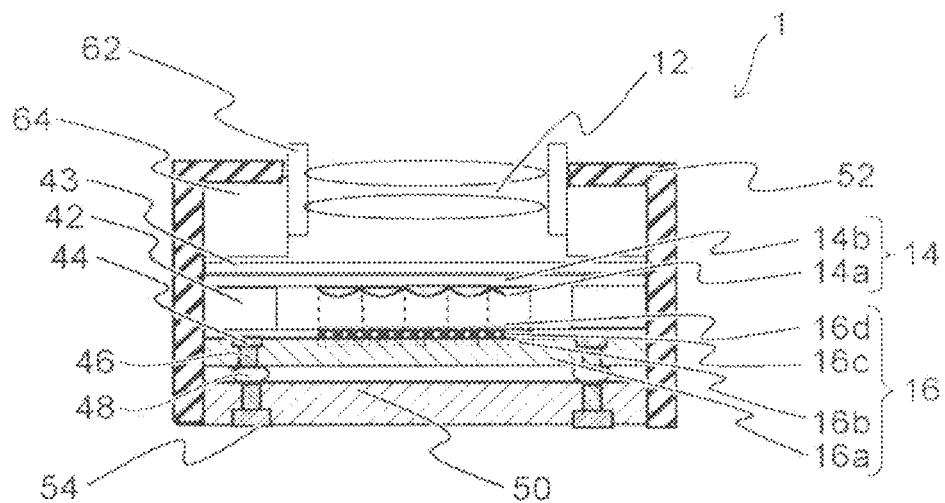
FIG. 2 is a schematic cross-sectional view illustrating the solid state imaging device according to the embodiment.

FIG. 2 is a schematic cross-sectional view illustrating the solid state imaging device according to the embodiment.

In the solid state imaging device 1 according to the embodiment as shown in FIG. 2, the solid-state imaging element 16 is formed in a semiconductor substrate 16a. The solid-state imaging element 16 includes multiple pixel groups 16e. Each of the multiple pixel groups 16e includes multiple pixels 16b. The multiple pixels 16b include photodiodes and are provided on the semiconductor substrate 16a. The pitch (the pixel pitch) between the mutually-adjacent pixels 16b is, for example, not less than about 0.7 micrometers (μm) and not more than about 2.7 μm. The size of the solid-state imaging element 16 is, for example, not less than about 3.0 millimeters (mm) and not more than about 6.0 mm in the longitudinal direction and not less than about 4.0 mm and not more than about 8.0 mm in the lateral direction. The volume of the entire solid state imaging device 1 is, for example, about 1 cubic centimeter ($cm^3$).

A drive/read-out circuit (not shown) that drives the pixels 16b and reads the signals from the pixels 16b is formed on the semiconductor substrate 16a.

On each of the multiple pixels 16b, a color filter 16c of R (having a high transmittance for light of the red wavelength light region), G (having a high transmittance for light of the green wavelength light region), B (having a high transmittance for light of the blue wavelength light region), or W (transmitting red, green, and blue wavelength light) is formed for every pixel 16b. A pixel concentrating microlens 16d may be formed at the upper portion of the color filter 16c every one pixel 16b.

The microlens array 14 is disposed on the color filter 16c. The microlens array 14 includes a visible light-transmissive substrate 14b, and the microlens units 14a formed on the visible light-transmissive substrate 14b. The microlens units 14a are disposed on the solid-state imaging element 16 side as viewed from the visible light-transmissive substrate 14b. The multiple microlens units 14a are provided in a first plane 14p. The multiple microlens units 14a are arranged in a two-dimensional array configuration on the visible light-transmissive substrate 14b. The microlens units 14a are provided to correspond to the pixel blocks made of the multiple pixels 16b provided on the semiconductor substrate 16a. In other words, the multiple microlens units 14a respectively overlap the multiple pixel groups 16e when projected onto the first plane 14p. Each of the microlens units 14a functions as an optical system that performs demagnification and imaging onto the corresponding pixel block.

The visible light-transmissive substrate 14b is provided to be separated from the solid-state imaging element 16. A spacer 42 that includes a resin material, etc., is provided between the visible light-transmissive substrate 14b and the semiconductor substrate 16a in which the solid-state imaging element 16 is formed. The visible light-transmissive substrate 14b is bonded to the semiconductor substrate 16a via the spacer 42. The alignment when bonding the semiconductor substrate 16a and the visible light-transmissive substrate 14b is performed using an alignment mark, etc., as a reference.

The visible light-transmissive substrate 14b may be a material that not only transmits visible light but also cuts, for example, unnecessary near-infrared light. A multilayered film or a single-layer film that transmits visible light and reflects near-infrared light may be formed in the visible light-transmissive substrate 14b.

Also, an optical filter 43 is provided at the upper portion of the visible light-transmissive substrate 14b as necessary. In the example, the optical filter 43 is provided between the imaging optical system 12 and the microlens array 14. In the case where the visible light-transmissive substrate 14b does not function to cut near-infrared light, the optical filter 43 that has a similar function is disposed separately.

Further, an electrode pad 44 for reading the pixels 16b is provided in the semiconductor substrate 16a. A vertical electrical connection 46 that is electrically connected to a processing and driver chip is made in the lower portion of the electrode pad 44 to pierce the semiconductor substrate 16a.

The semiconductor substrate 16a is electrically connected to the processing and driver chip 50 via the vertical electrical connection 46 and a bump 48. The drive processing circuit (the imaging circuit 18) that drives the solid-state imaging element 16 and processes the signals that are read is formed in the processing and driver chip 50. The electrical connection between the semiconductor substrate 16a and the processing and driver chip 50 is not limited to the vertical electrical connection 46; and the electrical connection may be made by a metal wire, etc., between electrode pads provided on the two chips.

The imaging optical system 12 is provided above the visible light-transmissive substrate 14b. The imaging optical system 12 includes multiple lenses. The imaging optical system 12 is mounted to a lens optical column 62. The lens optical column 62 is mounted to a lens holder 64. Due to the relationship between the insertion pressure and the output image, the mounting position of the imaging optical system 12 may be adjusted when mounting the lens holder 64.

A light-shielding cover 52 that shields unnecessary light is mounted around the semiconductor substrate 16a, the visible light-transmissive substrate 14b, and the processing and driver chip 50. A module electrode 54 that electrically connects the processing and driver chip 50 to the outside is provided in the lower portion of the processing and driver chip 50.

Microlens Geometrical Optical Relationship Diagram

The geometrical optical relationship of the optical system (the virtual image optical system) of the solid state imaging device 1 of the embodiment will now be described.

Figure 3A:
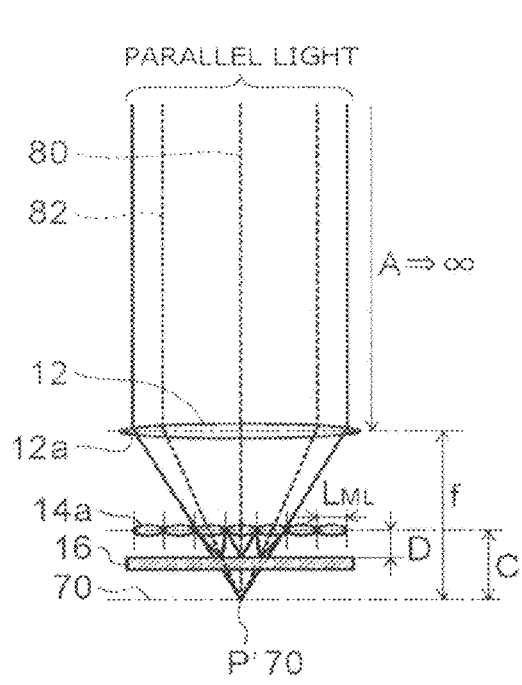
FIG. 3A and FIG. 3B illustrate the relationship between light ray groups and the distance from the subject to the imaging lens.
Figure 3B:
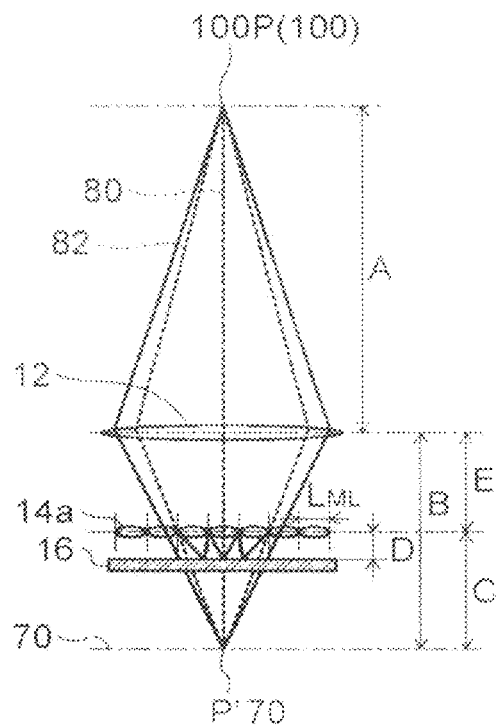

FIG. 3A and FIG. 3B illustrate the relationship between light ray groups and the distance from the subject to the imaging lens.

Figure 4:
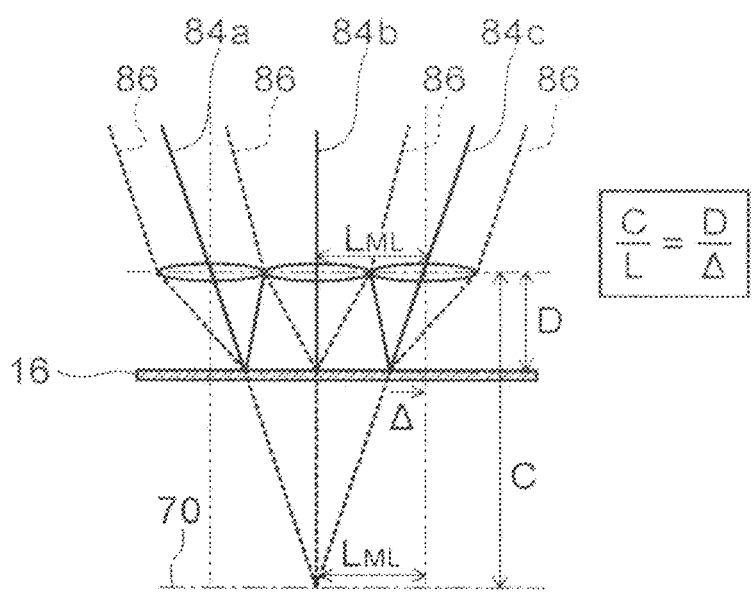
FIG. 4 illustrates the geometrical optical relationship of the microlenses at the optical-axis center of the imaging lens.

FIG. 4 illustrates the geometrical optical relationship of the microlenses at the optical-axis center of the imaging lens.

Figure 5:
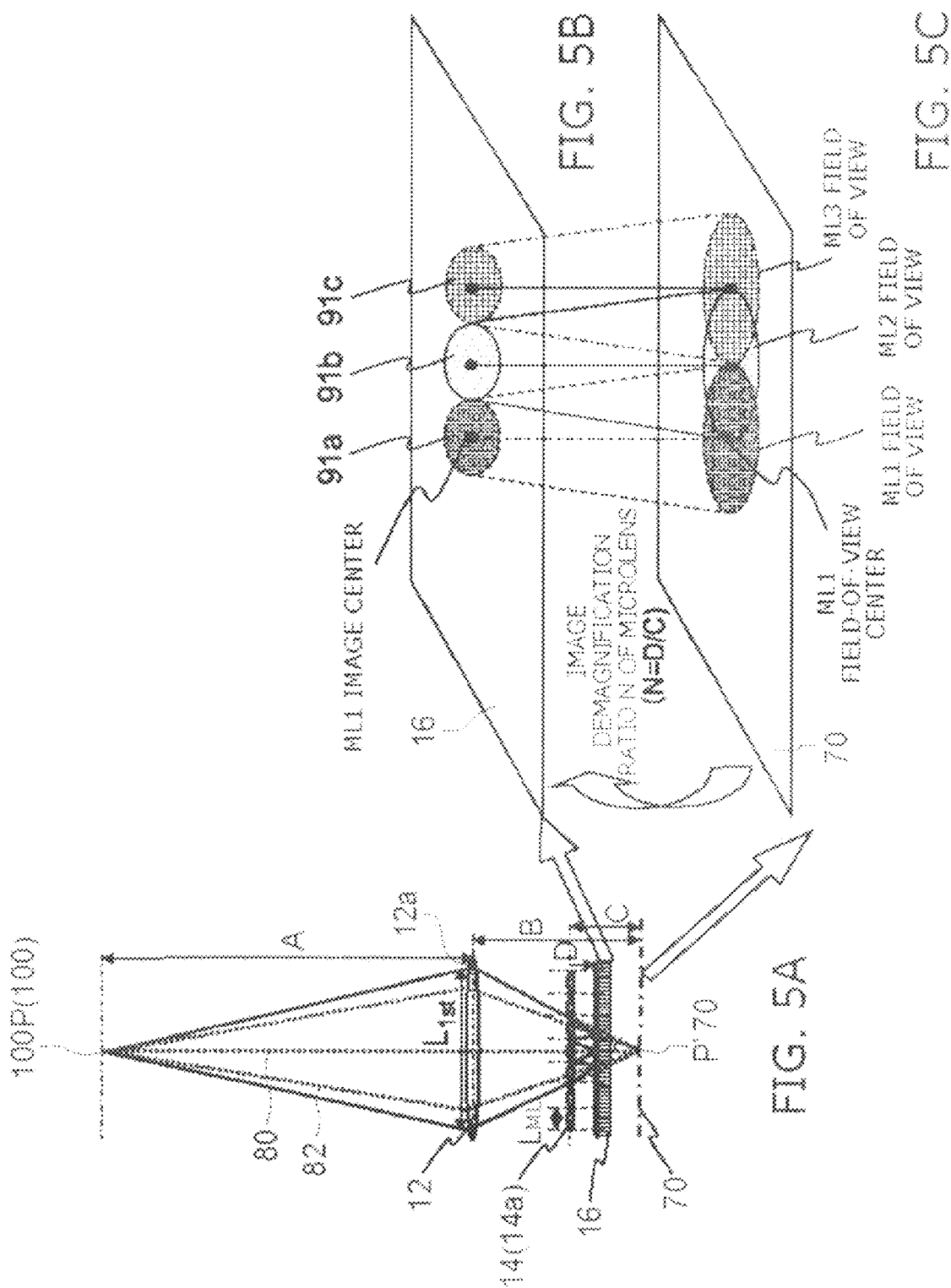
FIG. 5A to FIG. 5C illustrate the overlapping field of view relationship of the microlenses.

FIG. 5A to FIG. 5C illustrate the overlapping field of view relationship of the microlenses.

The imaging optical system 12 has an optical axis Ox. In the description hereinbelow, only the area proximal to the optical axis of the lenses of the imaging optical system 12 is described for simplification.

When considering only the imaging optical system 12, a chief ray from a subject point P on the optical axis and peripheral light which is from the same family of light rays as the chief ray are imaged at a virtual imaging plane 70 which is determined by the focal length f of the imaging optical system and a distance A between the imaging optical system 12 and the subject point 100P so that the relationship of Formula 1 is satisfied.

$$\frac{1}{f} = \frac{1}{A} + \frac{1}{B} \qquad \text{[Formula 1]}$$

Here, f is the focal length of the imaging optical system 12, A is the distance from an object-side principal plane 12a of the imaging optical system 12 to the subject point 100P, and B is the distance from an image-side principal plane 12a of the imaging optical system 12 to a virtual imaging point P''70. The image magnification (the horizontal magnification) of the imaging optical system 12 is expressed by Formula 2 recited below.

$$M = \frac{B}{A} \qquad \text{[Formula 2]}$$

Here, in the embodiment, the virtual imaging point P''70 of the imaging optical system 12 is positioned rearward (on the side opposite to the subject 100) of the solid-state imaging element 16. In other words, the solid-state imaging element 16 is provided between the virtual imaging point P''70 and the imaging optical system 12. For example, the virtual imaging point P''70 is a point that is positioned at the focal length f from the imaging optical system 12. In such a case, because the microlens units 14a are disposed frontward of the virtual imaging point P''70, the light is concentrated onto the surface of the solid-state imaging element 16 that includes the pixels and is positioned frontward of the virtual imaging plane 70. In such a case, light ray groups 80 and 82 are demagnified and imaged with a virtual image relationship. The optical imaging system of the microlens units 14a is expressed by Formula 3 recited below.

$$\frac{1}{g} = -\frac{1}{C} + \frac{1}{D} \qquad \text{[Formula 3]}$$

Here, g is the focal length of the microlens units 14a, C is the distance from the object-side principal plane of the microlens units 14a to the virtual imaging point P''70, and D is the distance from the image-side principal plane of the microlens units 14a to the optical imaging points of the microlenses. In such a case, the image magnification due to the optical imaging system of the microlens units 14a is expressed by Formula 4 recited below.

$$N = \frac{D}{C} \qquad \text{[Formula 4]}$$

Here, variable E of Formula 5 recited below is introduced from the geometrical optical relationship. Variable E is a fixed design value in the case where the optical system is a fixed focus optical system.

$$E = B - C \qquad \text{[Formula 5]}$$

Here, for two adjacent microlens units 14a, $L_{ML}$ is the arrangement pitch of the microlens units 14a or the distance between the microlens units 14a. In such a case, light ray groups 84a, 84b, 84c, and 86 that are emitted from the same subject are distributed by adjacent multiple microlens units 14a to be imaged on the multiple locations of image points p1, p2, p3, . . . . Here, $L_{ML}$ and an image shift length Δ on one side are expressed by Formula 6 recited below from the geometrical optical relationship of the chief rays 84a, 84b, and 84c for each of the microlens units 14a shown in FIG. 4.

$$\frac{C}{L_{ML}} = \frac{D}{\Delta} \qquad \text{[Formula 6]}$$

From Formula 1, Formula 2, and Formula 6, the shift length Δ of the image and the distance A from the imaging optical system 12 to the subject have the relationship shown in Formula 7 recited below.

$$A = \left(\frac{1}{f} - \frac{1}{B}\right)^{-1} = \left(\frac{1}{f} - \frac{1}{E+C}\right)^{-1} = \left(\frac{1}{f} - \frac{1}{E + \frac{DL_{ML}}{\Delta}}\right)^{-1} \qquad \text{[Formula 7]}$$

In Formula 7, f, E, and $L_{ML}$ are parameters of design and are known fixed values; and Δ and D are determined uniquely from A.

Here, D can be taken to be a fixed value D0 because the change amount of D is extremely small compared to the change amount of A. D0 is the distance from the image-side principal plane of the microlens units 14a to the surface of the solid-state imaging element 16. In such a case, Formula 7 is expressed as Formula 8 recited below.

$$A = \left(\frac{1}{f} - \frac{1}{B}\right)^{-1} = \left(\frac{1}{f} - \frac{1}{E+C}\right)^{-1} = \left(\frac{1}{f} - \frac{1}{E + \frac{D_0 L_{ML}}{\Delta}}\right)^{-1} \quad \text{[Formula 8]}$$

Here, because f, E, D0, and $L_{ML}$ are design values and are known, the subject distance A is calculatable if the shift length $\Delta$ of the image can be sensed from the imaging element surface.

Image matching between the images of adjacent microlenses recorded by the imaging element is used to determine the shift length $\Delta$ between the images when using the imaging lens and the microlenses to image the light rays emitted from one subject point P at p1, p2, p3, . . . .

For the image matching, a well-known template matching method that examines, for example, the degree of similarity and/or the degree of dissimilarity between two images can be used. Further, when determining the shift position more precisely, the shift length can be determined more precisely by interpolating the degree of similarity and/or the degree of dissimilarity obtained for each pixel unit using a continuous fitting function, etc., and determining the subpixel positions where the fitting function has a maximum and/or a minimum.

Method for Reconstructing Two-Dimensional Image

A method for reconstructing a two-dimensional image without overlap from the microlens image groups when the same subject is multiply imaged will now be described with reference to FIG. 5A to FIG. 5C.

The case is considered where there are three adjacent microlens units 14a; and the three adjacent microlens units 14a respectively form microlens images 91a, 91b, and 91c at the surface of the solid-state imaging element 16 as shown in FIG. 5B.

Thus, to form the microlens images without overlap, it is sufficient for the F-number of the imaging optical system 12 and the F-number of the microlenses to match.

A field of view 93a, a field of view 93b, and a field of view 93c at the virtual imaging plane 70 are the fields of view where the images 91a, 91b, and 91c of the microlenses are imaged and are areas that overlap as shown in FIG. 5C. 5B and FIG. 5C show the case where an image demagnification ratio N is 0.5; and each field of view is multiplied by 0.5 to be imaged with a relationship such that each subject point overlaps two or more times. For the relationship N=0.5, the image at the virtual imaging plane 70 can be reproduced by multiplying each microlens image by 1/N, i.e., by 2.

The image demagnification ratio N can be known from the microlens image group after the imaging because Formula 9 recited below can be derived from the relationship of Formula 4 and Formula 6.

$$N = \frac{D}{C} = \frac{\Delta}{L_{ML}} \quad \text{[Formula 9]}$$

Because the pitch $L_{ML}$ of the microlenses is known, the image demagnification ratio N can be determined by determining the shift length $\Delta$ of the same subject from the images. The pitch $L_{ML}$ is, for example, not less than about 10 µm and not more than about 60 µm.

Synthesizing Method for Reconstructing Two-Dimensional Image

The image synthesizing method for reconstructing the two-dimensional image will now be described.

FIG. 6A to FIG. 6E illustrate the method for reconstructing the two-dimensional image.

Figure 6:
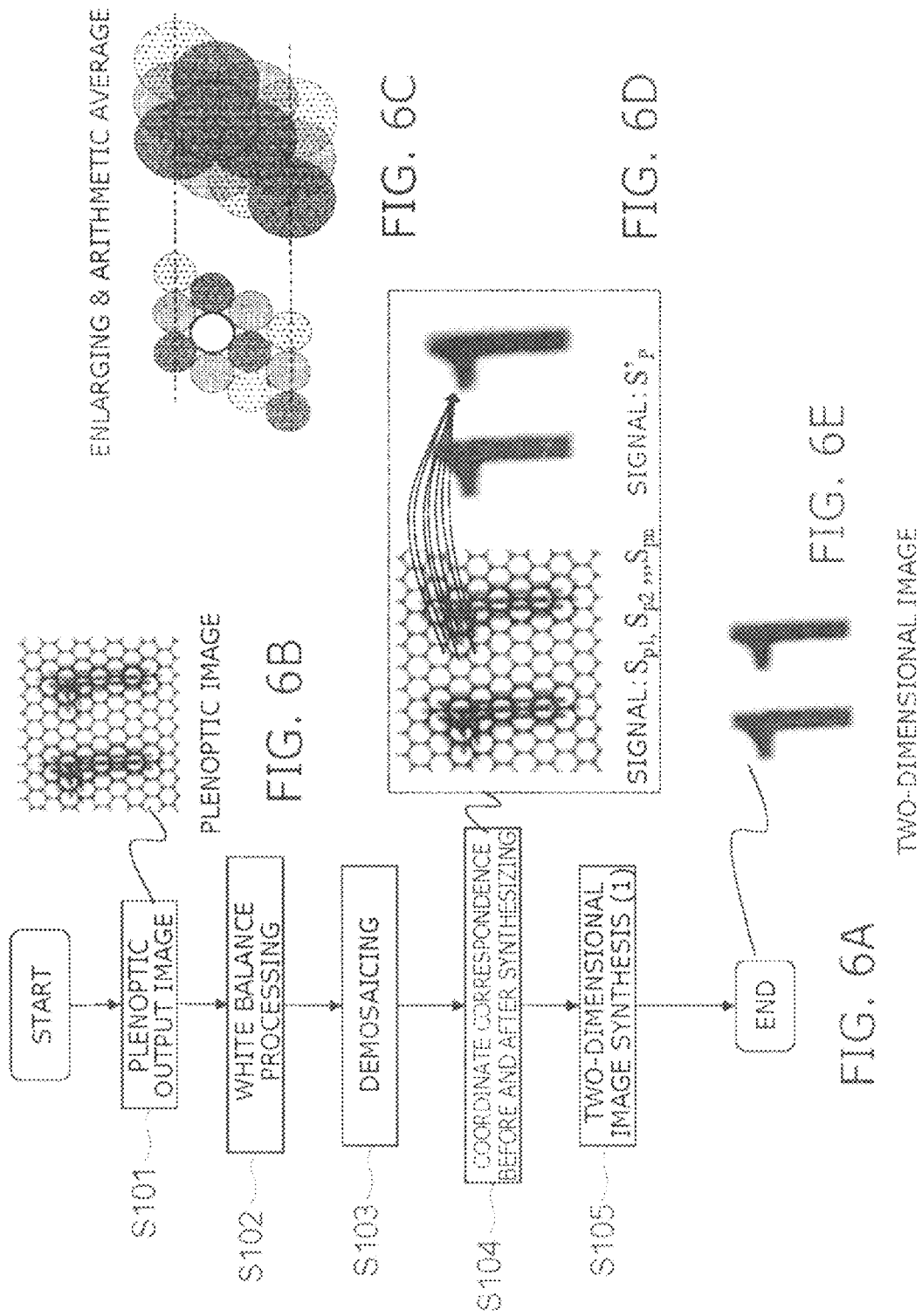
FIG. 6A to FIG. 6E illustrate the method for reconstructing the two-dimensional image.

FIG. 6A shows a flowchart of the image synthesizing method. FIG. 6B shows an example of a plenoptic image; FIG. 6C shows an enlargement and arithmetic average example of the pixel signals; FIG. 6D shows an example of the coordinate correspondence of the signals of the pixels; and FIG. 6E shows an example of the two-dimensional image.

First, as shown in FIG. 6A, the output of the plenoptic image (referring to FIG. 6B) from the imaging element is obtained (step S101). The plenoptic image is, for example, a raw image. The plenoptic image includes multiple picture cells (pixels); and each of the multiple pixels corresponds to one selected from mutually-different multiple colors (e.g., red, green, and blue). Then, white balance processing of the plenoptic raw image output from the imaging element is performed to adjust the signal balance of B (blue), G (green), and R (red) (step S102). In other words, the white balance processing adjusts the signal balance between the multiple colors.

Continuing, for example, because there is no G and B signal information at the position of the R pixels, demosaicing is performed to make the G and B signals by estimating the G and B signals by referring to the pixels disposed around the R pixels (step S103). In other words, for example, the multiple pixels include a first pixel (a first picture cell) corresponding to a first color (e.g., red). The demosaicing estimates the signal of a second color (e.g., green or blue) of the first pixel by referring to the pixels of the multiple pixels disposed around the first pixel. Although it is sufficient to simply perform processing to find the average from the surrounding pixels, various methods are possible as necessary such as widening the pixel area that is referred to, etc. (referring to FIG. 6C). The demosaicing is performed similarly for the G pixels and the B pixels.

Continuing, the image points p1, p2, . . . , pn that correspond to one subject point P (a first point) such as that shown in FIG. 6D have an n-to-1 correspondence with a signal $S'_p$ after the synthesis of the pixel signal values $S_{p1}, S_{p2}, \ldots, S_{pn}$ recorded by the imaging element (step S104). That is, the plenoptic image includes the multiple image points p1, p2, . . . , pn corresponding to the subject point P of the subject. The correspondence between the first point and each of the multiple image points p1, p2, . . . , pn is calculated in step S104. The correspondence method is performed by sensing the relationship of the image point shift length 4 or the overlap relationship of the fields of view from the image as described above. Subsequently, two-dimensional image synthesis is performed (step S105); the two-dimensional image (referring to FIG. 6E) is obtained; and the flow ends. For example, the pixel values of the multiple image points p1, p2, . . . , pn are synthesized based on the correspondence calculated in step S104. Thereby, a post-synthesis signal corresponding to the subject point P is calculated. Thus, the two-dimensional image is calculated.

The two-dimensional image synthesis will now be described.

Figure 7:
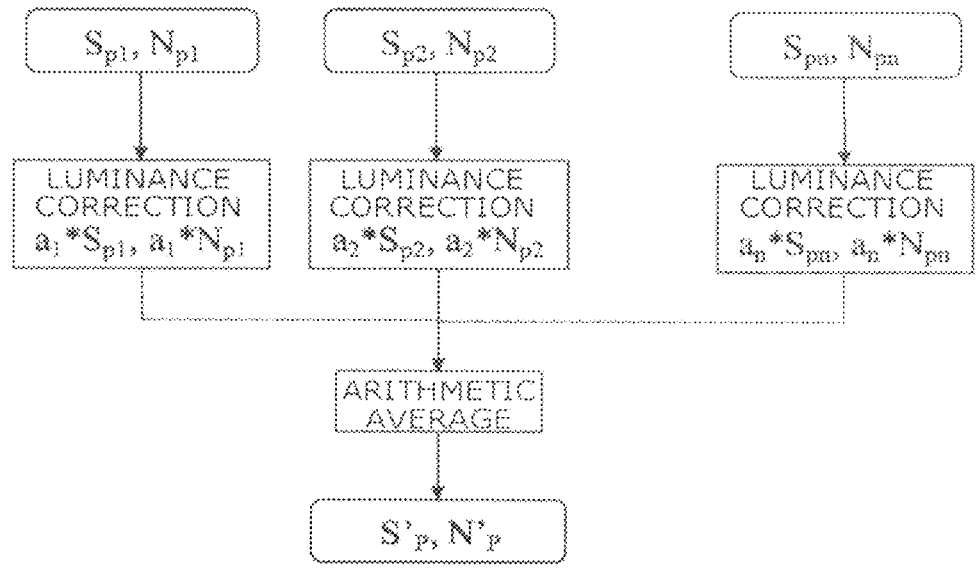
FIG. 7 illustrates the arithmetic average.

FIG. 7 illustrates the arithmetic average.

Here, the pixel signal values $S_{p1}, S_{p2}, \ldots, S_{pn}$ and noise values $N_{p1}, N_{p2}, \ldots, N_{pn}$ of the pixels are used in the description. First, luminance correction processing of each pixel signal value and noise value is performed. Then, luminance correction coefficients $a_1, a_2, \ldots, a_n$ are multiplied respectively by the pixel signal values $S_{p1}, S_{p2}, \ldots, S_{pn}$.

Continuing, the post-synthesis signal value $S'_p$ is calculated by the arithmetic average of the values after the multiplications as shown in Formula 10 recited below. Also, a noise value $N'_p$ included in the post-synthesis signal value at this time is as shown in Formula 11.

$$S'_p = (a_1 \cdot S_{p1} + a_2 \cdot S_{p2} + \ldots + a_n \cdot S_{pn})/n \qquad \text{[Formula 10]}$$

$$N'_p = (a_1^2 \cdot n_{p1}^2 + a_2^2 \cdot n_{p2}^2 + \ldots + a_n^2 \cdot n_{pn}^2)^{0.5}/n \qquad \text{[Formula 11]}$$

Relationship Between Ranging Performance and Configuration of Exit Pupil

Figure 8:
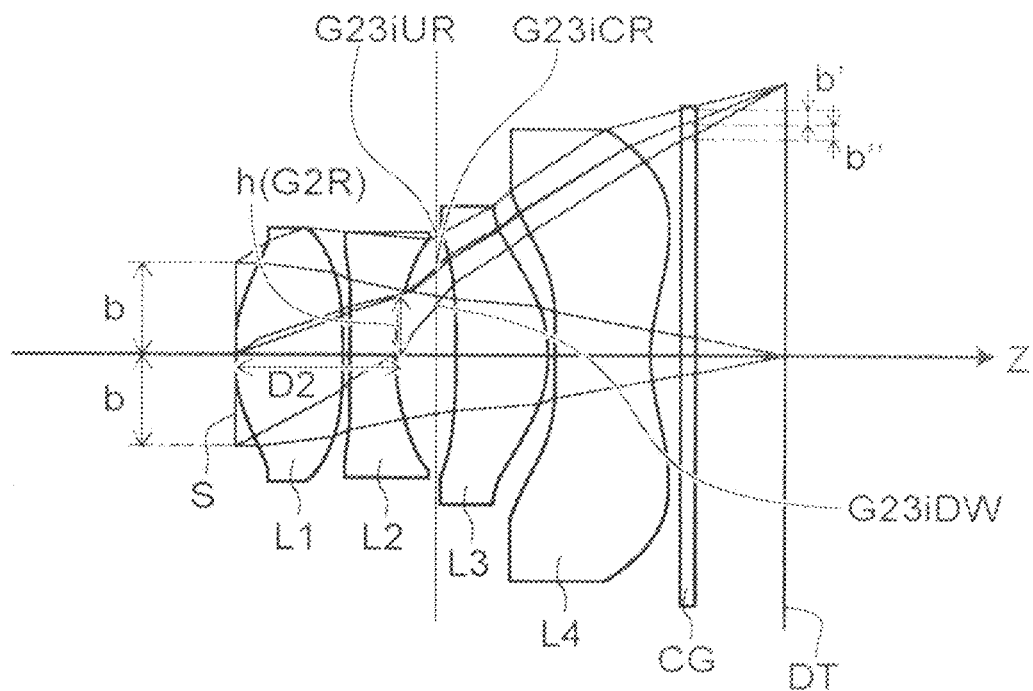
FIG. 8 shows the heights of light rays passing through the lens cross sections.

FIG. 8 shows the heights of light rays passing through the lens cross sections.

Figure 9:
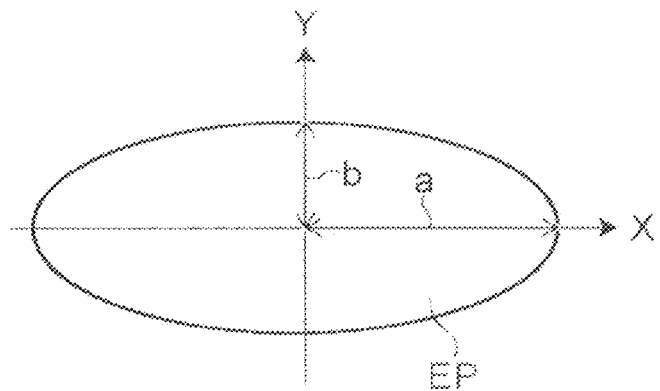
FIG. 9 shows the flattening of the exit pupil.

FIG. 9 shows the flattening of the exit pupil.

As shown in FIG. 8, the imaging optical system 12 includes an aperture stop 5, a first lens L1, a second lens L2, a third lens L3, and a fourth lens L4. The first lens L1 is provided between the aperture stop S and the microlens array 14. The second lens L2 is provided between the first lens L1 and the microlens array 14. The third lens L3 is provided between the second lens L2 and the microlens array 14. The fourth lens L4 is provided between the third lens L3 and the microlens array 14.

The lens group that includes the first lens L1, the second lens L2, the third lens L3, and the fourth lens L4 is the main lens. As shown in FIG. 8, in the case where a virtual plane is disposed in the space between the second lens L2 and the third lens L3 through which off-axis light rays passes, the following definitions are made for the light rays that pass through the virtual plane.

For example, off-axis light rays that travel in a direction intersecting the optical axis Ox are considered. Off-axis light rays L23 include an upper light ray L23u, a lower light ray L23d, and a chief ray L23m. The lower light ray L23d is positioned between the upper light ray L23u and the optical axis Ox at the virtual plane. The chief ray L23m is positioned between the upper light ray L23u and the lower light ray L23d at the virtual plane.

h(G23iCR) is the height at which the chief ray L23m of the off-axis light rays passes through the virtual plane.

h(G23iUR) is the height at which the upper light ray L23u of the off-axis light rays passes through the virtual plane.

h(G23iDW) is the height at which the lower light ray L23d of the off-axis light rays passes through the virtual plane.

The following definitions are made for the chief ray of the off-axis light rays propagating through the page surface.

hx(G23iURX) is the length in the depth direction where the light ray in the perpendicular plane (passing through the sagittal plane) passes through the virtual plane.

The configuration of an exit pupil EP shown in FIG. 9 is the configuration at the virtual plane of the off-axis light rays. The configuration of the exit pupil EP is, for example, treated as an ellipse. In such a case, the configuration of the exit pupil EP has a first diameter and a second diameter. The first diameter is the diameter along a first direction (the X-direction) in the virtual plane of the exit pupil EP. The second diameter is the diameter along a second direction (the Y-direction) in the virtual plane of the exit pupil EP. The following definitions are made for the flattening of the exit pupil EP.

½ times the first diameter is a. In the case where the exit pupil EP is treated as substantially a circle or an ellipse, the first diameter is the major diameter of the length of the pupil at the exit pupil position; and a=hx(G23iURX).

½ times the second diameter is b. In the case where the exit pupil EP is treated as substantially a circle or an ellipse, the second diameter is the minor diameter of the length of the pupil at the exit pupil position; and b=(hy(G23iUR)−hy(G23iDW))/2.

Flattening $\rho$ is defined as $\rho=|1-b/a|$ for the radius a and the radius b.

The uniformity of the light ray group passing through the exit pupil EP is important for the relationship between the flattening and the ranging performance. As shown in FIG. 8, for higher ranging precision, it is important to design so that the proportion of b'/b'' to b/b approaches 1, where the position proportion of the light rays group passing through the aperture stop (the aperture stop S) is b/b.

At the optical axis vicinity, the change of the proportion of b'/b'' to b/b is small; and problems due to distortion do not occur easily. On the other hand, at positions having high angles of view, the change of the proportion of b'/b'' to b/b is large; and ranging errors due to the distortion occur easily. Therefore, it is necessary for the circular cross section of the light ray group not to flatten or to have a uniform interior as much as possible from the optical axis vicinity to positions having high angles of view.

Formulas and Parameters of Lens Configuration

In the following description, the optical axis direction of the lens is taken as the Z-direction; one direction normal to the optical axis is taken as the Y-direction; and a direction orthogonal to the Z-direction and the Y-direction is taken as the X-direction. The positive direction of the Z-direction is the direction from the object side of the main lens group toward the image plane.

Counting from the object side, the curvature radius of the ith surface (including the aperture stop surface) is Ri; the surface spacing along the optical axis between the ith and (i+1)th surfaces is Di; and counting from the object side, the refractive index and Abbe number of the jth lens are nj and vj, respectively.

$$z = \frac{cY^2}{1 + \sqrt{1 - (1+K)c^2Y^2}} + a_4 Y^4 + a_6 Y^6 + \ldots + a_{20} Y^{20} \qquad \text{[Formula 12]}$$

In Formula 12, c is the curvature of the aspherical surface vertex, K is the conic constant, aI is the aspheric constant, Y is the height from the optical axis, and Z is the distance from the tangent plane to the points on the aspherical surface at the lens surface vertex.

Lens Configuration

A specific lens configuration will now be described.

Figure 10:
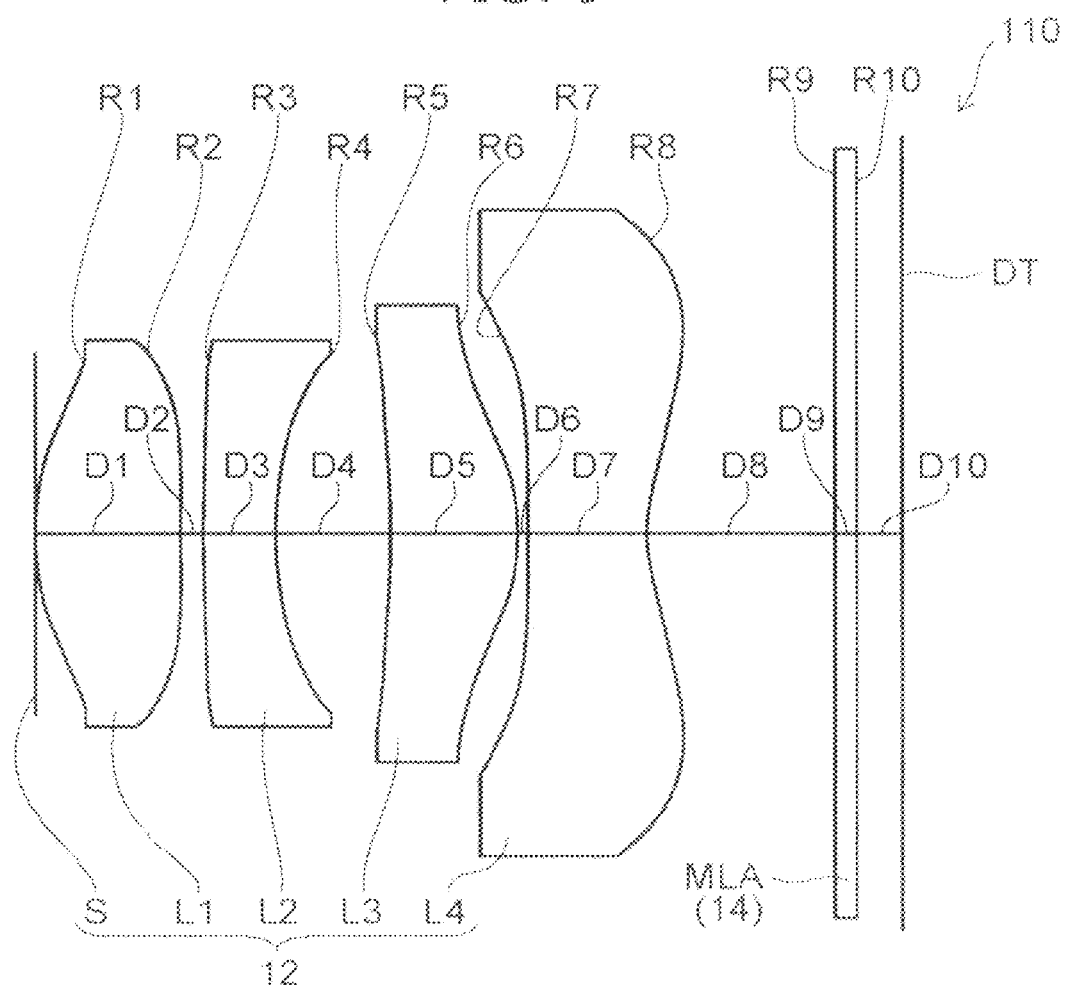
FIG. 10 illustrates the configuration of the imaging lens according to the embodiment.

FIG. 10 illustrates the configuration of the imaging lens according to the embodiment.

As shown in FIG. 10, the imaging lens 110 includes the microlens array MLA (14) and the imaging optical system 12 which is the first optical system. In FIG. 10, S is the aperture stop, R1 is a surface (a first surface) on the object side of the first lens L1, R2 is a surface (a second surface) on the image side of the first lens L1, R3 is a surface (a third surface) on the object side of the second lens L2, R4 is a surface (a fourth surface) on the image side of the second lens L2, R5 is a surface (a fifth surface) on the object side of the third lens L3, R6 is a surface (a sixth surface) on the image side of the third lens L3, R7 is a surface (a seventh surface) on the object side of the fourth lens L4, R8 is a surface (an eighth surface) on the image side of the fourth lens L4, R9 is a surface (a ninth surface) on the object side of the microlens array MLA, R1.0 is a surface (a tenth surface) on the image side of the microlens array MLA, and DT is the imaging plane of the solid-state imaging element 16. The imaging plane is the plane in which the multiple pixels are provided.

The first surface R1 opposes the aperture stop S. The second surface R2 is provided between the first surface R1 and the microlens array MLA (14).

The third surface R3 opposes the second surface R2. The fourth surface R4 is provided between the third surface R3 and the microlens array MLA (14).

The fifth surface R5 opposes the fourth surface R4. The sixth surface R6 is provided between the fifth surface R5 and the microlens array MLA (14).

The seventh surface R7 opposes the sixth surface R6. The eighth surface R8 is provided between the seventh surface R7 and the microlens array MLA (14).

The imaging lens 110 according to the embodiment can acquire both a high-precision range image and a good visible image.

The imaging optical system 12 includes the aperture stop S, the first lens L1 having a positive refractive power, the second lens L2 having a negative refractive power, the third lens L3 having a positive refractive power, and the fourth lens L4 having a negative refractive power that are disposed in this order from the object side toward the image plane side. The lens group that includes the first lens L1, the second lens L2, the third lens L3, and the fourth lens L4 is the main lens.

The microlens array MLA (14) and the solid-state imaging element 16 are disposed on the image side of the imaging optical system 12.

The microlens array MLA (14) is disposed between the imaging optical system 12 and the solid-state imaging element 16 including the multiple pixels. The microlens array MLA (14) is provided between the imaging optical system 12 and the focal position of the imaging optical system 12. In other words, the microlens array MLA (14) is disposed on the object side of the focal position of the imaging optical system 12. The microlens array MLA (14) includes the multiple microlens units 14a. One microlens unit 14a overlaps at least two pixels as viewed from the optical axis direction. Each of the multiple microlens units 14a overlaps at least two pixels of the multiple pixels 16b when projected onto the first plane 14p.

In the embodiment, the main lens may include a lens that substantially does not have power. Also, the entire lens configuration may include a lens (e.g., the cover glass CG) that substantially does not have power.

Here, the orientations of the first lens L1, the second lens L2, the third lens L3, and the fourth lens L4 are as follows.

The configuration of the first lens L1 is such that the curvature radius of the surface (the first surface) on the object side is positive.

The configuration of the second lens L2 is such that the curvature radii of the surface (the third surface) on the object side and the surface (the fourth surface) on the image side both are positive.

The configuration of the third lens L3 is such that the curvature radii of the surface (the fifth surface) on the object side and the surface (the sixth surface) on the image side both are negative.

The configuration of the fourth lens L4 is such that the curvature radii of the surface (the seventh surface) on the object side and the surface (the eighth surface) on the image side both are positive.

It is desirable for the arrangement between the imaging optical system 12 and the microlens array MLA (14) to be such that a demagnification ratio Nf when the microlens array MLA (14) demagnifies the image passing through the imaging optical system 12 is not less than 0.001 and not more than 0.87.

Thus, the basic configuration of the main lens is made of the positive first lens L1, the negative second lens L2, the positive third lens L3, and the negative fourth lens L4. By such a configuration, a thin imaging lens 110 having an appropriate backfocus and a short total lens length is obtained.

The number of lenses of the main lens is set to be four as a result of considering the performance as the highest priority and size reduction as a priority. In the case where the number of lenses of the main lens is two or less, it is difficult to reduce the field curvature; and the peripheral performance degrades. The performance is better in the case where the number of lenses of the main lens is three or more. On the other hand, the total length increases, which may cause the weight to increase. Accordingly, the size of the main lens is reduced and good peripheral performance is provided by using a four-lens configuration in which it is possible to reduce the field curvature and the distortion aberration.

It is desirable for at least one surface of the surfaces (R1 to R8) of the first lens L1, the second lens L2, the third lens L3, and the fourth lens L4 included in the main lens to be an aspherical surface. Also, it is desirable for one surface on at least one selected from the object side and the image plane side to be an aspherical surface.

By using an aspherical surface in the positive first lens L1, using an aspherical surface having a negative refractive power in the second lens L2, using an aspherical surface having a positive refractive power in the third lens L3, and using an aspherical surface having a negative refractive power in the fourth lens L4, an imaging lens can be obtained in which various aberrations and particularly astigmatic aberration and distortion aberration are corrected; the total length of the lens system is short; and the imaging magnification of the imaging on the imaging plane DT of the solid-state imaging element 16 has a demagnification ratio for an incident angle on the microlens array MLA (14) of 30 degrees or less.

Further, by employing an aspherical surface in the third lens L3 having a positive refractive power and by appropriately disposing the spacing between the second lens L2 and the third lens L3 and the spacing between the third lens L3 and the fourth lens L4, various aberrations (comatic aberration, astigmatic aberration, and distortion aberration) of the screen peripheral portion distal to the optical axis can be corrected by utilizing the difference occurring between the transmission heights of the on-axis ray and the marginal ray.

It is desirable for the first to fourth lenses L1 to L4 to be made of a glass material or a plastic material. Lenses that include a glass material and a plastic material also include lenses in which the surface of the plastic material is coated to prevent reflections and increase surface hardness.

The lens is small; and in the production of small lenses, plastic materials can be manufactured by injection molding, etc., and are more suited to mass production than are glass materials. Further, plastic lenses are suited to mass production with low manufacturing costs.

The aperture stop S adjusts the subject light amount passing through the microlens array MLA (14) and reaching the solid-state imaging element 16. The aperture stop S is disposed on the object side of the main lens. In other words, the aperture stop 5, the first lens L1, the second lens L2, the third lens L3, and the fourth lens L4 are disposed in the imaging lens 110 in order from the object side.

In the imaging lens 110, the incident angle onto the microlens array MLA (14) is reduced because the aperture stop S is disposed furthest on the object side. That is, the distance from the imaging plane to the exit pupil position can be longer for the type in which the aperture stop S is disposed furthest on the object side than for a middle-stop type in which the aperture stop is provided between the first lens L1 and the third lens L3.

In the case where the exit pupil is distal to the imaging plane, the chief ray of the light rays emitted from the final surface of the imaging lens 110 is incident on the microlens array MLA (14) at an angle that is nearly perpendicular, that is, the shift between the exit pupil of the imaging lens 110 and the exit pupils of the single lenses (the microlens units 14a) of the microlens array MLA (14) can be reduced; and good aberration performance can be ensured.

The microlens array MLA (14) is disposed between the imaging optical system 12 and the solid-state imaging element 16. The image that passes through the microlens array MLA (14) is imaged on the solid-state imaging element 16 as a virtual image and is imaged at a demagnification ratio. Thereby, the original central performance and peripheral performance of the imaging lens 110 can be corrected to be even better.

Microlens Array

The microlens array MLA applied to the imaging lens 110 will now be described.

Figure 11:
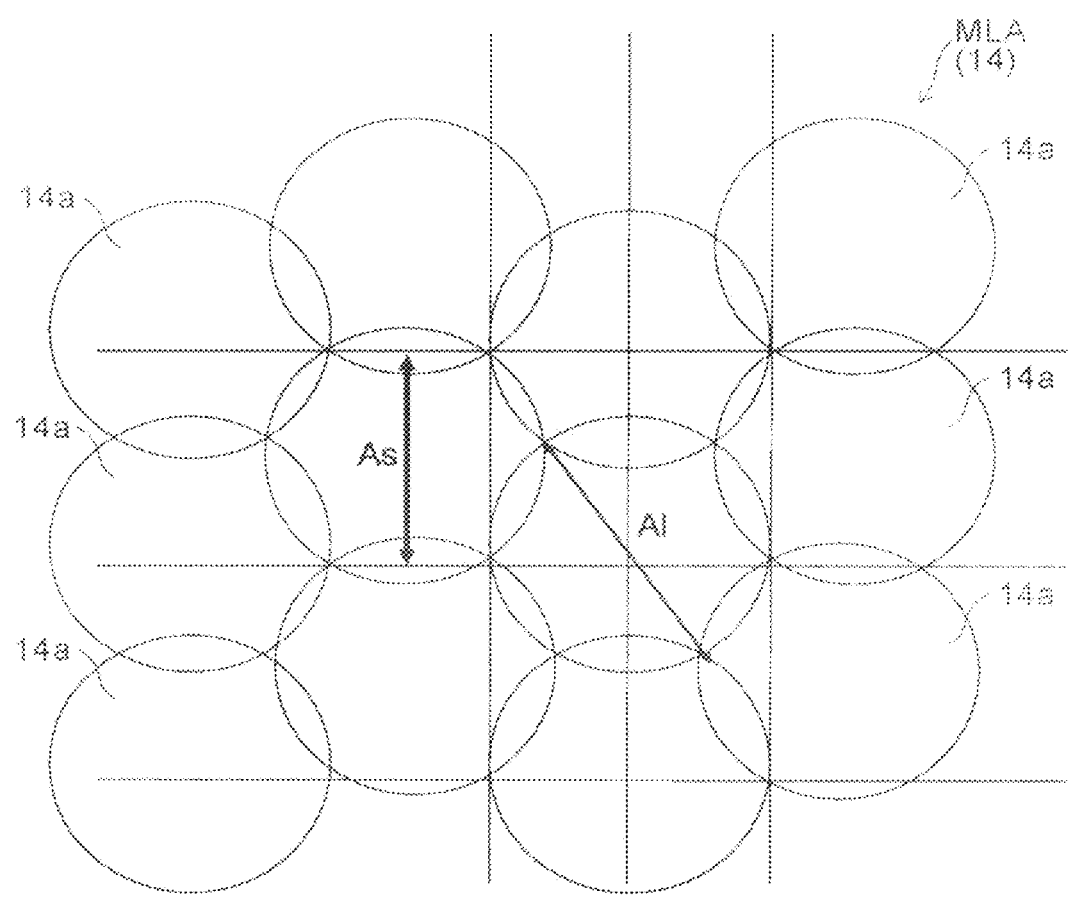
FIG. 11 is a schematic plan view illustrating the arrangement of the microlens units.

FIG. 11 is a schematic plan view illustrating the arrangement of the microlens units.

Figure 12:
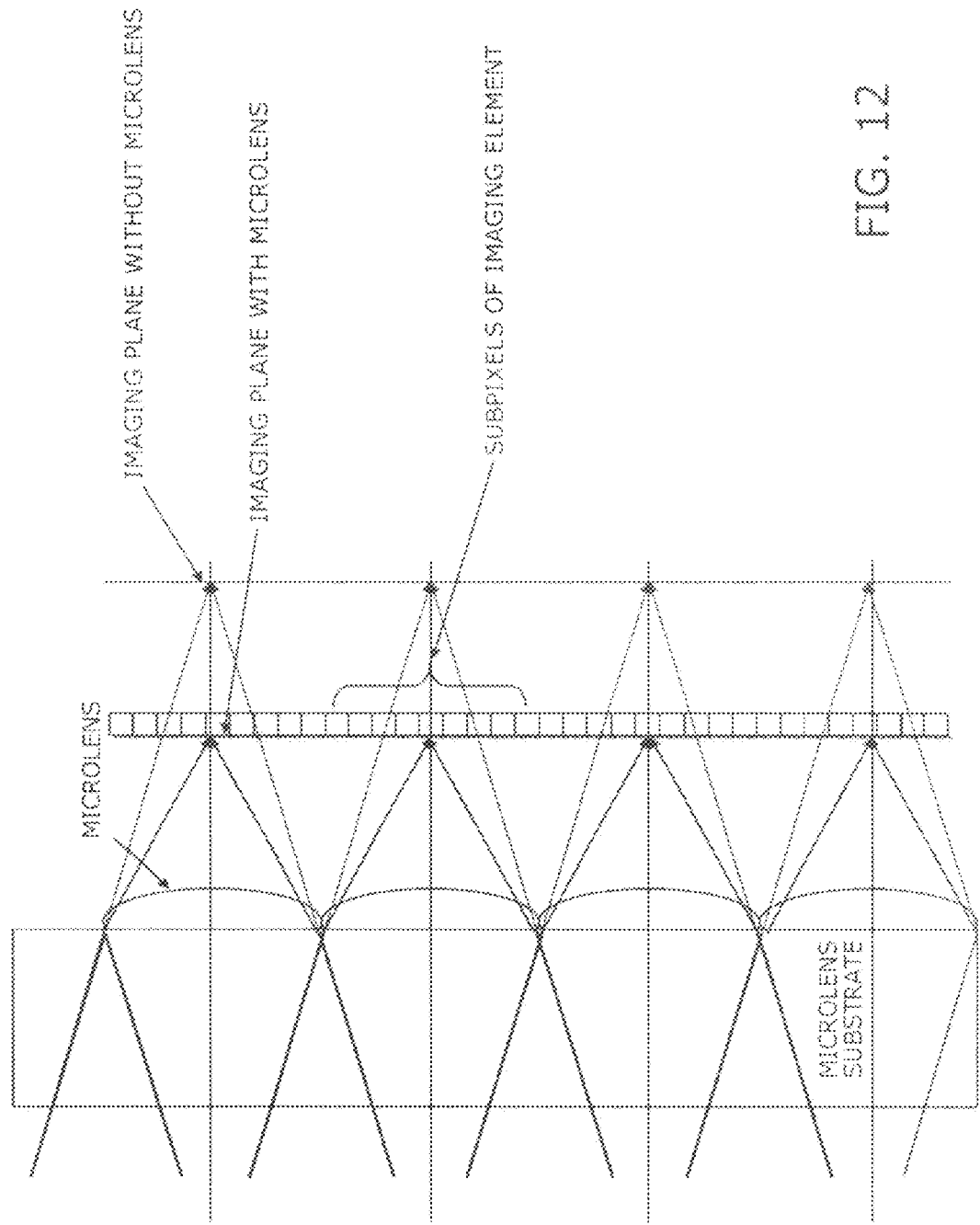
FIG. 12 is a ray diagram of the microlenses.
Figure 13:
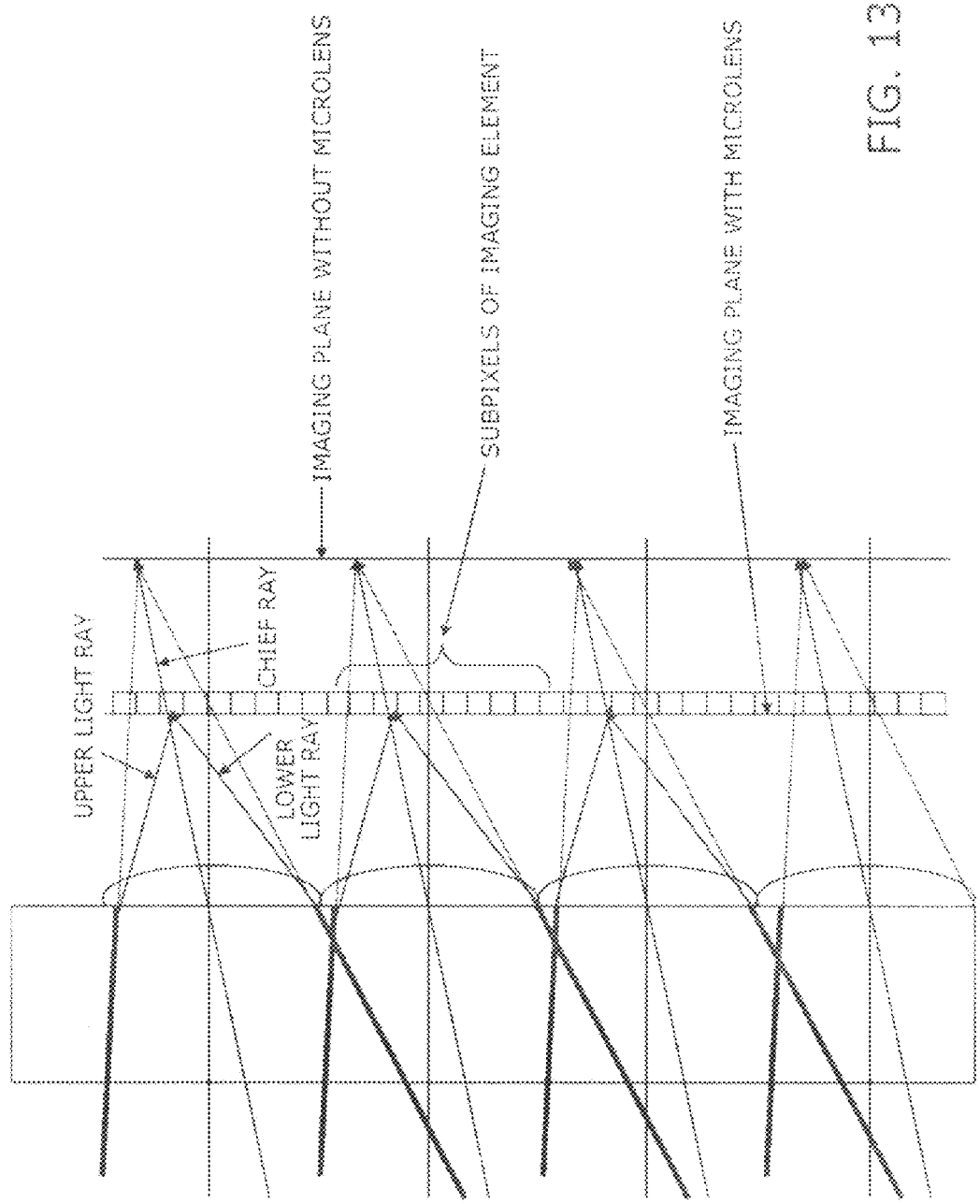
FIG. 13 is a ray diagram of the microlenses.

FIG. 12 to FIG. 13 are ray diagrams of the microlenses.

As shown in FIG. 11, the microlens array MLA (14) has a lens optical system arrangement using the multiple microlens units 14a. The lens optical system arrangement is such that the light in the axis direction of each of the microlens units 14a reaches the same position of each segment for each field of view. In the multiple optical system arrangement, the multiple optical systems are disposed uniformly from the center of the multiple optical system arrangement and are disposed, for example, in a hexagonal arrangement such as that shown in FIG. 11. In the case where the multiple microlens units 14a are packed in a hexagonal arrangement without gaps, the configuration of the outer circumference of each of the microlens units 14a is a hexagon.

The microlens array MLA (14) is formed of a refractive optical system. The microlens array MLA (14) is disposed between the imaging optical system 12 and the solid-state imaging element 16; and the imaging on the imaging element is at a virtual image magnification. The microlens array MLA (14) images light rays from the imaging optical system 12 having different angles of view on the solid-state imaging element 16. Because the microlens units 14a that are inside the microlens array MLA (14) are disposed in a hexagonal arrangement, the incident angle on the microlens unit 14a at the field-of-view periphery increases as the angle of view increases.

FIG. 12 is a ray diagram when chief rays from the imaging optical system 12 are incident on the microlens array MLA (14) at an angle of 0 degrees.

FIG. 13 is a ray diagram when chief rays from the imaging optical system 12 are incident on the microlens array MLA (14) at an angle of 30 degrees.

The refractive optical system that is formed in the microlens array MLA (14) is disposed between the imaging optical system 12 and the solid-state imaging element 16 at the appropriate virtual image magnification and is configured to have the appropriate focal length and F-number so that the light rays outside the field of view from the imaging optical system 12 can reach the imaging element as efficiently as possible.

In the imaging lens 110 according to the embodiment, the focal length and F-number of the microlens units 14a of the microlens array MLA (14) are set so that the light rays for which the incident angle of the chief rays on the image side are within 20 degrees to 30 degrees can efficiently reach the solid-state imaging element 16. As an example, Table 1 shows the specifications of a single lens (one microlens unit 14a) of the microlens array MLA (14) that images with a virtual image magnification of 0.5 times.

The parameters recited in Table 1 mean the following.

Nd is the d-line (587.6 nanometers (nm)) refractive index of the optical material of the lens.

vd is the Abbe number of the optical material of the lens for the d-line.

R is the effective radius (millimeters (mm)), i.e., the radius of the circular region through which the light rays passes.

f is the focal length (mm).

TABLE 1

| SURFACE NUMBER | | RADIUS (RI) | THICKNESS (DI) | MATERIAL |
|---|---|---|---|---|
| 0 | OBJECT SURFACE INFINITY (∞) | | −0.17887 | AIR |
| 1 | APERTURE STOP INFINITY (∞) | | 0.1500 | SYNTHETIC QUARTZ (Nd = 1.45844) |
| 2 | INFINITY (∞) | −0.03536 | 0.03829 | AIR |
| 3 | IMAGE PLANE | | | |

Figure 14:
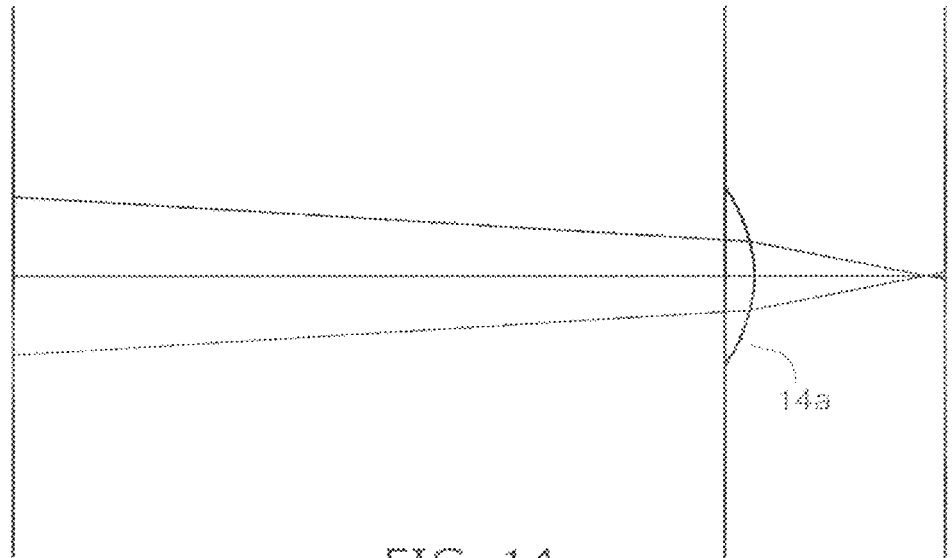
FIG. 14 is a ray diagram of the microlens.

FIG. 14 is a ray diagram of a microlens.

FIG. 14 is the ray diagram of a single lens of the microlens array MLA shown in Table 1 for a chief ray angle of 0 degrees.

Figure 15:
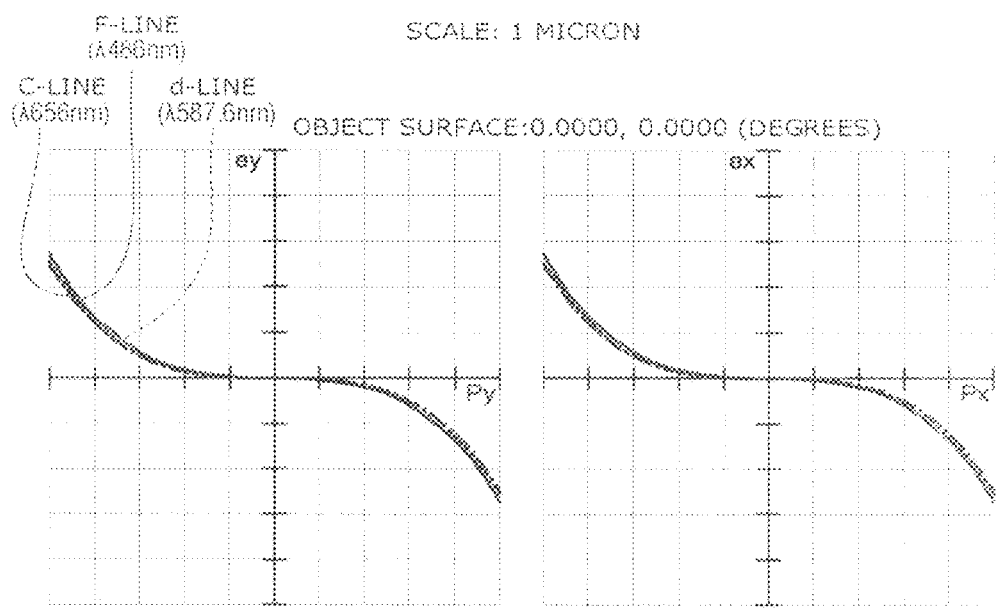
FIG. 15 shows aberration curves of the microlens.

FIG. 15 shows aberration curves of the microlens.

FIG. 15 is the aberration diagram (for the chief ray angle of 0 degrees) of the single lens of the microlens array MLA shown in Table 1.

Figure 16:
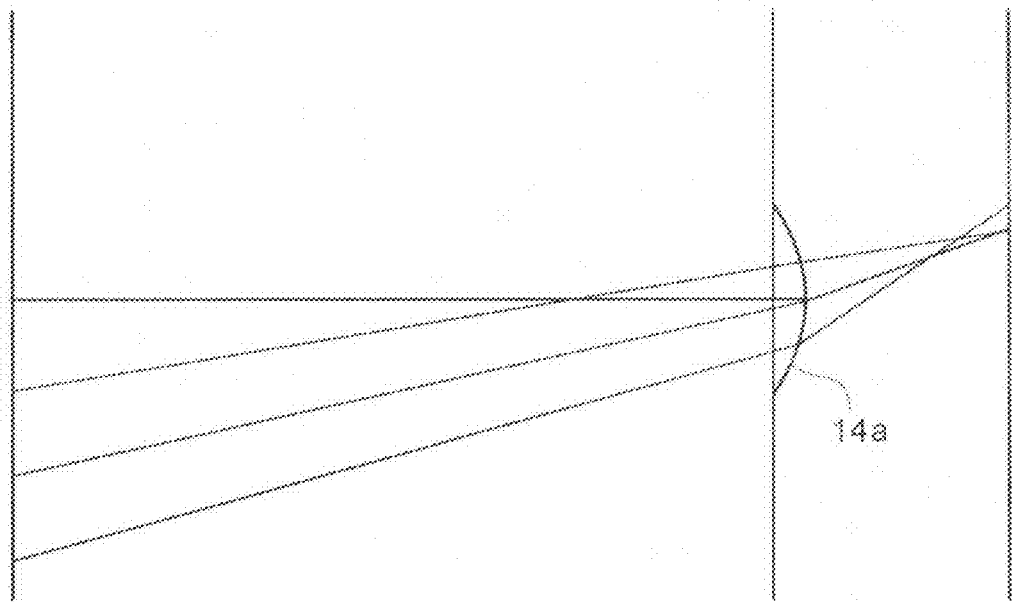
FIG. 16 is a ray diagram of the microlens.

FIG. 16 is a ray diagram of the microlens.

FIG. 16 is the ray diagram of the single lens of the microlens array MLA shown in Table 1 for a chief ray angle of 20 degrees.

Figure 17:
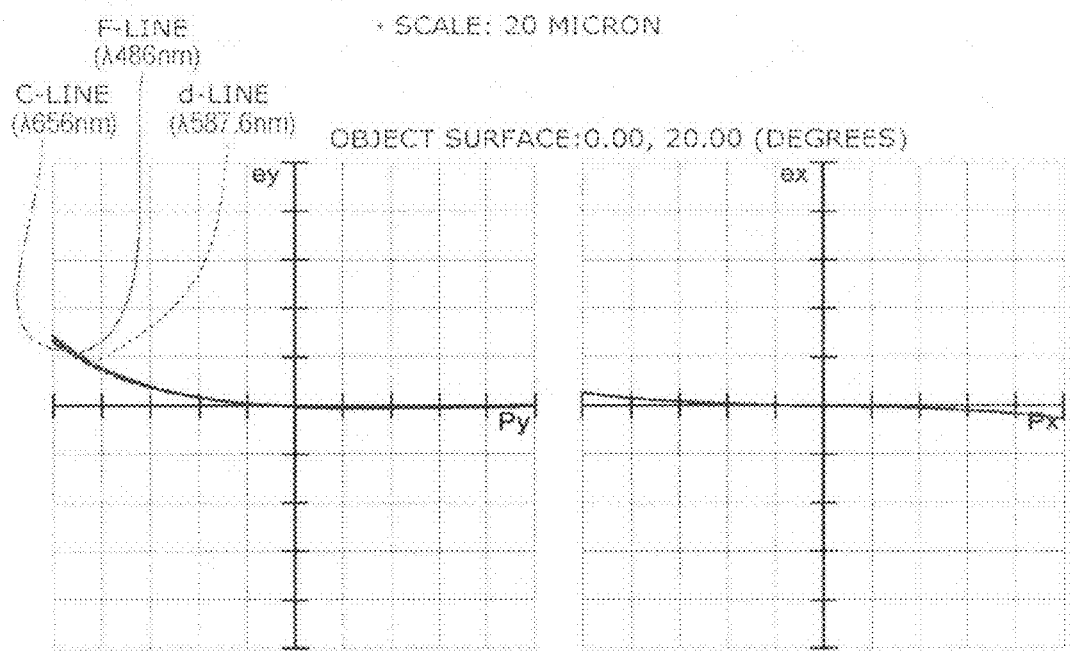
FIG. 17 shows aberration curves of the microlens.

FIG. 17 shows aberration curves of the microlens.

FIG. 17 is the aberration diagram (for the chief ray angle of 20 degrees) of the single lens of the microlens array MLA shown in Table 1.

Figure 18:
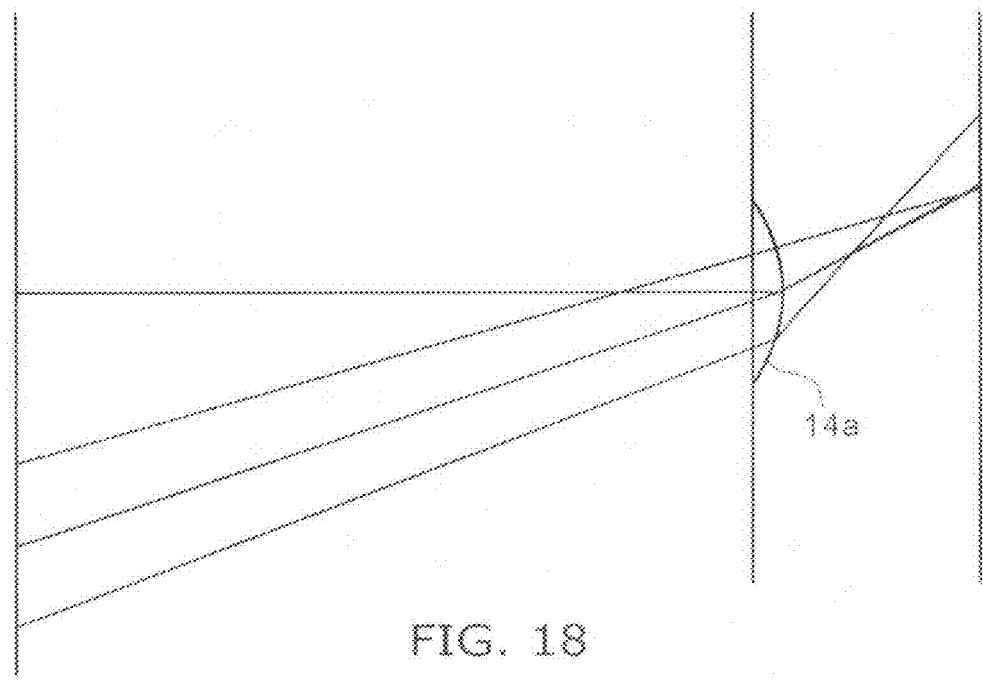
FIG. 18 is a ray diagram of the microlens.

FIG. 18 is a ray diagram of the microlens.

FIG. 18 is the ray diagram of the single lens of the microlens array MLA shown in Table 1 for a chief ray angle of 30 degrees.

Figure 19:
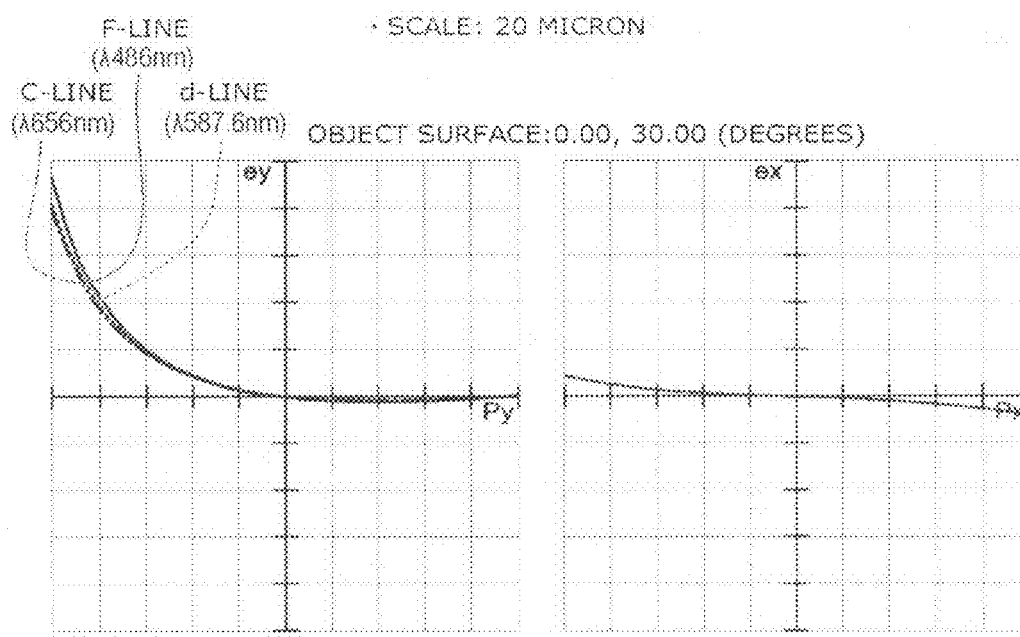
FIG. 19 shows aberration curves of the microlens.

FIG. 19 shows aberration curves of the microlens.

FIG. 19 is the aberration diagram (for the chief ray angle of 30 degrees) of the single lens of the microlens array MLA shown in Table 1.

Condition Formulas of First Optical System (Imaging Optical System 12)

Condition formulas of the imaging optical system 12 will now be described.

As shown in FIG. 10, the imaging lens 110 according to the embodiment includes, in order from the object side toward the image plane side, the aperture stop S, the first lens L1 that has a positive refractive power and a configuration in which the curvature radius of the surface on the object side is positive, the second lens L2 that has a negative refractive power and a configuration in which the curvature radii of the object-side surface and the image-side surface both are positive, the third lens L3 that has a positive refractive power and is formed in a configuration in which the curvature radii of the object-side surface and the image-side surface both are negative, and the fourth lens L4 that has a negative refractive power and is formed in a configuration in which the curvature radii of the object-side surface and the image-side surface both are positive; and the microlens array MLA (14) and the solid-state imaging element 16 are disposed rearward of these lenses.

In the imaging lens 110, the microlens array MLA (14) is disposed between the imaging optical system 12 and the solid-state imaging element 16. It is desirable for the magnification to be not less than 0.001 and not more than 0.87 in the case where the image formed by the imaging optical system 12 is to be demagnified by the microlens array MLA (14).

In such an optical system, the imaging lens 110 satisfies Condition Formulas (1) to (5) recited below.

$$0.85 \leq f1/f < 1.0 \quad (1)$$

$$1.5 < |f2|/f < 3.0 \quad (2)$$

$$TL/f < 1.3 \quad (3)$$

$$1 < (R7+R8)/(R7-R8) < 5 \quad (4)$$

$$0 < D34/f < 0.05 \quad (5)$$

In Condition Formulas (1) to (5) recited above, f is the focal length of the imaging optical system 12, f1 is the focal length of the first lens L1, f2 is the focal length of the second lens L2, f3 is the focal length of the third lens L3, TL is the distance between the aperture stop S and the imaging plane DT (the solid-state imaging element 16), R7 is the curvature radius of the seventh surface, R8 is the curvature radius of the eighth surface, and D34 is the air spacing distance along the optical axis Ox between the third lens L3 and the fourth lens L4.

The basic characteristics of the lens configuration of the imaging lens 110 of the embodiment are made of the first lens L1 which has the large positive power, the second lens L2 which has the relatively small negative power, the third lens L3 which has the largest positive power, and the fourth lens L4 which has the large negative power on the side most proximal to the image; and the power arrangement is a positive-negative-positive-negative power arrangement and a so-called telephoto-type refractive power arrangement.

Further, to correct the chromatic aberration, the imaging lens 110 has the characteristic of using the third lens L3 which has the large positive refractive power and the fourth lens L4 which has the large negative refractive power to perform achromatization of the chromatic aberration that occurs due to the first lens L1 which has the large positive refractive power and the second lens L2 which has the negative refractive power.

Accordingly, the first lens L1 and the second lens L2 have the effect of mainly correcting the spherical aberration, the comatic aberration, and the chromatic aberration proximal to the optical axis; and the third lens L3 and the fourth lens L4 have the effect of mainly correcting the distortion aberration, which is an off-axis aberration, and controlling the off-axis chromatic aberration and the incident angle on the microlens array MLA (14).

Condition Formula (1) and (2) regulate the optimal refractive power arrangement for obtaining good optical performance.

Condition Formula (1) is a condition formula relating to the power of the first lens L1 for the combined focal length of the entire lens system. In the case where the power of the first lens L1 is strong and the conditions are below the lower limit of Condition Formula (1), the comatic aberration and spherical aberration of the upper light ray, the comatic aberration, and the chromatic aberration become large; the performance undesirably degrades; and therefore, correction is difficult; and the contrast of the entire screen decreases.

On the other hand, in the case where the power of the first lens L1 is weak and the upper limit of Condition Formula (1) is exceeded, the backfocus becomes long; the total length of the lens system becomes large; compactness is lost; the comatic aberration of the light rays becomes large; and the performance undesirably degrades. Accordingly, it is difficult to reduce the total length of the imaging lens 110.

In Condition Formula (1), it is more favorable for the range to be $0.85 < f1/f < 0.95$, and even more favorable for the range to be $0.90 < f1/f < 0.95$.

Condition Formula (2) is a condition formula relating to the absolute value of the power of the second lens L2 for the combined focal length of the entire lens system. Condition Formula (2) regulates the negative power of the second lens L2. It is necessary for the power of the negative second lens L2 to correct the aberration occurring due to the positive lens of the first lens L1. In the case where the negative power of the second lens L2 is set to be strong, the performance undesirably degrades because the negative power is excessive with respect to the correction effect of the negative lens. In particular, the chromatic aberration at the optical axis and the chromatic aberration of the magnification degrade. Moreover, the incident angle onto the imaging plane becomes too large. Therefore, it is favorable to set the negative power of the second lens L2 to be relatively weak. Accordingly, it is favorable to satisfy Condition Formula (2).

In the case where the power of the second lens L2 is strong and the conditions are below the lower limit of Condition Formula (2), the total length becomes long; the light ray height of the peripheral light rays becomes high; correction of the astigmatic aberration is difficult; and the contrast of the entire screen decreases. Moreover, the incident angle onto the solid-state imaging element 16 becomes large; and it is unfavorably difficult to ensure the telecentric characteristics on the image plane side.

In the case where the upper limit of Condition Formula (2) is exceeded, the aberration correction balance of the on-axis aberrations and the off-axis aberrations degrades; and the off-axis aberrations cannot be corrected easily. Moreover, the backfocus becomes long; and it is difficult to reduce the total length of the imaging lens.

In Condition Formula (2), it is more favorable for the range to be $1.5 < |f2|/f < 2.5$, and even more favorable for the range to be $2.0 < |f2|/f < 2.5$.

Condition Formula (3) regulates the total length of the lens system of the imaging optical system 12. In the case where the upper limit of Condition Formula (3) is exceeded, compactness is not possible because the total lens length becomes long. Accordingly, according to the configuration satisfying Condition Formula (3), it is easy to make the imaging lens smaller and thinner.

In Condition Formula (3) it is more favorable when $TL/f < 1.2$, and even more favorable when $TL/f < 1.0$.

Condition Formula (4) is a condition formula for appropriately setting the configuration of the negative fourth lens L4.

Within the range shown in Condition Formula (4), the fourth lens L4 changes from a configuration in which the surface on the image side has a refractive power larger than the surface on the object side (a meniscus configuration having a negative refractive power and a convex surface facing the object side) to a biconcave configuration in which the surface on the object side has a refractive power larger than the surface on the image side.

By setting the conditions to fall below the upper limit of Condition Formula (4), the spacing between the microlens array MLA (14) and the most protruding portion that juts furthest from the final surface of the fourth lens L4 can be ensured while making the total length and the backfocus short.

On the other hand, by setting the conditions to exceed the lower limit of Condition Formula (4), the height of the on-axis rays and the off-axis light rays passing through the fourth lens L4 can be maintained appropriately, which is advantageous to correct the longitudinal chromatic aberration and the off-axis chromatic aberration.

In Condition Formula (4), it is more favorable for the range to be $1<(R7+R8)/(R7-R8)<4$, and even more favorable for the range to be $2<(R7+R8)/(R7-R8)<4$.

Condition Formula (5) is a condition formula that regulates the spacing between the third lens L3 and the fourth lens L4. By setting the conditions to fall below the upper limit of Condition Formula (5), the aberration correction balance between the on-axis aberrations and the off-axis aberrations is possible; and not only the correction of the off-axis aberrations but also the correction of the chromatic aberration is good. On the other hand, by setting the conditions to exceed the lower limit of Condition Formula (5), the spacing between the third lens L3 and the fourth lens L4 does not become too small, which is advantageous for the compactness of the total length of the lens.

In Condition Formula (5), it is more favorable for the range to be $0<D34/f<0.04$, and even more favorable for the range to be $0.01<D34/f<0.04$.

Also, in the imaging lens 110 according to the embodiment, it is desirable for the height position of the chief ray passing through the third lens L3 to satisfy Condition Formula (6) recited below.

$$0.3<hc(G3R)/(D1+D2+D3+D4+D5)<0.5 \quad (6)$$

In Condition Formula (6), hc(G3R) is the height at which the chief ray of the off-axis light rays of the maximum angle of view passes through the surface (the sixth surface) on the image side of the third lens L3. In other words, hc(G3R) is the distance between the optical axis Ox and the position where the chief ray of the off-axis light rays and the sixth surface intersect. D1+D2+D3+D4+D5 is the distance along the optical axis Ox from the aperture stop S to the surface (the sixth surface) on the image side of the third lens L3. D1 is the thickness along the optical axis Ox of the first lens L1. D2 is the air spacing along the optical axis Ox between the first lens L1 and the second lens L2. In other words, D2 is the product of the distance along the optical axis Ox between the first lens L1 and the second lens L2 and the refractive index of the region between the first lens L1 and the second lens L2. D3 is the thickness along the optical axis Ox of the second lens L2. D4 is the air spacing along the optical axis Ox between the second lens L2 and the third lens L3. In other words, D4 is the product of the distance along the optical axis Ox between the second lens L2 and the third lens L3 and the refractive index of the region between the second lens L2 and the third lens L3. D5 is the thickness along the optical axis Ox of the third lens L3.

Here, Condition Formula (6) is a condition formula for controlling the height at which the off-axis chief rays pass through the third lens L3. Condition Formula (6) is the condition for preventing the occurrence of the chromatic aberration as much as possible when the off-axis light rays that pass through the imaging lens 110 are incident on the microlens array MLA (14); and Condition Formula (6) limits the configuration of the exit pupil of the off-axis light rays.

In the case where the upper limit of Condition Formula (6) is exceeded and the height at which the chief ray of the off-axis light rays of the maximum angle of view passing through the surface (the sixth surface) on the image side of the third lens L3 becomes high, the incident height on the surface (the seventh surface) on the object side of the fourth lens L4 becomes high; and it is necessary to relax the refractive power of the surface (the seventh surface) on the object side of the fourth lens L4. Although the occurrence of the comatic aberration increases because the refractive power of this portion is weakened, the configuration of the exit pupil of the off-axis light rays does not change greatly.

In the case where the conditions fall below the lower limit of Condition Formula (6), the light ray height at the surface (the seventh surface) on the object side of the fourth lens L4 decreases; and it is necessary to increase the refractive power of the light rays at the fourth lens L4. Because the refractive power of this portion is increased, it is difficult to ensure the incident angle of the light rays toward the prescribed image height, i.e., the CRA (Chief Ray Angle (the incident angle of the chief ray onto the image plane)). Because it is necessary to reduce the positive refractive power of the third lens L3 to ensure the incident height on the fourth lens L4, a large comatic aberration of the off-axis light rays occurs; and the configuration of the exit pupil of the off-axis light rays undesirably changes greatly.

In Condition Formula (6), it is more favorable for the range to be $0.3<hc(G3R)/(D1+D2+D3+D4+D5)<0.45$, and even more favorable for the range to be $0.35<hc(G3R)/(D1+D2+D3+D4+D5)<0.45$.

The configuration of the exit pupil is the configuration of the off-axis light rays at the exit pupil plane of the imaging optical system 12. The exit pupil plane is, for example, the plane at which the exit pupil of the imaging optical system 12 is imaged. The configuration of the exit pupil is, for example, treated as an ellipse. In such a case, the configuration of the exit pupil has a first diameter and a second diameter. The first diameter is the diameter along the first direction (the X-direction) in the exit pupil plane of the exit pupil. The second diameter is the diameter along the second direction (the Y-direction) in the exit pupil plane of the exit pupil.

In the imaging lens 110 according to the embodiment, it is desirable for the exit pupil configuration at the position of the exit pupil to satisfy Condition Formula (7) recited below.

$$0 \le p < 0.3 \quad (7)$$

In Condition Formula (7), ρ is the flattening. The flattening ρ is $ρ=1-b/a$. a is the radius in the first direction orthogonal to the optical axis of the off-axis light rays passing through the exit pupil at the exit pupil position. b is the radius in the second direction (the direction orthogonal to the first direction) orthogonal to the optical axis of the off-axis light rays passing through the exit pupil at the exit pupil position.

a is ½ times the first diameter. When the exit pupil is treated as substantially a circle or an ellipse, the first diameter is the major diameter of the length of the pupil at the exit pupil position. The radius a is expressed by a=hx(EXTPURX).

b is ½ times the second diameter. When the exit pupil is treated as substantially a circle or an ellipse, the second diameter is the minor diameter of the length of the pupil at the exit pupil position. The radius b is expressed by b=(hy(EXTPiUR)−hy(EXTPiDW))/2.

h(EXTPiCR) is the height at which the chief ray of the off-axis light rays passes through the exit pupil plane.

h(EXTPiUR) is the height at which the upper light ray of the off-axis light rays passes through the exit pupil plane.

h(EXTPiDW) is the height at which the lower light ray of the off-axis light rays passes through the exit pupil plane.

hx(EXTPURX) is the length in the depth direction of the light rays in the plane perpendicular to the chief ray of the off-axis light rays that pass through the exit pupil plane. hx(EXTPURX) is ½ times the length along the first direction (the X-direction) of the off-axis light rays L23 in the exit pupil plane.

For example, hy(EXTPiUR) is the height in the second direction at which the upper light ray of the off-axis light rays passes through the exit pupil plane. hy(EXTPiUR) is the distance along the second direction (the Y-direction) between the optical axis Ox and the position where the upper light ray L23u passes through the exit pupil plane.

hy(EXTPiDW) is the height in the second direction at which the lower light ray of the off-axis light rays passes through the exit pupil plane. hy(EXTPiDW) is the distance along the second direction between the optical axis Ox and the position where the lower light ray L23d passes through the exit pupil plane.

Condition Formula (7) is a condition formula for the configuration of the exit pupil at the position of the exit pupil of the imaging lens 110 according to the embodiment.

When the light rays from the imaging optical system 12 is demagnified and imaged onto the solid-state imaging element 16 by the microlens array MLA (14), it is ideal for the configuration of the exit pupil of the imaging optical system 12 and the configuration of the entrance pupil of the single lens on the microlens array MLA (14) to match so that the light rays efficiently reaches the solid-state imaging element 16.

However, actually, because the arrangement of the single lenses of the microlens array MLA (14) has hexagonal packing density, even if single lens centers on the microlens array MLA (14) are aligned with the center of the solid-state imaging element 16, the chief ray of the off-axis light rays that has a large angle of view has a large incident angle with respect to the optical axes of the single lenses of the microlens array MLA (14) and is incident at a tilt of 20 degrees to 30 degrees with respect to the optical axis of the microlens array MLA (14); and therefore, it is difficult to align the entrance pupil position of the microlens array MLA (14) and the exit pupil position of the imaging optical system 12.

The pupil configuration of the off-axis light rays that is emitted tilted with respect to the imaging optical system 12 is an ellipse (a configuration such as a laterally-long cat's eye) due to the effect of vignetting. To cause the off-axis light rays from the imaging optical system 12 to be incident efficiently on the single lenses of the microlens array MLA (14) as much as possible, it is necessary for the configuration of the exit pupil from the imaging optical system 12 to be a configuration as close to a circle as possible. Condition Formula (8) regulates such a pupil configuration.

In the case where the upper limit of Condition Formula (7) is exceeded, the configuration of the exit pupil of the imaging optical system 12 shifts greatly from the configuration of the exit pupil of the single lenses of the microlens array MLA (14). Therefore, it is difficult to cause the light rays to pass through the microlens array MLA (14) and efficiently reach the solid-state imaging element 16.

In Condition Formula (7), it is more favorable for the range to be $0 \leq \rho < 0.2$, and even more favorable for the range to be $0 \leq \rho < 0.1$.

In the imaging lens 110 according to the embodiment, it is desirable for Condition Formula (8) recited below to be satisfied.

$$0 \leq v1 - v2 \quad (8)$$

In Condition Formula (8), v1 is the Abbe number of the first lens L1; and v2 is the Abbe number of the second lens L2.

Condition Formula (8) regulates the Abbe numbers of the materials included in the positive first lens L1 and the negative second lens L2. By satisfying Condition Formula (8), it is possible to correct the chromatic aberration at the optical axis and the off-axis chromatic aberration of the magnification.

The imaging lens 110 according to the embodiment may be configured to satisfy Condition Formula (9) recited below.

$$0° \leq \alpha i \leq 30° \quad (9)$$

In Condition Formula (9), αi is the incident angle of the chief ray of the off-axis light rays onto the imaging plane DT at the maximum angle of view (the maximum image height).

In the imaging lens 110 according to the embodiment, in the case where the solid-state imaging element 16 and the microlens array MLA (14) are used in combination, when the off-axis light rays that is emitted from the imaging optical system 12 is incident at a large angle with respect to the microlens array MLA (14) and passes through the microlens array MLA (14) to be imaged on the solid-state imaging element 16, the angle of view of the off-axis light rays that can be tolerated by the microlens array MLA (14) undesirably shifts greatly; and the brightness of the image is undesirably different between the image central portion and the image peripheral portion. When the incident angle on the microlens array MLA (14) is small, this problem is reduced, but the total length of the optical system undesirably becomes large. Therefore, it is favorable to satisfy Condition Formula (9).

Further, the imaging lens 110 may be configured to satisfy Condition Formula (10), (11), and (12) recited below.

$$0.4 < |R4/f| < 0.8 \quad (10)$$

$$10 < |R2/R1| < 30 \quad (11)$$

$$0.2 < |R6|/f < 0.6 \quad (12)$$

In Condition Formula (10), R4 is the curvature radius of the surface (the fourth surface) on the image side of the second lens L2; and f is the focal length of the imaging optical system 12. Condition Formula (10) is the condition for appropriately setting the curvature radius of the surface (the fourth surface) on the image side of the second lens L2. By setting the surface (the fourth surface) on the image side of the second lens L2 to be a strongly diverging surface to satisfy Condition Formula (10), the longitudinal chromatic aberration occurring due to the first lens L1 having the positive refractive power can be favorably corrected by the second lens L2. Also, by setting the conditions to exceed the lower limit of Condition Formula (10), the chromatic aberration can be favorably corrected while maintaining a small Petzval sum.

In Condition Formula (10), it is more favorable for the range to be $0.4 < |R4/f| < 0.7$, and even more favorable for the range to be $0.5 < |R4/f| < 0.7$.

In Condition Formula (11), Ri is the curvature radius of the surface (the first surface) on the object side of the first lens L1; and R2 is the curvature radius of the surface (the second surface) on the image side of the first lens L1. Condition Formula (11) is a condition formula for the configuration of the first lens L1 to correct mainly the spherical aberration.

Accordingly, in the case where the upper limit of Condition Formula (11) is exceeded, a large negative spherical aberration occurs; and correction by the lenses disposed rearward of the first lens L1 is difficult. Moreover, the comatic aberration becomes excessive. Although it is advantageous for the off-axis aberration correction when the conditions fall below the lower limit of Condition Formula (11), it is difficult to correct the excessive spherical aberration that occurs at the surface (the second surface) on the image side of the first lens L1.

In Condition Formula (11), it is more favorable for the range to be 10<|R2/R1|<20, and even more favorable for the range to be 15<|R2/R1|<20.

In Condition Formula (12), R6 is the curvature radius of the surface (the sixth surface) on the image side of the third lens L3; and f is the focal length of the imaging optical system 12. Condition Formula (12) is a condition formula relating to the configuration of the third lens L3. It is necessary for the third lens L3 to have a slightly positive meniscus configuration in which the convex surface faces the image side. By setting the third lens L3 to have a slightly positive refractive power, the correction of the off-axis aberrations can be performed while reducing the refractive powers of the first lens L1 and the second lens L2.

In the case where the upper limit of Condition Formula (12) is exceeded, the incident angle on the microlens array MLA (14) cannot be ensured at 0° to 30° because the off-axis chief ray angle becomes too low and the fourth lens L4 is uncorrectable. In the case where the conditions fall below the lower limit of Condition Formula (12), the incident angle on the microlens array MLA (14) can be ensured at 0° to 30°; but the off-axis comatic aberration increases; and the performance degrades.

In Condition Formula (12), it is more favorable for the range to be 0.2<|R6|/f<0.5, and even more favorable for the range to be 0.3<|R6|/f<0.5.

Also, the imaging lens 110 may be configured to satisfy Condition Formula (13) recited below.

$$0.3<|R4/R3|<0.7 \qquad (13)$$

In Condition Formula (13), R3 is the curvature radius of the surface (the third surface) on the object side of the second lens L2; and R4 is the curvature radius of the surface (the fourth surface) on the image side of the second lens L2. Condition Formula (13) is a condition formula for setting the ratio of the curvature radius of the surface (the fourth surface) on the image side of the second lens L2 and the curvature radius of the surface (the third surface) on the object side.

In the case where the upper limit of Condition Formula (13) is exceeded, the aberration correction of the off-axis light rays due to the refractive power of the third lens and the fourth lens is insufficient; and it is difficult to realize the performance. Conversely, in the case where the conditions fall below the lower limit, the curvature radius of the image-side surface of the second lens becomes small; and therefore, the aberration correction of the off-axis light rays and particularly the comatic aberration is insufficient; and correction by the refractive powers of the third lens and the fourth lens is difficult. To perform the correction, not only are the refractive powers of the third lens and the fourth lens corrected but also the lens spacing is adjusted to control the incident height of the light rays; and the total length undesirably lengthens.

In Condition Formula (13), it is more favorable for the range to be 0.3<|R4/R3|<0.6, and even more favorable for the range to be 0.4<|R4/R3|<0.6.

Thus, according to the imaging lens 110 of the embodiment and the solid state imaging device 1 that includes the imaging lens 110, a low number of lenses and a simple lens configuration are possible; high performance such as the F-number being brighter, etc., can be achieved; and the lens system itself can be compact. Also, both a high-precision range image and a good visible image can be acquired.

The imaging lens 110 and the solid state imaging device 1 according to the embodiment are applicable to various electronic devices such as, for example, a portable terminal such as a mobile telephone, a tablet terminal, a digital camera, or the like, a video device, an industrial robot, a robot arm, a medical device such as an endoscope, etc.

A numerical example of the imaging optical system 12 will now be described as an example.

First Example

Figure 20:
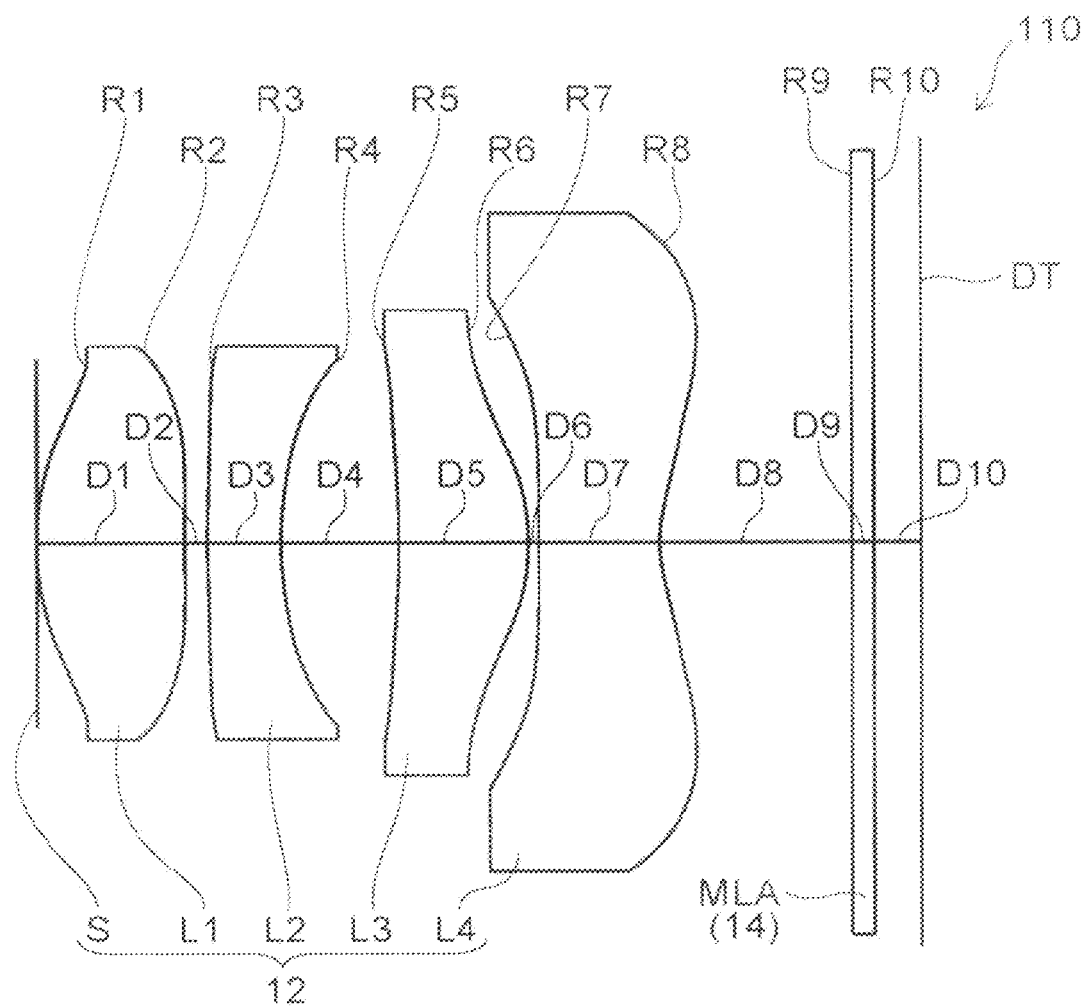
FIG. 20 illustrates the configuration of an imaging lens according to a first example.

FIG. 20 illustrates the configuration of an imaging lens according to a first example.

Figure 21:
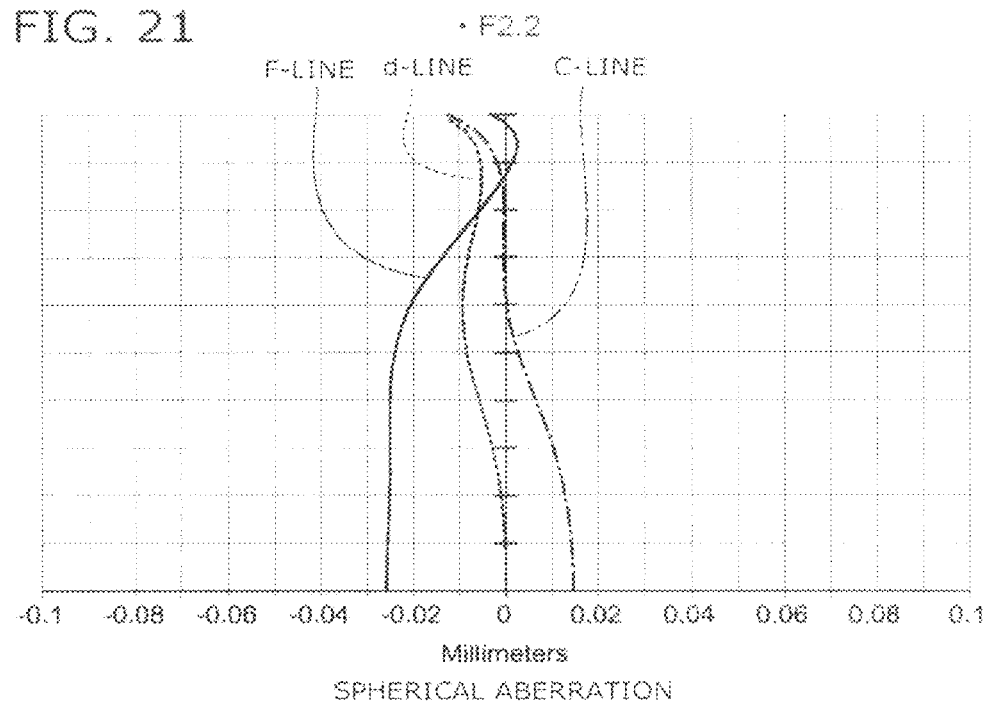
FIG. 21 is various aberration diagrams of the imaging lens according to the first example.
Figure 22:
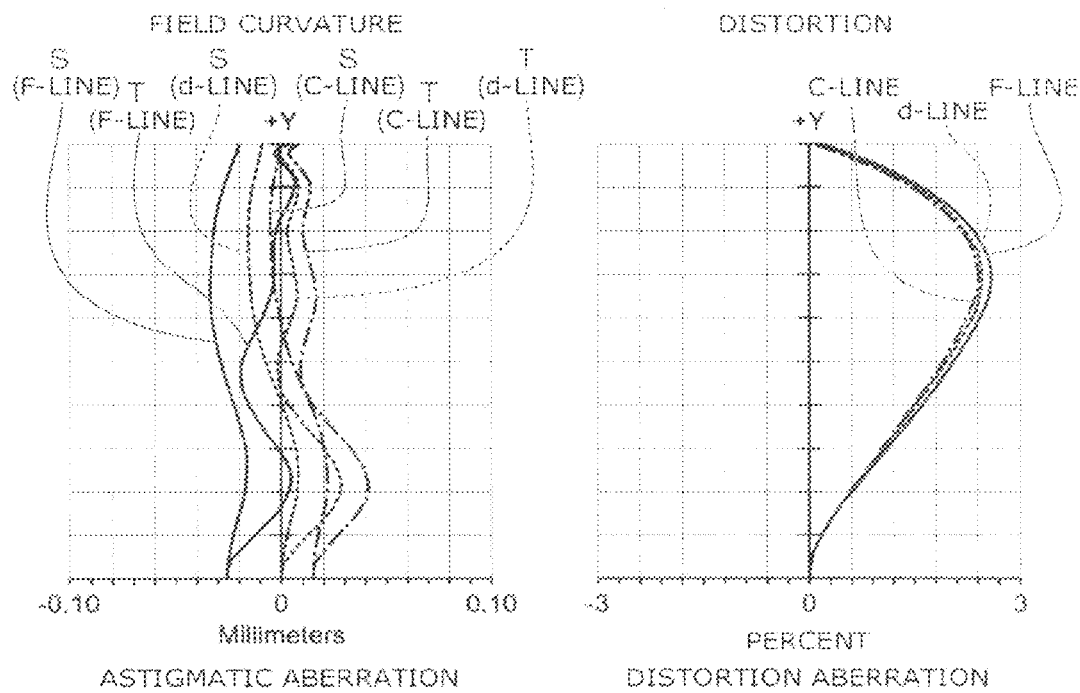
FIG. 22 is various aberration diagrams of the imaging lens according to the first example.

FIG. 21 and FIG. 22 are various aberration diagrams of the imaging lens according to the first example.

Figure 23:
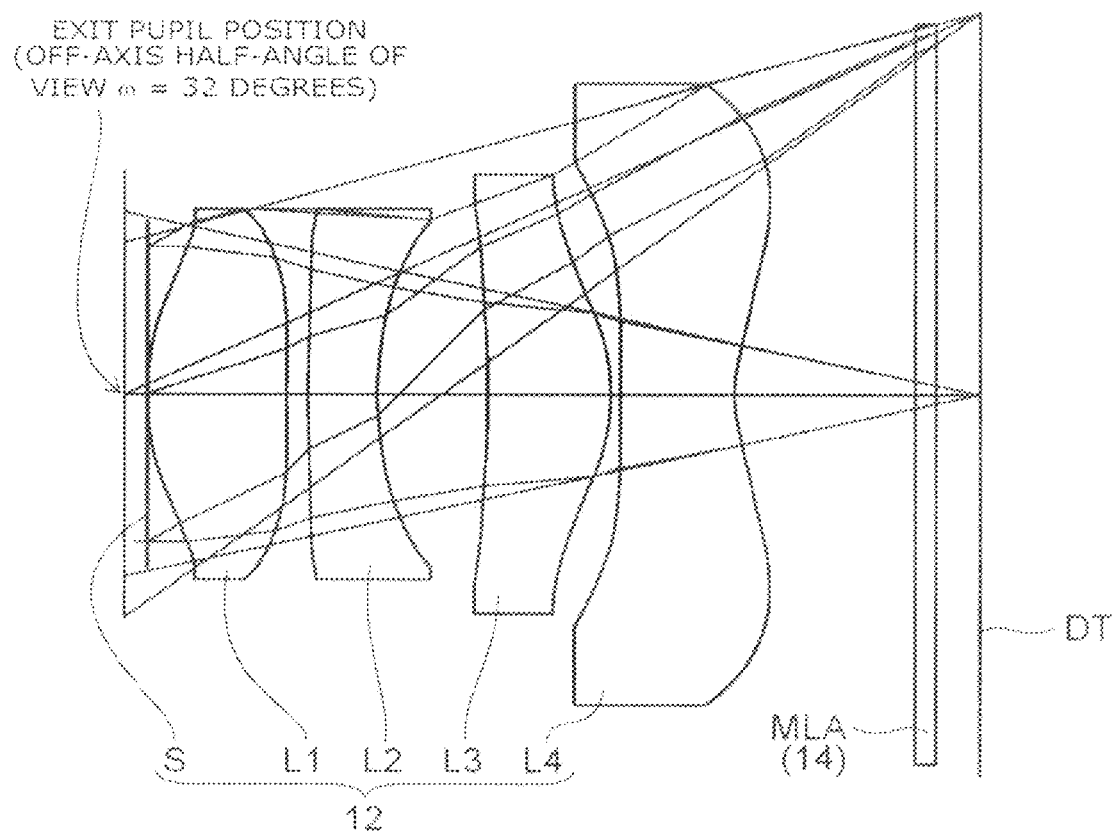
FIG. 23 illustrates the exit pupil position of the imaging lens according to the first example.

FIG. 23 illustrates the exit pupil position of the imaging lens according to the first example.

Figure 24:
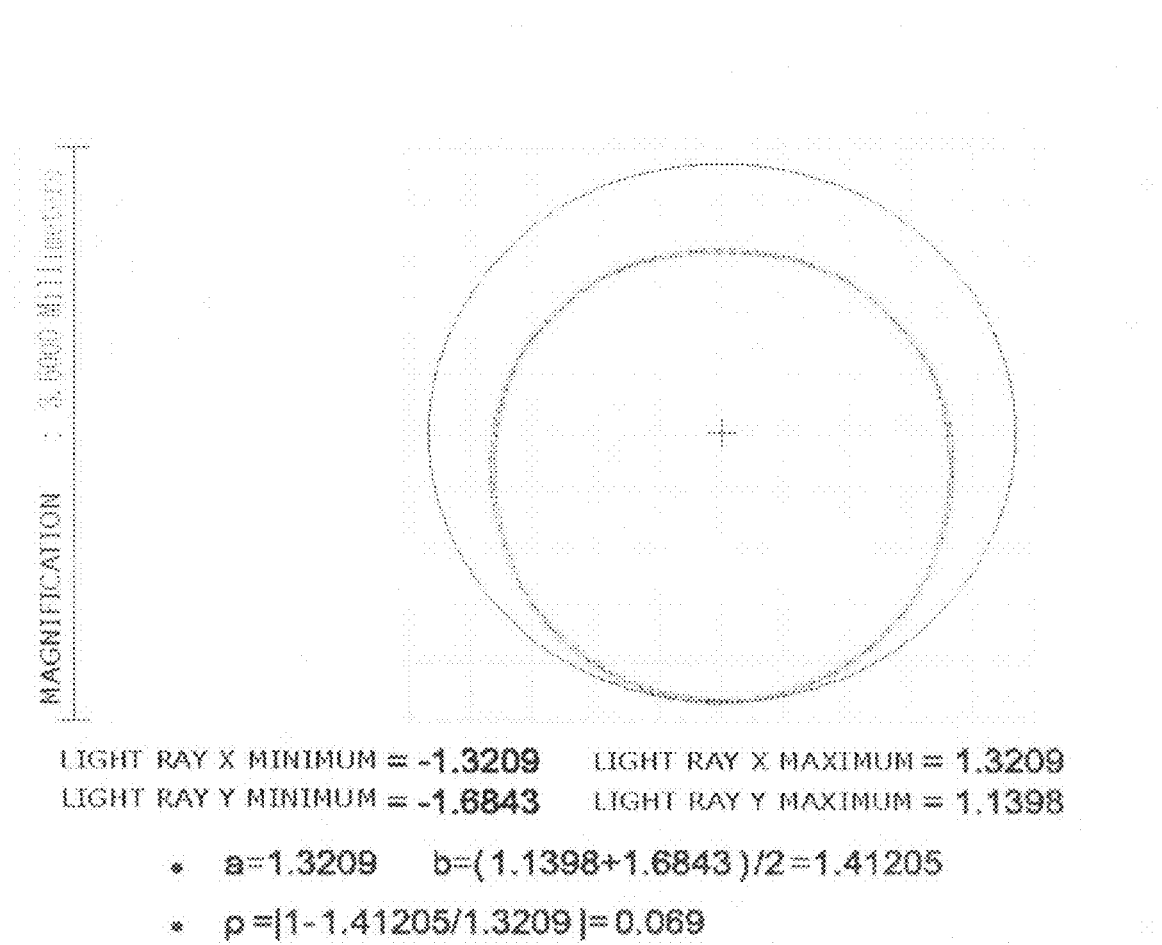
FIG. 24 illustrates the configurations and numerical values of the exit pupils of the imaging lens according to the first example.

FIG. 24 illustrates the configurations and numerical values of the exit pupils of the imaging lens according to the first example.

Table 2 recited below shows the curvature radius Ri, the spacing Di, the refractive index nd, and the dispersion value vd for the surfaces of the imaging optical system 12 according to the first example.

TABLE 2

| SURFACE | Ri | Di | nd | vd |
|---|---|---|---|---|
| f 4.88 mm F-NUMBER = 2.2 ω = 30.4° | | | | |
| APERTURE STOP(s) | INFINITY | 0.00000 | | |
| 1 | 2.12473 | 0.94496 | 1.51956 | 64.00 |
| 2 | 35.44602 | 0.15571 | | |
| 3 | 5.82115 | 0.48504 | 1.63193 | 23.33 |
| 4 | 3.05136 | 0.76322 | | |
| 5 | −5.54887 | 0.85000 | 1.54413 | 55.98 |
| 6 | −1.47815 | 0.06849 | | |
| 7 | 19.78671 | 0.79416 | 1.53438 | 56.20 |
| 8 | 1.55091 | 1.23784 | | |
| 9 (MLA) | INFINITY | 0.15000 | 1.45844 | 67.83 |
| 10 | INFINITY | 0.3000 | | |

The following is the aspherical surface data of the imaging optical system 12 according to the first example.

First Surface:
K=−1.9950652
a4=0.018367277
a6=−0.01144917
a8=0.00184325
a10=−0.00237814
a12=−0.00043284
a14=−0.00035181

Second Surface:
K=−1701.21745
a4=−0.06279352
a6=−0.01766232
a8=0.015362595
a10=−0.00412161
a12=−0.00055743

Third Surface:
K=2.992484
a4=−0.06911947
a6=0.010362833
a8=−0.03495753
a10=0.056227525
a12=−0.02630633 a14=0.004111307
Fourth Surface:
K=−0.259497
a4=0.002537177
a6=0.005646072
a8=−0.00933221
a10=0.005958687
a12=0.007204493
a14=−0.00347005
Fifth Surface:
K=12.312724
a4=0.061258053
a6=−0.01945500
a8=0.014163829
a10=−0.00577455
a12=0.000324330
a14=0.000246559
Sixth Surface:
K=−5.3536684
a4=−0.02292847
a6=0.019427301
a8=0.001744590
a10=−0.00139355
a12=−0.00002229
a14=0.000029414
Seventh Surface:
K=80.9860320
a4=−0.07366563
a6=0.007658314
a8=0.004073979
a10=−0.00157351
a12=0.000186398
a14=−0.00000822
Eighth Surface:
K=−7.16090373
a4=−0.05162849
a6=0.013487546
a8=−0.00312376
a10=0.000411202
a12=−0.00002234
a14=−0.00000083
f1/f=0.880
|f2|/f=2.227
TL/f=1.177
(R7+R8)/(R7−R8)=1.726
D34/f=0.014
hc(G3R)/(D1+D2+D3+D4+D5)=0.427
ρ=0.069
ν1−ν2=64−23.3=40.7
CRA (incident angle of chief ray onto image plane) (angle of view of 31 degrees)=26.0°
|R4/f|=0.624
|R2/R1|=16.682
|R6/f|=0.302
|R4/R3|=0.524

As described below, Condition Formulas (1) to (13) recited above are satisfied in the example. As recited above, it can be seen that the imaging optical system 12 according to the first example has good performance.

Second Example

Figure 25:
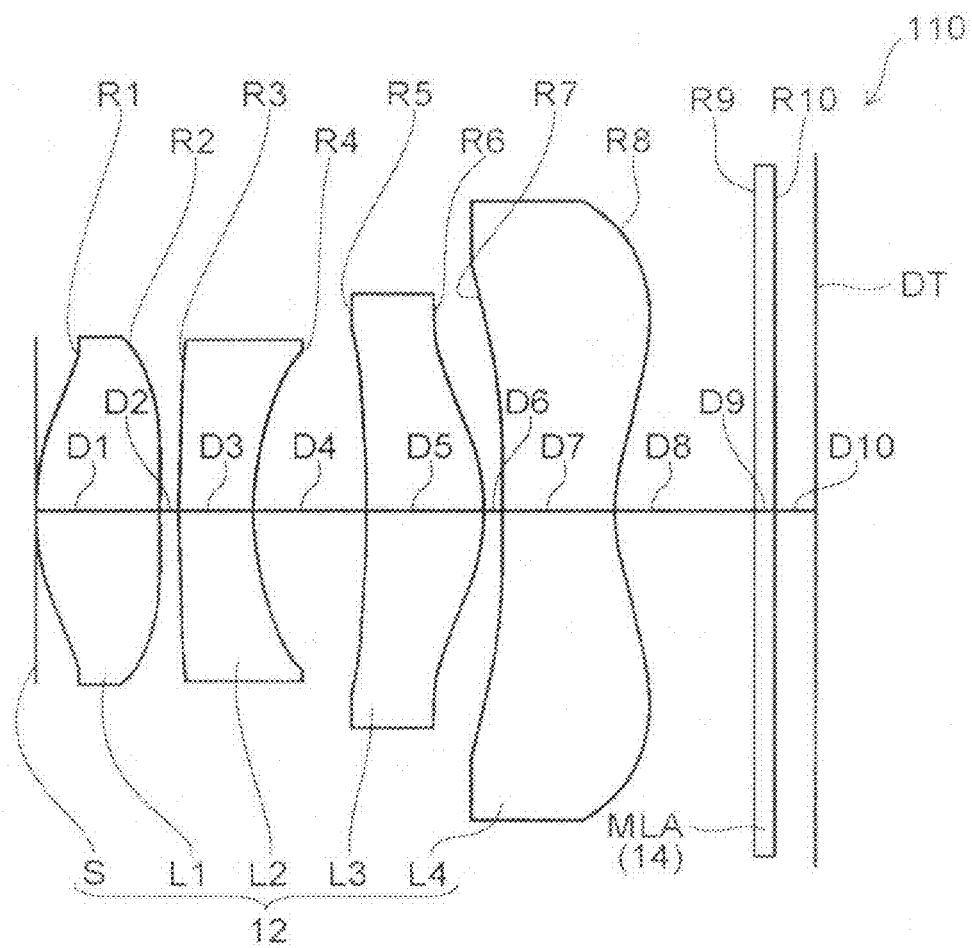
FIG. 25 illustrates the configuration of an imaging lens according to a second example.

FIG. 25 illustrates the configuration of an imaging lens according to a second example.

Figure 26:
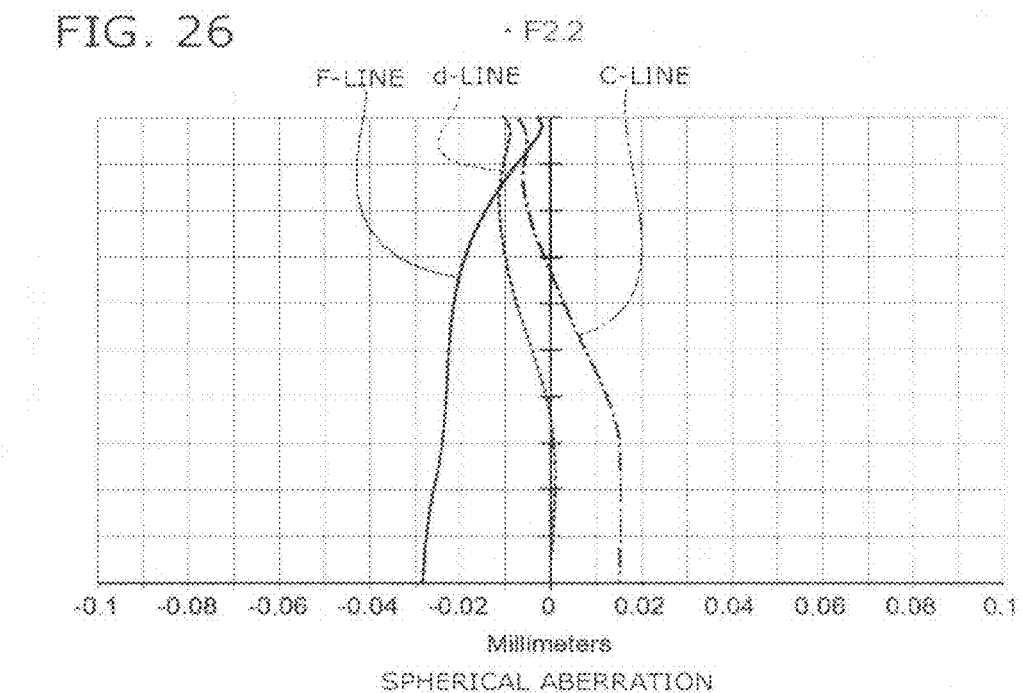
FIG. 26 is various aberration diagrams of the imaging lens according to the second example.
Figure 27:
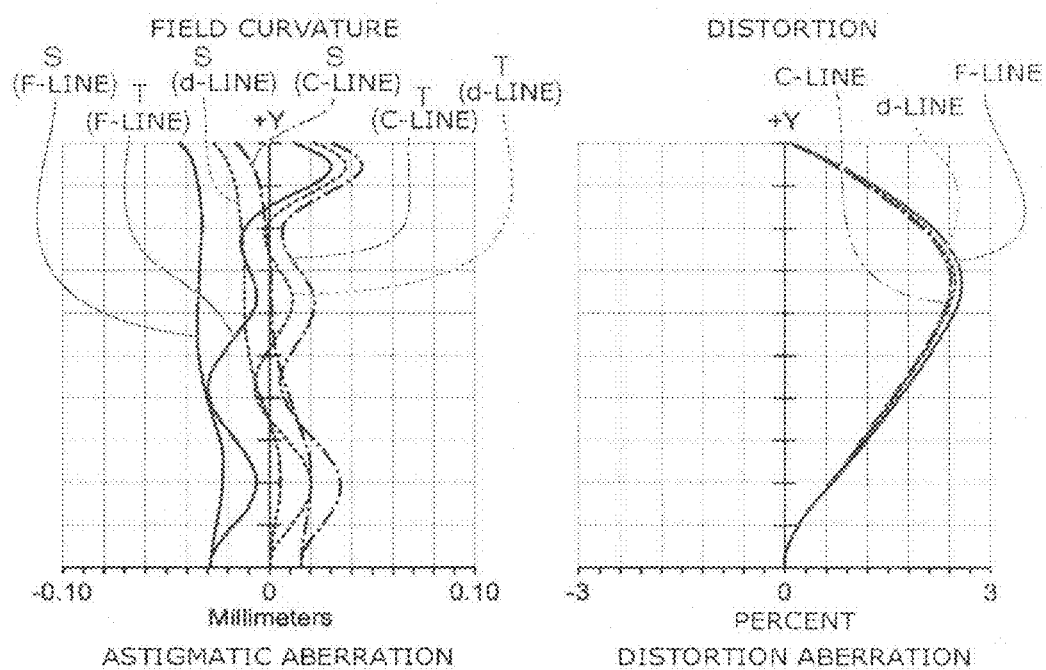
FIG. 27 is various aberration diagrams of the imaging lens according to the second example.

FIG. 26 and FIG. 27 are various aberration diagrams of the imaging lens according to the second example.

Figure 28:
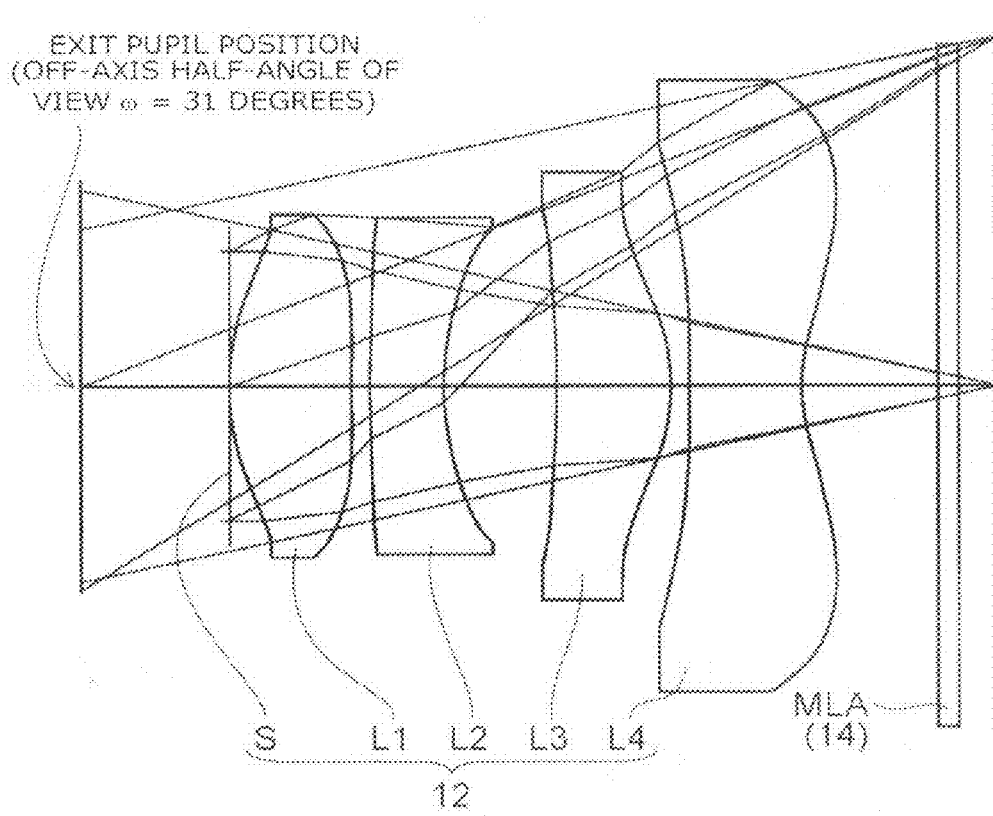
FIG. 28 illustrates the exit pupil position of the imaging lens according to the second example.

FIG. 28 illustrates the exit pupil position of the imaging lens according to the second example.

Figure 29:
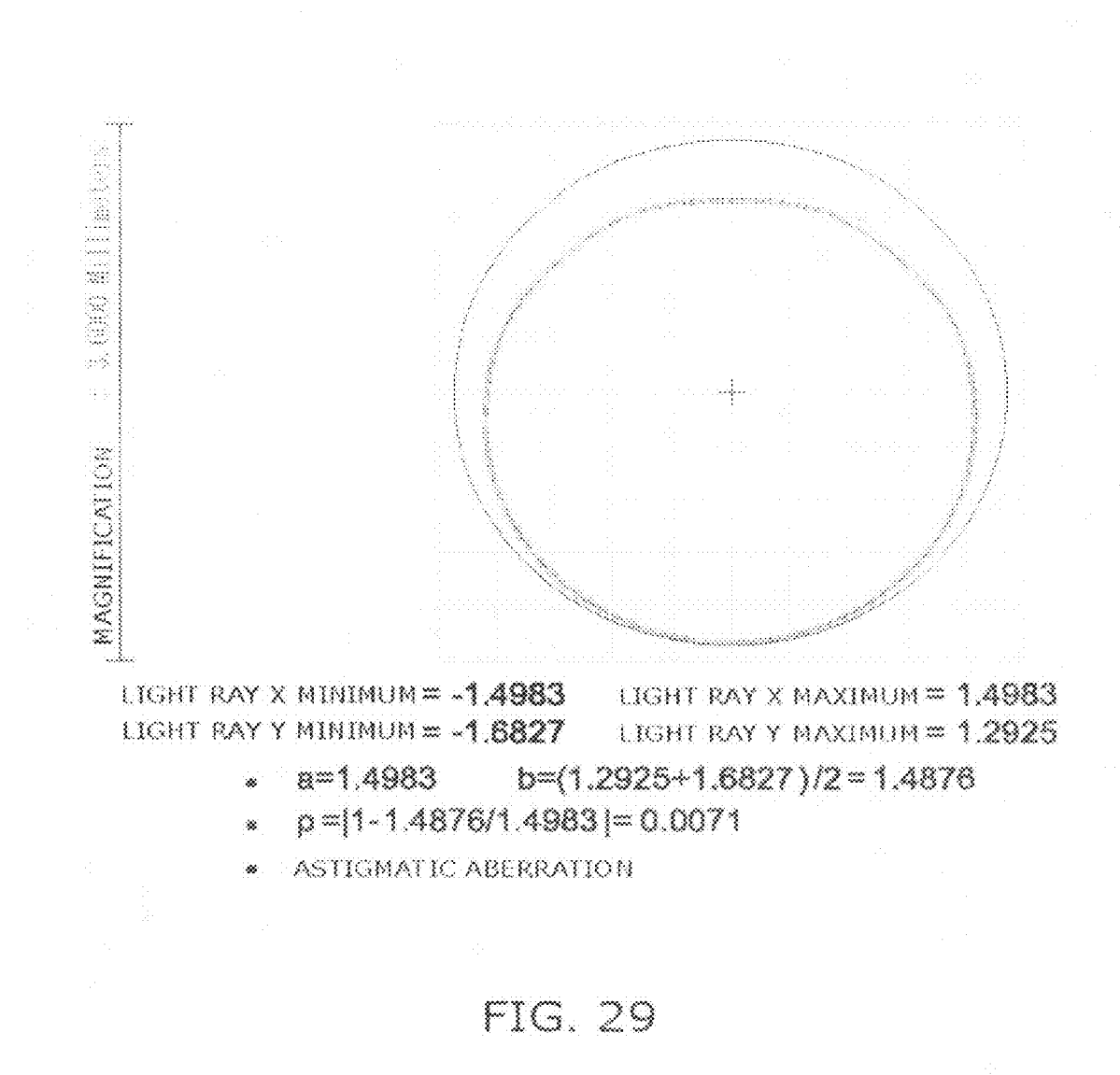
FIG. 29 illustrates the configurations and numerical values of the exit pupils of the imaging lens according to the second example.

FIG. 29 illustrates the configurations and numerical values of the exit pupils of the imaging lens according to the second example.

Table 3 recited below shows the curvature radius Ri, the spacing Di, the refractive index nd, and the dispersion value νd for the surfaces of the imaging optical system 12 according to the second example.

TABLE 3

| f 4.85 mm F-NUMBER = 2.2 ω = 30.6° | | | | |
|---|---|---|---|---|
| SURFACE | Ri | Di | nd | νd |
| APERTURE STOP(s) | INFINITY | 0.00000 | | |
| 1 | 2.16866 | 0.92357 | 1.53996 | 59.46 |
| 2 | 36.32032 | 0.13704 | | |
| 3 | 6.10185 | 0.55805 | 1.63193 | 23.33 |
| 4 | 3.02017 | 0.85121 | | |
| 5 | −5.48489 | 0.85000 | 1.54414 | 55.99 |
| 6 | −1.67118 | 0.12831 | | |
| 7 | 11.54043 | 0.85000 | 1.53438 | 56.20 |
| 8 | 1.66764 | 1.02915 | | |
| 9 (MLA) | INFINITY | 0.15000 | 1.45844 | 67.83 |
| 10 | INFINITY | 0.30000 | | |

The aspherical surface data of the imaging optical system 12 according to the second example is as follows.
First Surface:
K=−2.06799522
a4=0.01855843
a6=−0.01006203
a8=0.0088306
a10=−0.00260269
a12=−0.00052668
a14=−0.00029830
Second Surface:
K=−1191.139073
a4=−0.06291462
a6=−0.01799747
a8=0.01562652
a10=−0.00393719
a12=−0.00066197
Third Surface:
K=1.64476863
a4=−0.06988057
a6=0.01005532
a8=−0.03522801
a10=0.05607947
a12=−0.02630614
a14=0.00415417
Fourth Surface:
K=−0.31819915
a4=0.0247241
a6=0.00553316
a8=−0.00922980
a10=0.00594848
a12=0.00716690
a14=−0.00351395
Fifth Surface:
K=11.67747158
a4=0.05294032
a6=−0.01959305
a8=0.01415234
a10=−0.00567885
a12=0.00035168
a14=0.00023475
Sixth Surface:
K=−5.55271877 a4=−0.02442981
a6=0.01881547
a8=0.00180048
a10=−0.00137555
a12=−0.00001613
a14=0.00003129
Seventh Surface:
K=8.33844106
a4=−0.06882487
a6=0.00915850
a8=0.00417992
a10=−0.00156627
a12=0.00019003
a14=−0.00000773
Eighth Surface:
K=−5.96611795
a4=−0.05156994
a6=0.01412112
a8=−0.00324227
a10=0.00039506
a12=−0.00002137
a14=−1.0311×10$^{−7}$
f1/f=0.871
|f2|/f=2.09
TL/f=1.19
(R7+R8)/(R7−R8)=1.876
D34/f=0.026
hc(G3R)/(D1+D2+D3+D4+D5)=0.442
ρ=0.0071
v1−v2=59.46−23.33=36.13
CRA (incident angle of chief ray onto image plane) (angle of view of 31 degrees)=22.6°
|R4/f|=0.621
|R2/R1|=16.74
|R6/f|=0.344
R4/R3=0.495

As described below, Condition Formulas (1) to (13) recited above are satisfied in the example. As recited above, it can be seen that the imaging optical system 12 according to the second example has good performance.

Third Example

Figure 30:
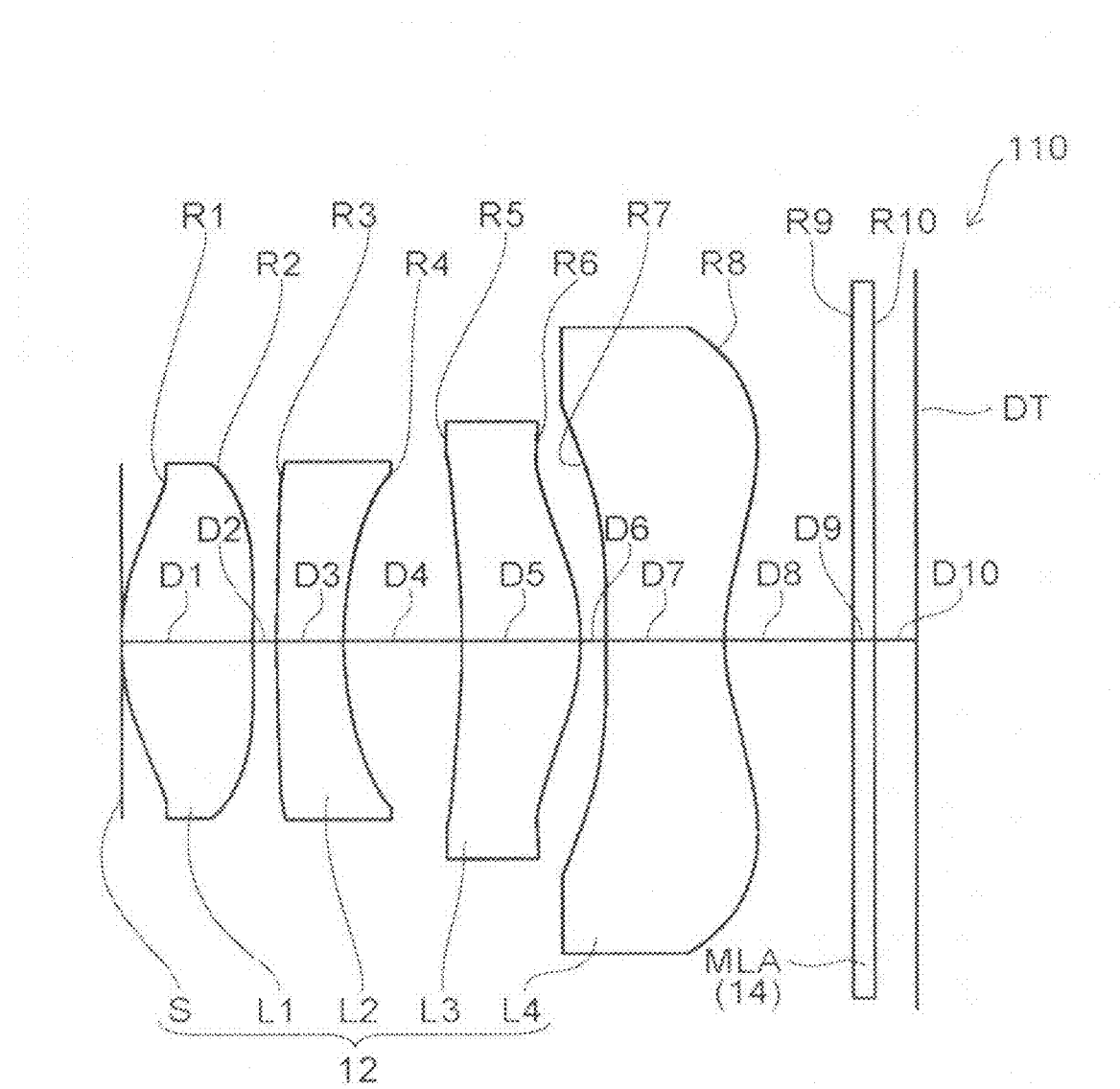
FIG. 30 illustrates the configuration of an imaging lens according to a third example.

FIG. 30 illustrates the configuration of an imaging lens according to a third example.

Figure 31:
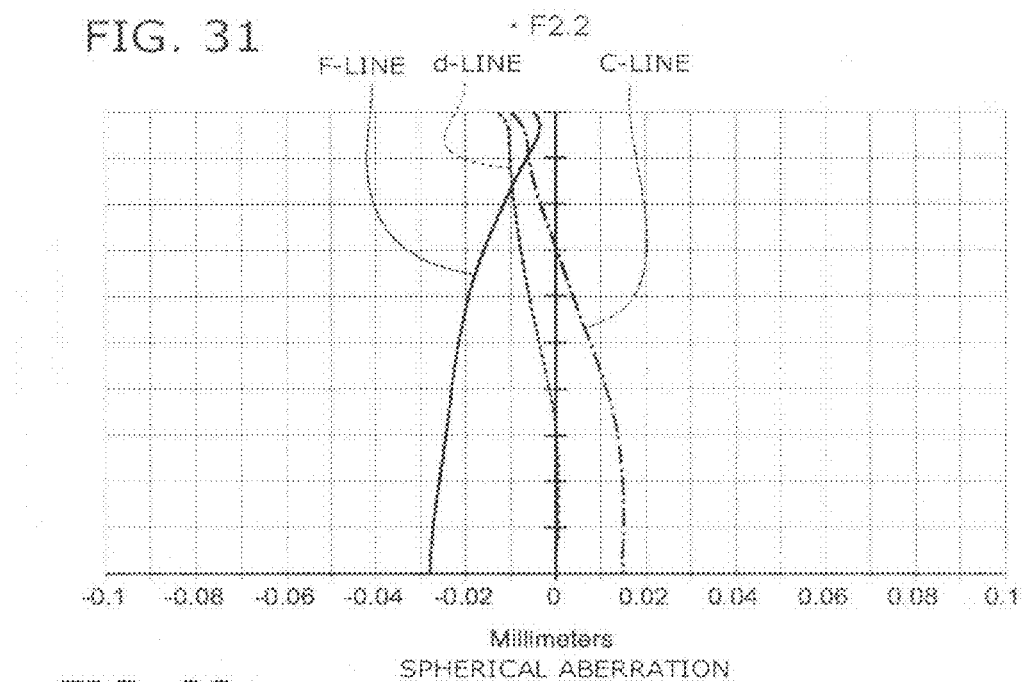
FIG. 31 is various aberration diagrams of the imaging lens according to the third example.
Figure 32:
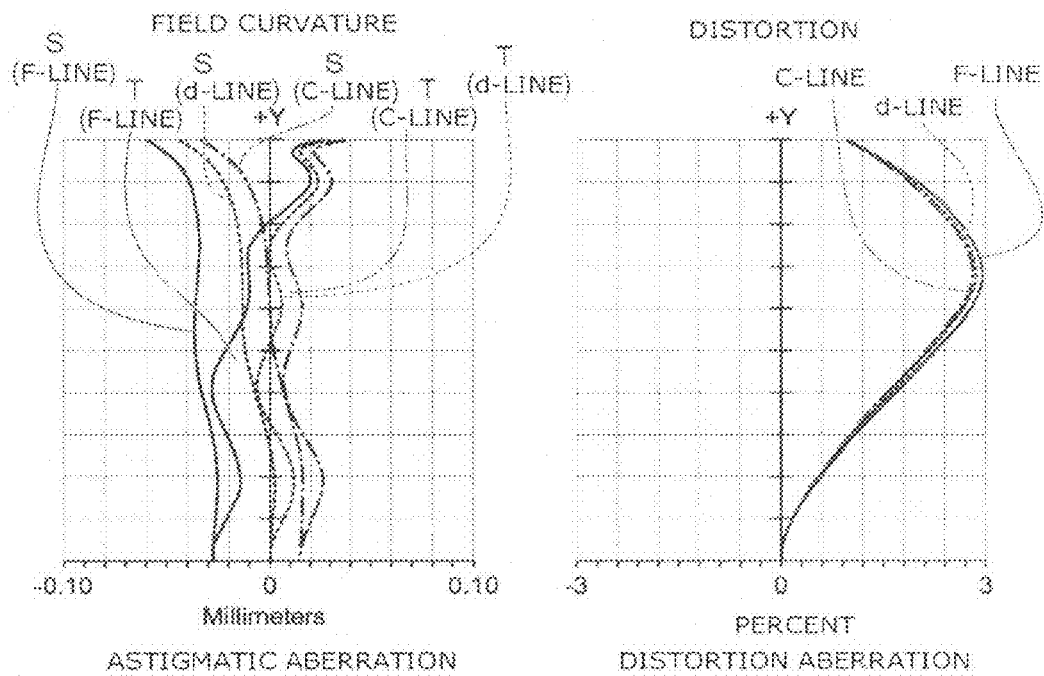
FIG. 32 is various aberration diagrams of the imaging lens according to the third example.

FIG. 31 and FIG. 32 are various aberration diagrams of the imaging lens according to the third example.

Figure 33:
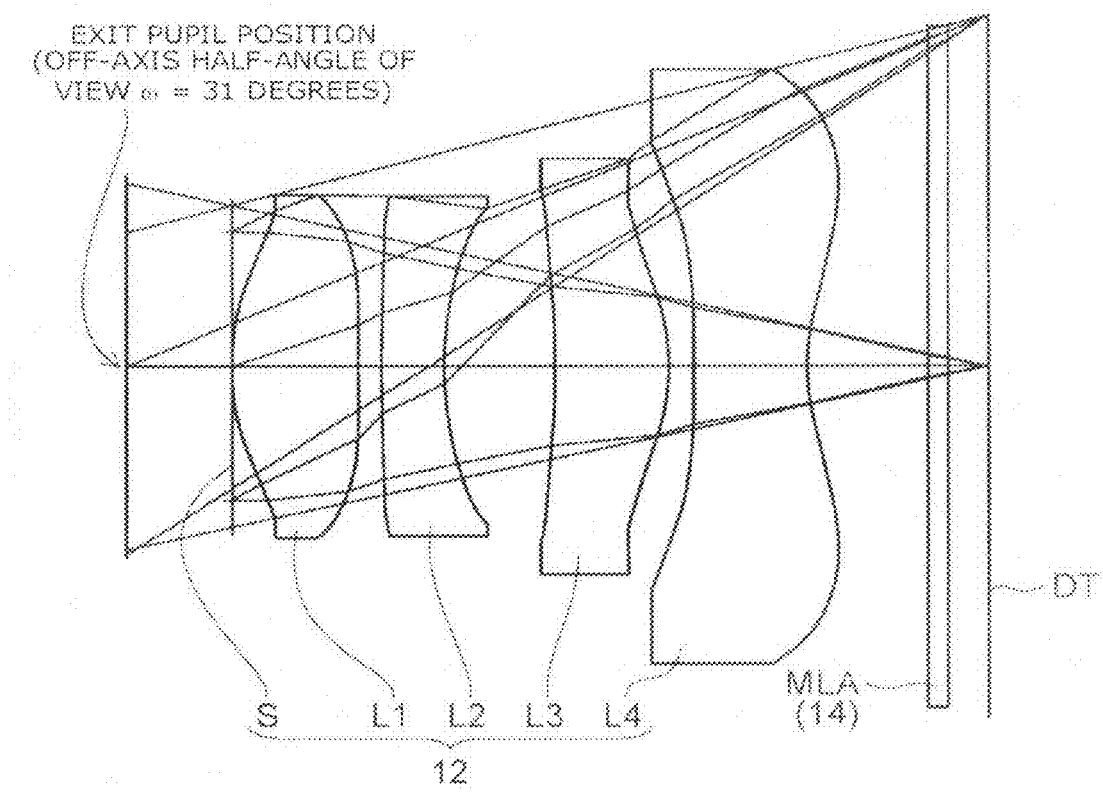
FIG. 33 illustrates the exit pupil position of the imaging lens according to the third example.

FIG. 33 illustrates the exit pupil position of the imaging lens according to the third example.

Figure 34:
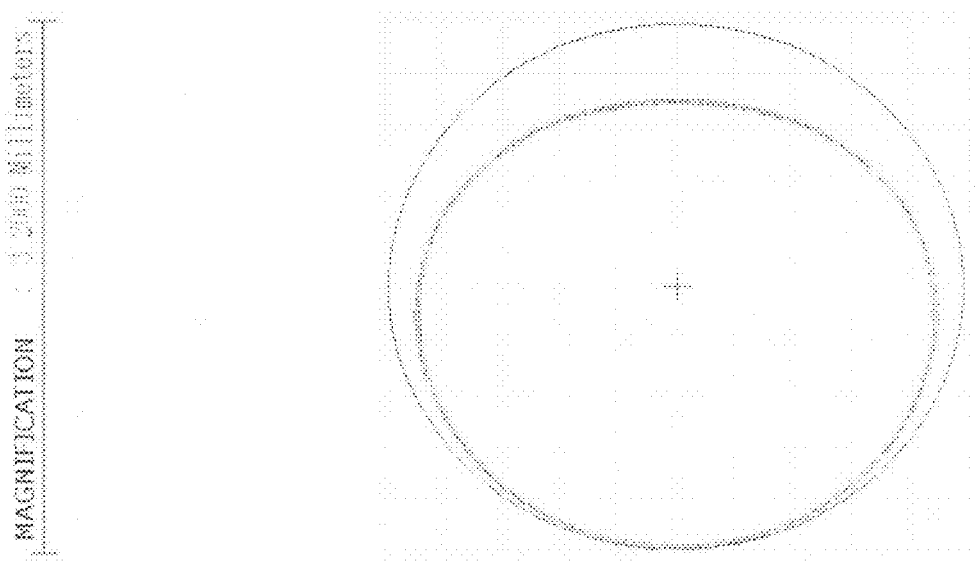
FIG. 34 illustrates the configurations and numerical values of the exit pupils of the imaging lens according to the third example.

FIG. 34 illustrates the configurations and numerical values of the exit pupils of the imaging lens according to the third example.

Table 4 recited below shows the curvature radius Ri, the spacing Di, the refractive index nd, and the dispersion value vd for the surfaces of the imaging optical system 12 according to the third example.

TABLE 4

| f 4.89 mm F-NUMBER = 2.2 ω = 30.4° | | | | |
|---|---|---|---|---|
| SURFACE | Ri | Di | nd | vd |
| APERTURE STOP(s) | INFINITY | 0.00000 | | |
| 1 | 2.15005 | 0.95372 | 1.52305 | 65.93 |
| 2 | 44.43164 | 0.16829 | | |
| 3 | 5.81997 | 0.47848 | 1.63193 | 23.33 |
| 4 | 3.33123 | 0.84775 | | |
| 5 | −5.52235 | 0.85386 | 1.54414 | 55.99 |
| 6 | −1.78090 | 0.18307 | | |

TABLE 4-continued

| f 4.89 mm F-NUMBER = 2.2 ω = 30.4° | | | | |
|---|---|---|---|---|
| SURFACE | Ri | Di | nd | vd |
| 7 | 29.64786 | 0.86830 | 1.53438 | 56.20 |
| 8 | 1.76169 | 0.92610 | | |
| 9 (MLA) | INFINITY | 0.15000 | 1.45844 | 67.83 |
| 10 | INFINITY | 0.30000 | | |

The aspherical surface data of the imaging optical system 12 according to the third example is as follows.
First Surface:
K=−2.10559837
a4=0.01790709
a6=−0.01092953
a8=0.00179489
a10=−0.00249962
a12=−0.00047405
a14=−0.00030073
Second Surface:
K=−2500.419876
a4=−0.06338023
a6=−0.01795624
a8=0.01539966
a10=−0.00404648
a12=−0.00055268
Third Surface:
K=2.80849001
a4=−0.06895896
a6=0.01016882
a8=−0.03499867
a10=0.05620004
a12=−0.02629145
a14=0.00413838
Fourth Surface:
K=−0.38744864
a4=0.002211225
a6=0.00588465
a8=−0.00932198
a10=0.00594414
a12=0.00727966
a14=−0.00340137
Fifth Surface:
K=11.97621036
a4=0.05769052
a6=−0.01962753
a8=0.01430996
a10=−0.00570530
a12=0.00032445
a14=0.00021721
Sixth Surface:
K=−6.03303296
a4=−0.01901123
a6=0.01957884
a8=0.00178096
a10=−0.00139782
a12=−0.00002293
a14=0.00002969
Seventh Surface:
K=152.03688902
a4=−0.07285680
a6=0.00886396
a8=0.00422735
a10=−0.00155662
a12=0.00019118 a14=−0.00000735
Eighth Surface:
K=−6.5576775
a4=−0.04916767
a6=0.01335533
a8=−0.00326096
a10=0.00041292
a12=−0.00002112
a14=−5.2321×10⁻⁷
f1/f=0.875
|f2|/f=2.72
TL/f=1.17
(R7+R8)/(R7−R8)=1.952
D34/f=0.037
hc(G3R)/(D1+D2+D3+D4+D5)=0.436
ρ=0.058
ν1−ν2=59.46−23.33=36.13
CRA (incident angle of chief ray onto image plane) (angle of view of 31 degrees)=23.9°
|R4/f|=0.680
|R2/R1|=20.67
|R6/f|=0.363
R4/R3=0.572

As described below, Condition Formulas (1) to (13) recited above are satisfied in the example. As recited above, it can be seen that the imaging optical system 12 according to the third example has good performance.

Fourth Example

Figure 35:
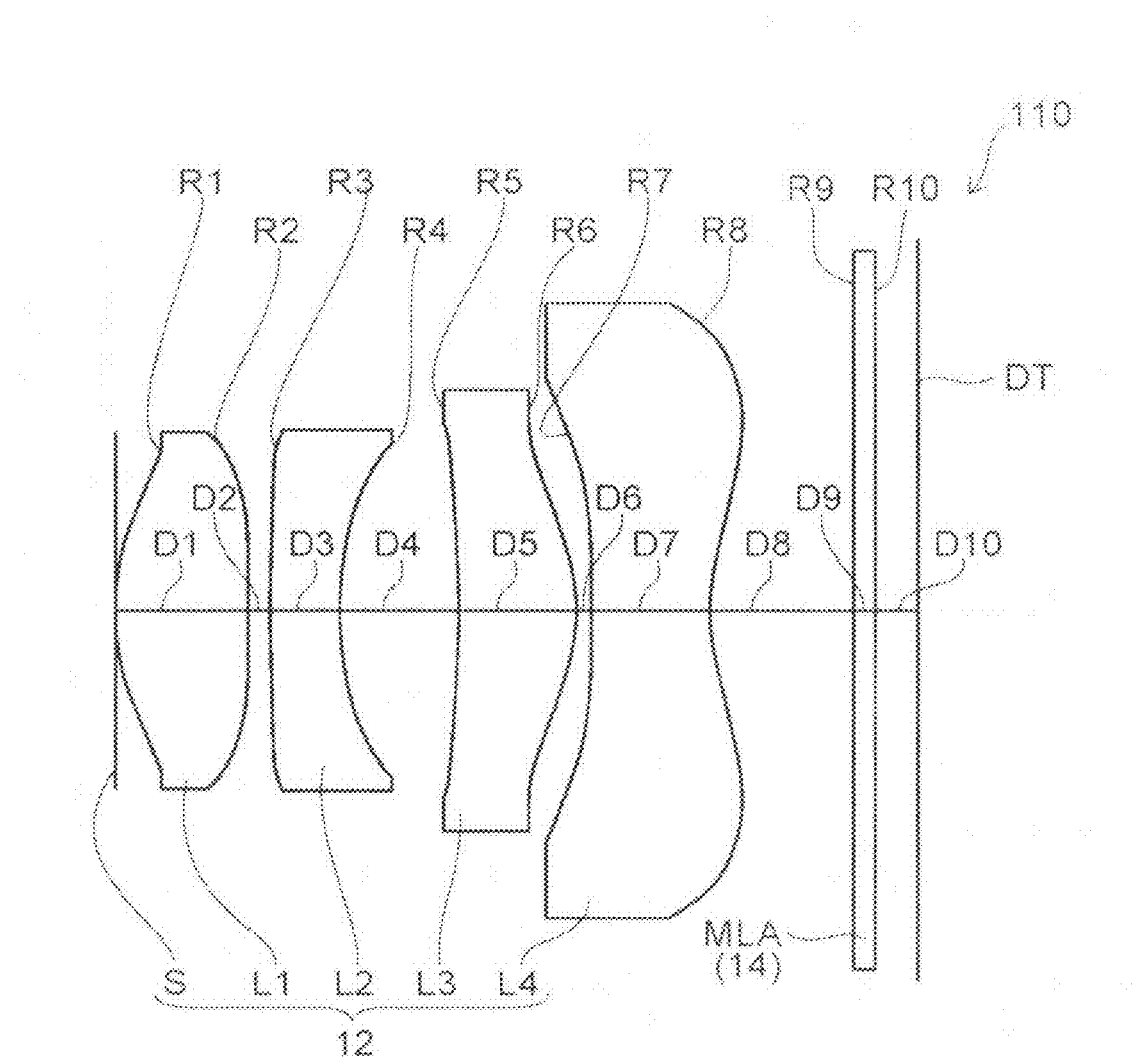
FIG. 35 illustrates the configuration of an imaging lens according to a fourth example.

FIG. 35 illustrates the configuration of an imaging lens according to a fourth example.

Figure 36:
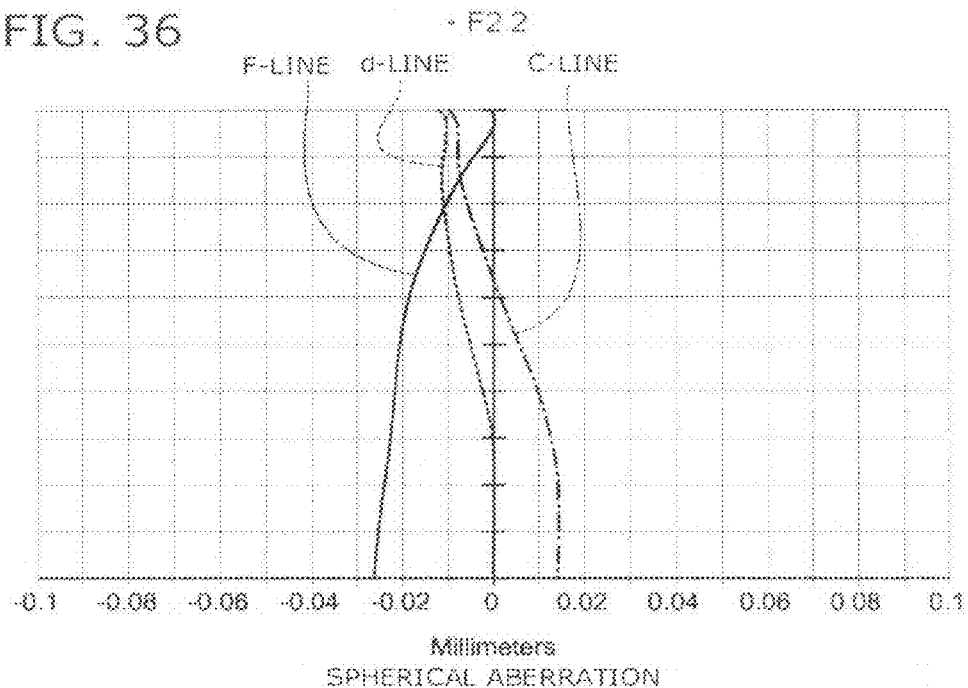
FIG. 36 is various aberration diagrams of the imaging lens according to the fourth example.
Figure 37:
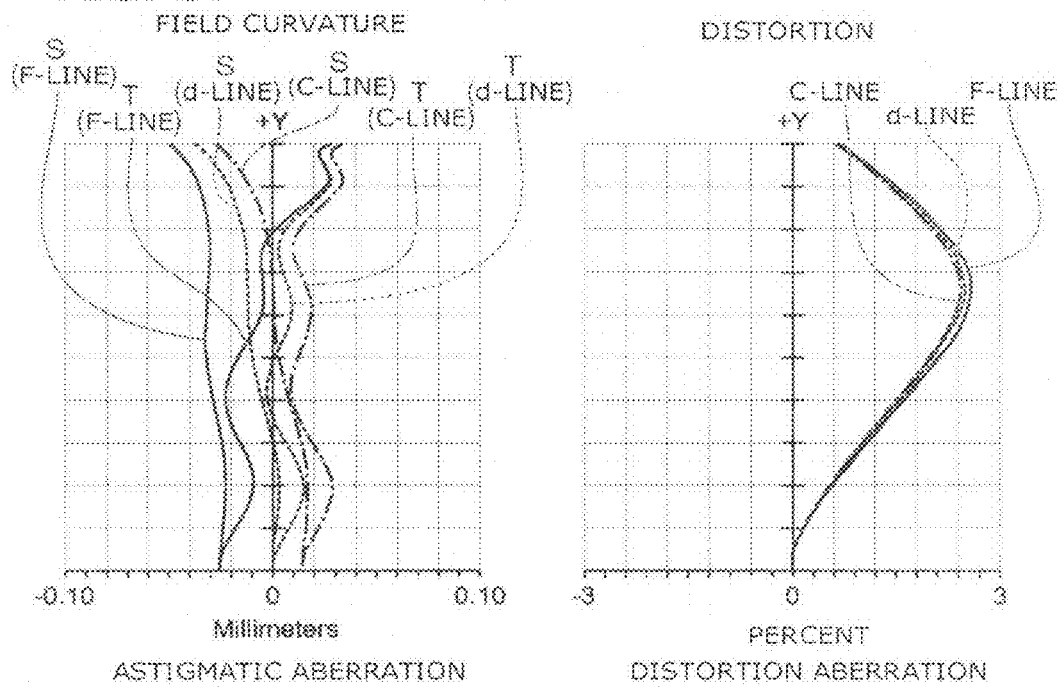
FIG. 37 is various aberration diagrams of the imaging lens according to the fourth example.

FIG. 36 and FIG. 37 are various aberration diagrams of the imaging lens according to the fourth example.

Figure 38:
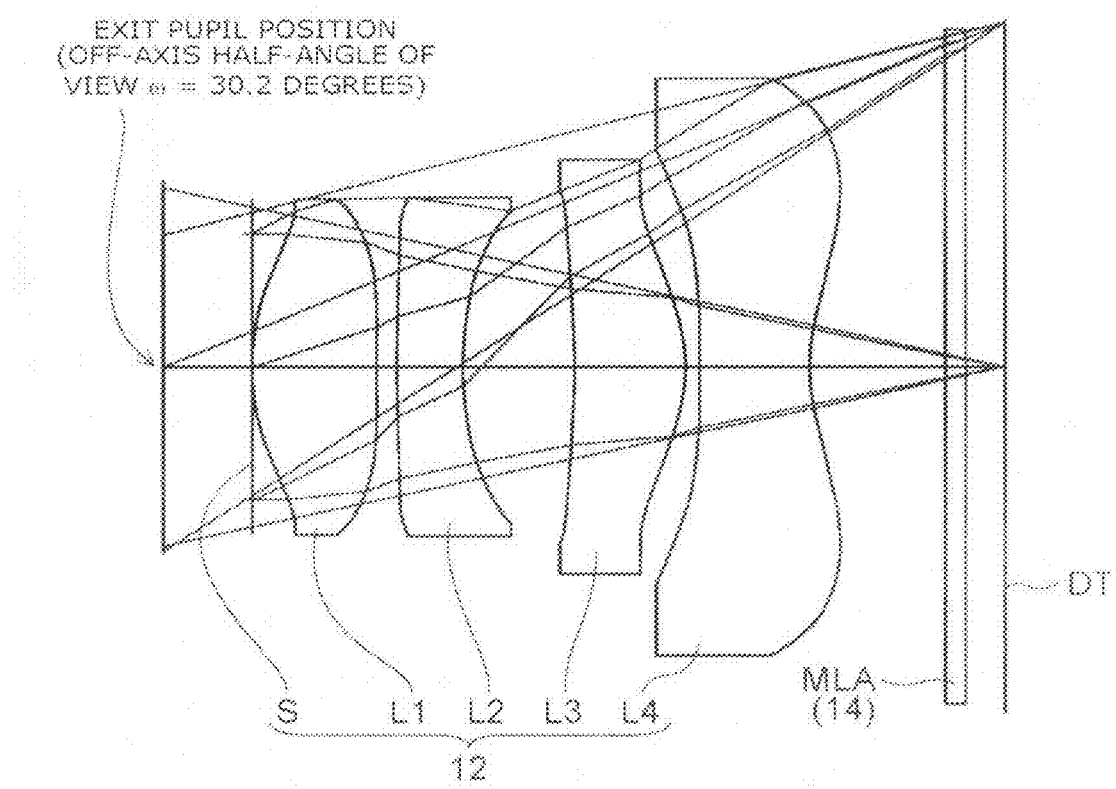
FIG. 38 illustrates the exit pupil position of the imaging lens according to the fourth example.

FIG. 38 illustrates the exit pupil position of the imaging lens according to the fourth example.

Figure 39:
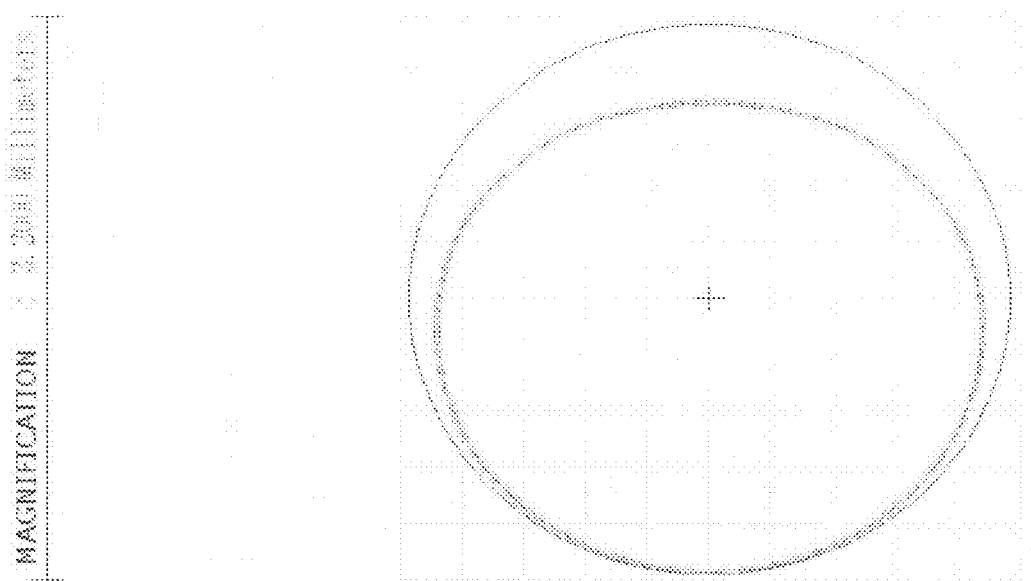
FIG. 39 illustrates the configurations and numerical values of the exit pupils of the imaging lens according to the fourth example.

FIG. 39 illustrates the configurations and numerical values of the exit pupils of the imaging lens according to the fourth example.

Table 5 recited below shows the curvature radius Ri, the spacing Di, the refractive index nd, and the dispersion value vd for the surfaces of the imaging optical system 12 according to the fourth example.

TABLE 5

| SURFACE | Ri | Di | nd | vd |
|---|---|---|---|---|
| \multicolumn{5}{c}{f 4.93 mm F-NUMBER = 2.2 ω = 30.2°} | | | | |
| APERTURE STOP(s) | INFINITY | 0.00000 | | |
| 1 | 2.14541 | 0.94800 | 1.52305 | 65.93 |
| 2 | 40.71011 | 0.16516 | | |
| 3 | 5.71921 | 0.51322 | 1.63193 | 23.33 |
| 4 | 3.12022 | 0.85012 | | |
| 5 | −5.54972 | 0.84700 | 1.54414 | 55.99 |
| 6 | −1.62274 | 0.11058 | | |
| 7 | 29.74853 | 0.85000 | 1.53438 | 56.20 |
| 8 | 1.67135 | 1.03763 | | |
| 9 (MLA) | INFINITY | 0.15000 | 1.45844 | 67.83 |
| 10 | INFINITY | 0.30000 | | |

The aspherical surface data of the imaging optical system 12 according to the fourth example is as follows.
First Surface:
K=−2.06623255
a4=0.01822393
a6=−0.01085354
a8=0.00188490
a10=−0.00245483
a12=−0.00043959
a14=−0.00028741
Second Surface:
K=−1537.779839
a4=−0.06286657
a6=−0.01759363
a8=0.01556027
a10=−0.00401635
a12=−0.00057226
Third Surface:
K=2.92759964
a4=−0.06914205
a6=0.01014577
a8=−0.03502288
a10=0.05620738
a12=−0.02630101
a14=0.00412961
Fourth Surface:
K=−0.33630643
a4=0.0200859
a6=0.00584415
a8=−0.00923723
a10=0.00604630
a12=0.00729959
a14=−0.00342400
Fifth Surface:
K=11.92735031
a4=0.05949131
a6=−0.01958334
a8=0.01424430
a10=−0.00572067
a12=0.00031796
a14=0.00023355
Sixth Surface:
K=−5.5030911
a4=−0.02034009
a6=0.01956502
a8=0.00171775
a10=−0.00139833
a12=−0.00002347
a14=0.00002889
Seventh Surface:
K=162.71849784
a4=−0.07399224
a6=0.00838768
a8=0.00423250
a10=−0.00155044
a12=0.00019142
a14=−0.00000722
Eighth Surface:
K=−6.89961928
a4=−0.05099172
a6=0.01323246
a8=−0.00322848
a10=0.00041344
a12=−0.00002138
a14=−6.2154×10⁻⁷
f1/f=0.87
|f2|/f=2.39
TL/f=1.17
(R7+R8)/(R7−RB)=1.826
D34/f=0.022
hc(G3R)/(D1+D2+D3+D4+D5)=0.433
ρ=0.0597
ν1−ν2=65.93−23.33=42.6

CRA (incident angle of chief ray onto image plane) (angle of view of 31 degrees)=24.2°
|R4/f|=0.632
|R2/R1|=18.975
|R6/f|=0.329
|R4/R3|=0.546

As described below, Condition Formulas (1) to (13) recited above are satisfied in the example. As recited above, it can be seen that the imaging optical system 12 according to the fourth example has good performance.

Fifth Example

Figure 40:
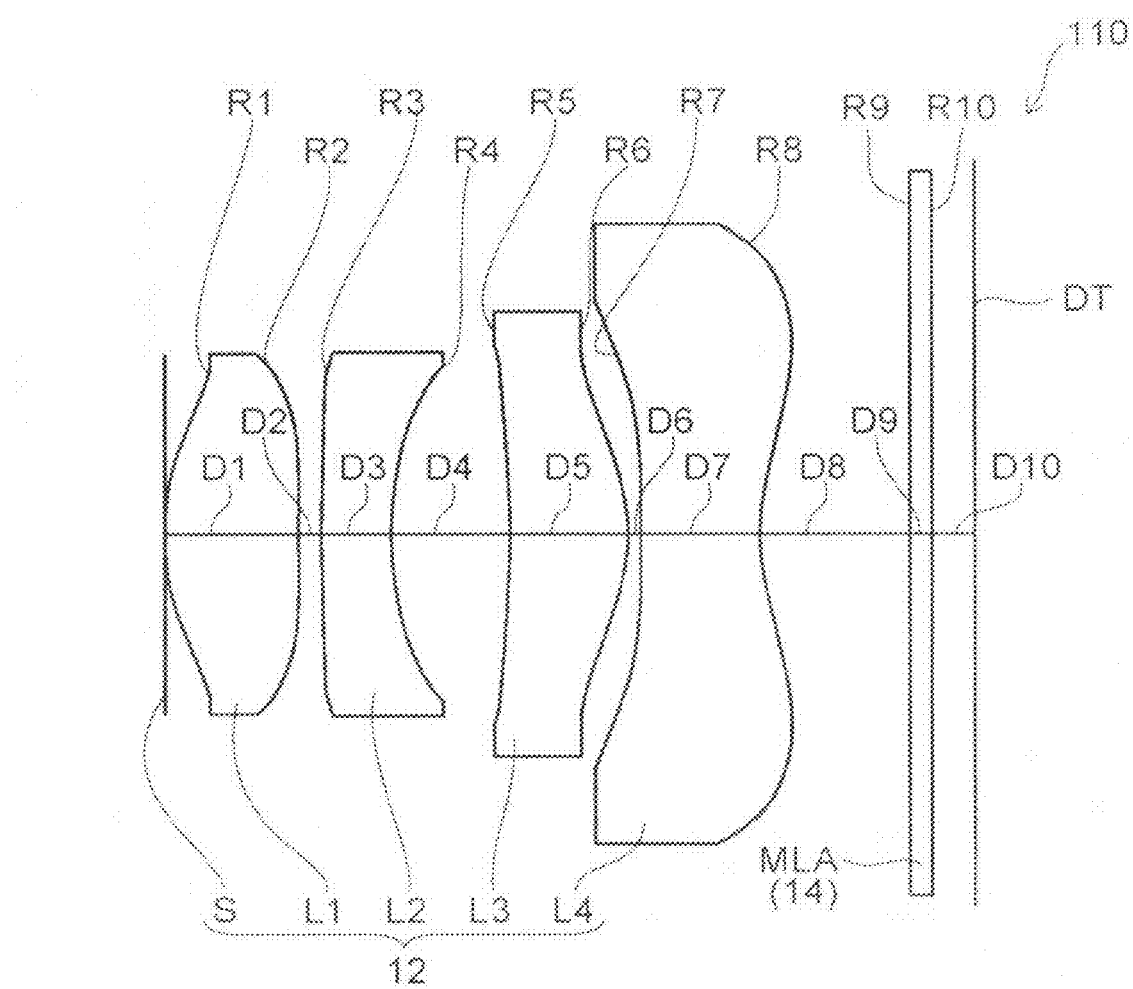
FIG. 40 illustrates the configuration of an imaging lens according to a fifth example.

FIG. 40 illustrates the configuration of an imaging lens according to a fifth example.

Figure 41:
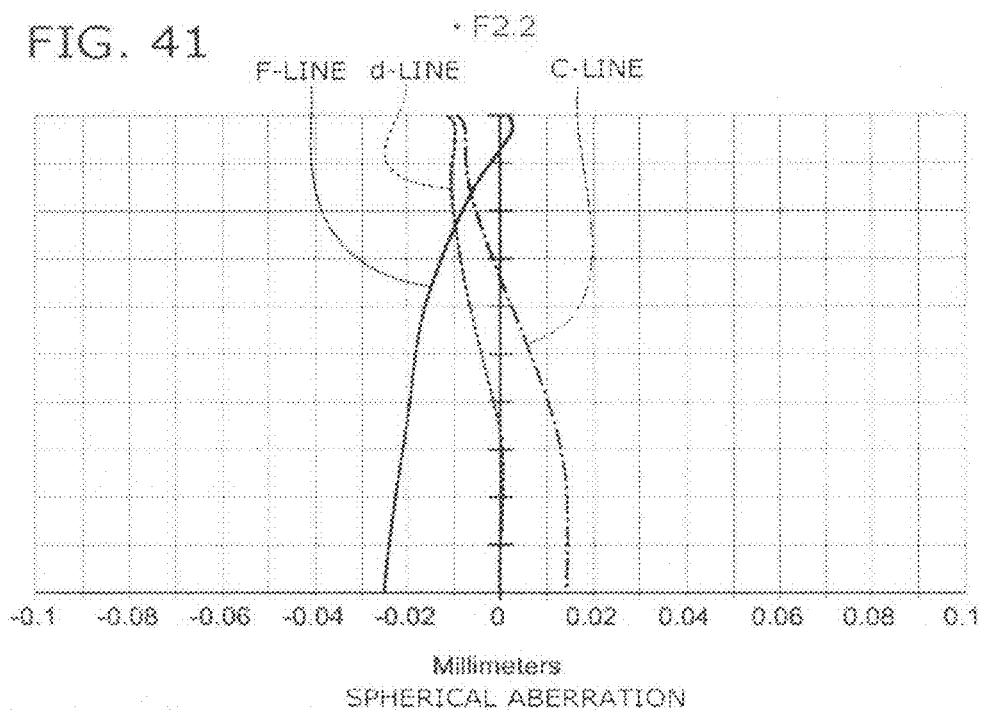
FIG. 41 is various aberration diagrams of the imaging lens according to the fifth example.
Figure 42:
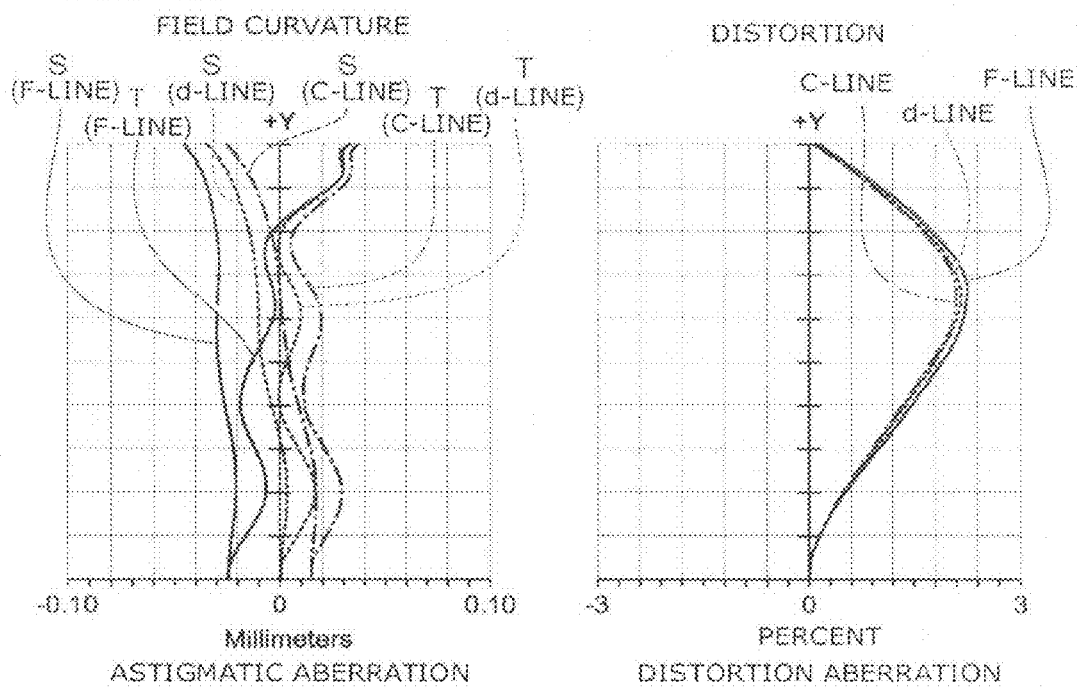
FIG. 42 is various aberration diagrams of the imaging lens according to the fifth example.

FIG. 41 and FIG. 42 are various aberration diagrams of the imaging lens according to the fifth example.

Figure 43:
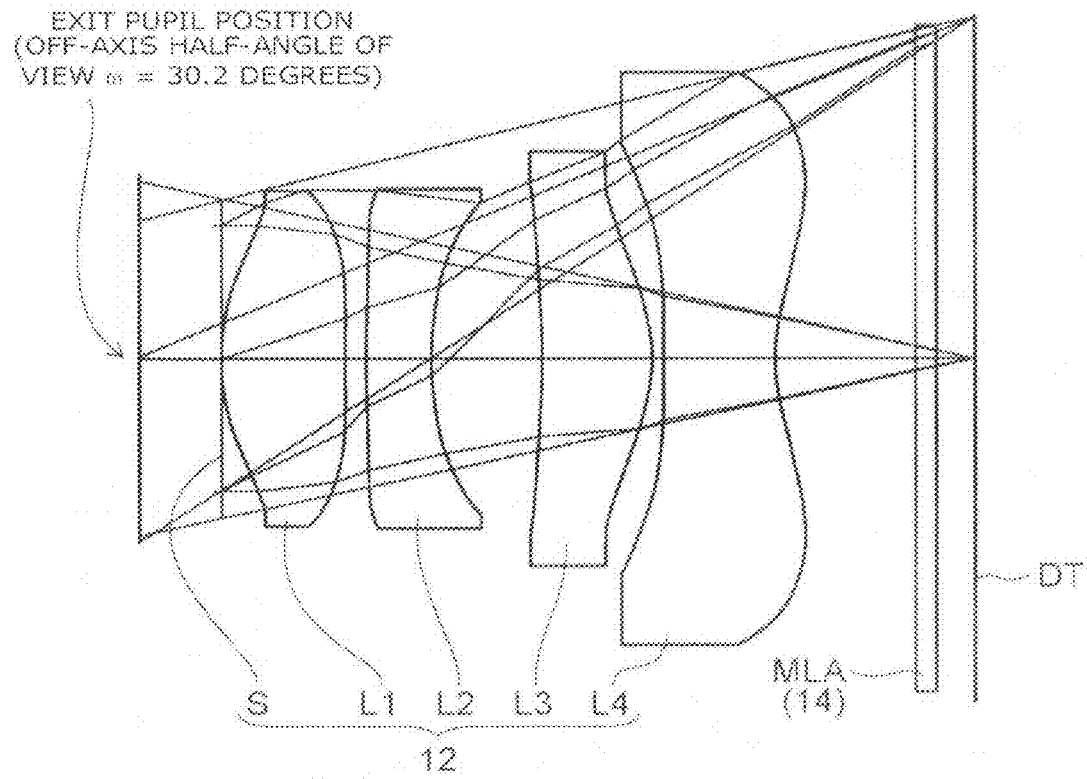
FIG. 43 illustrates the exit pupil position of the imaging lens according to the fifth example.

FIG. 43 illustrates the exit pupil position of the imaging lens according to the fifth example.

Figure 44:
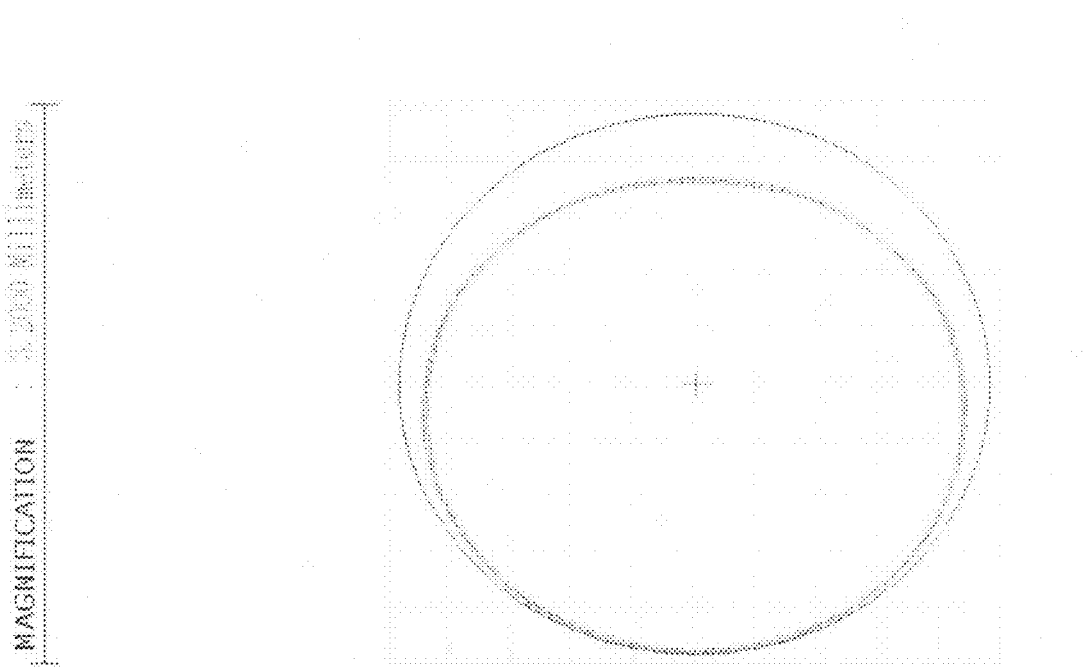
FIG. 44 illustrates the configurations and numerical values of the exit pupils of the imaging lens according to the fifth example.

FIG. 44 illustrates the configurations and numerical values of the exit pupils of the imaging lens according to the fifth example.

Table 6 recited below shows the curvature radius Ri, the spacing Di, the refractive index nd, and the dispersion value vd for the surfaces of the imaging optical system 12 according to the fifth example.

TABLE 6

| SURFACE | Ri | Di | nd | vd |
|---|---|---|---|---|
| f 4.92 mm F-NUMBER = 2.2 ω = 30.2° | | | | |
| APERTURE STOP(s) | INFINITY | 0.00000 | | |
| 1 | 2.14090 | 0.94566 | 1.52305 | 65.93 |
| 2 | 40.04468 | 0.16293 | | |
| 3 | 5.70095 | 0.51949 | 1.63193 | 23.33 |
| 4 | 3.04405 | 0.83755 | | |
| 5 | −5.55119 | 0.85000 | 1.54414 | 55.99 |
| 6 | −1.54678 | 0.08162 | | |
| 7 | 30.50617 | 0.85000 | 1.53438 | 56.20 |
| 8 | 1.61182 | 1.08006 | | |
| 9 (MLA) | INFINITY | 0.15000 | 1.45844 | 67.83 |
| 10 | INFINITY | 0.30000 | | |

The aspherical surface data of the imaging optical system 12 according to the fifth example is as follows.
First Surface:
K=−2.04627602
a4=0.01838968
a6=−0.01078306
a8=0.00192696
a10=−0.00243825
a12=−0.00043368
a14=−0.00028246
Second Surface:
K=−1192.242224
a4=−0.06264369
a6=−0.01746845
a8=0.01563480
a10=−0.00399775
a12=−0.00058435
Third Surface:
K=2.85594182
a4=−0.0692129
a6=0.01014782
a8=−0.03499995
a10=0.05621884
a12=−0.02629550
a14=0.00412139
Fourth Surface:
K=−0.35238878
a4=0.0193694
a6=0.00573904
a8=−0.00923739
a10=0.00605303
a12=0.00729970
a14=−0.00342149
Fifth Surface:
K=11.94301714
a4=0.06020103
a6=−0.01953985
a8=0.01418102
a10=−0.00574968
a12=0.00031443
a14=0.00023843
Sixth Surface:
K=−5.32922193
a4=−0.02118297
a6=0.01953100
a8=0.00172252
a10=−0.00139787
a12=−0.00002394
a14=0.00002851
Seventh Surface:
K=174.8609872
a4=−0.07330453
a6=0.00833323
a8=0.00422176
a10=−0.00155095
a12=0.00019155
a14=−0.00000715
Eighth Surface:
K=−7.1454874
a4=−0.05119959
a6=0.01323256
a8=−0.00322993
a10=0.00041346
a12=−0.00002141
a14=−6.3325×10$^{-7}$
f1/f=0.871
|f2|/f=2.27
TL/f=1.17
(R7+R8)/(R7−R8)=1.773
D34/f=0.017
hc(G3R)/(D1+D2+D3+D4+D5)=0.432
ρ=0.044
ν1−ν2=65.93−23.33=42.6
CRA (incident angle of chief ray onto image plane) (angle of view of 31 degrees)=24.1°
|R4/f|=0.62
|R2/R1|=18.704
|R6/f|=0.314
R4/R3=0.534

As described below, Condition Formulas (1) to (13) recited above are satisfied in the example. As recited above, it can be seen that the imaging optical system 12 according to the fifth example has good performance.

Sixth Example

Figure 45:
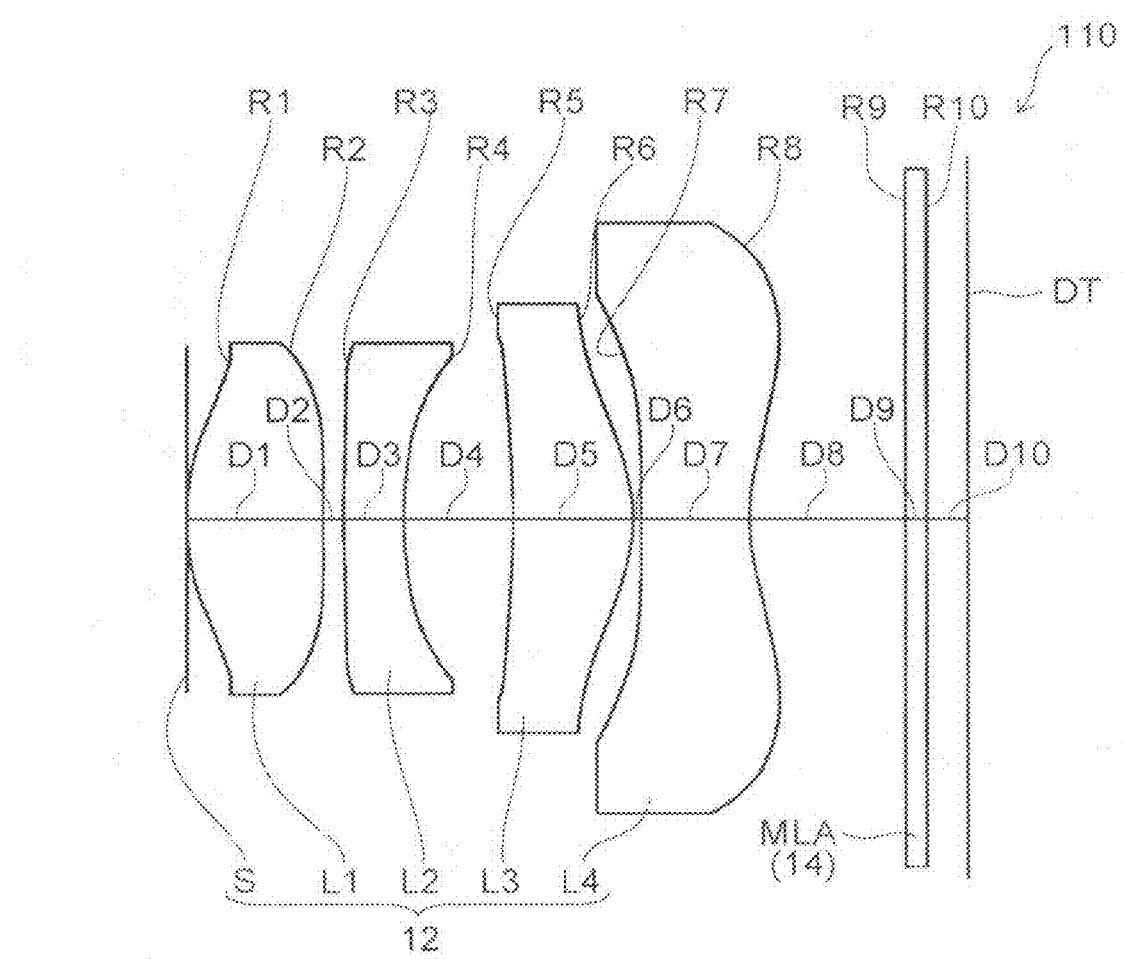
FIG. 45 illustrates the configuration of an imaging lens according to a sixth example.

FIG. 45 illustrates the configuration of an imaging lens according to a sixth example.

Figure 46:
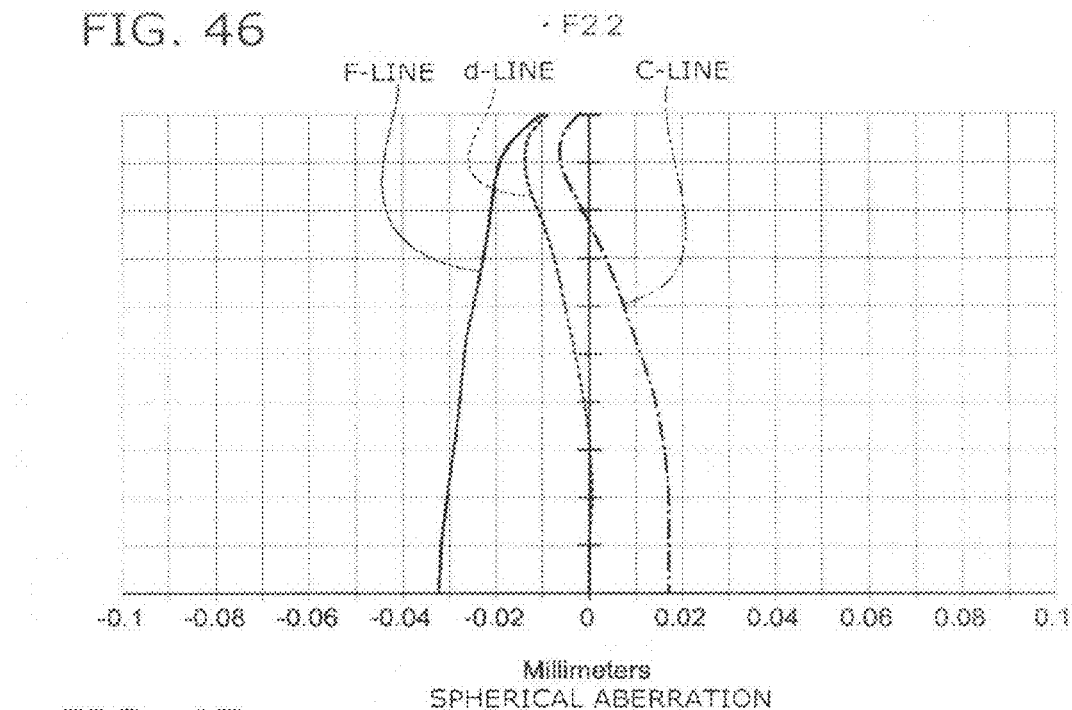
FIG. 46 is various aberration diagrams of the imaging lens according to the sixth example.
Figure 47:
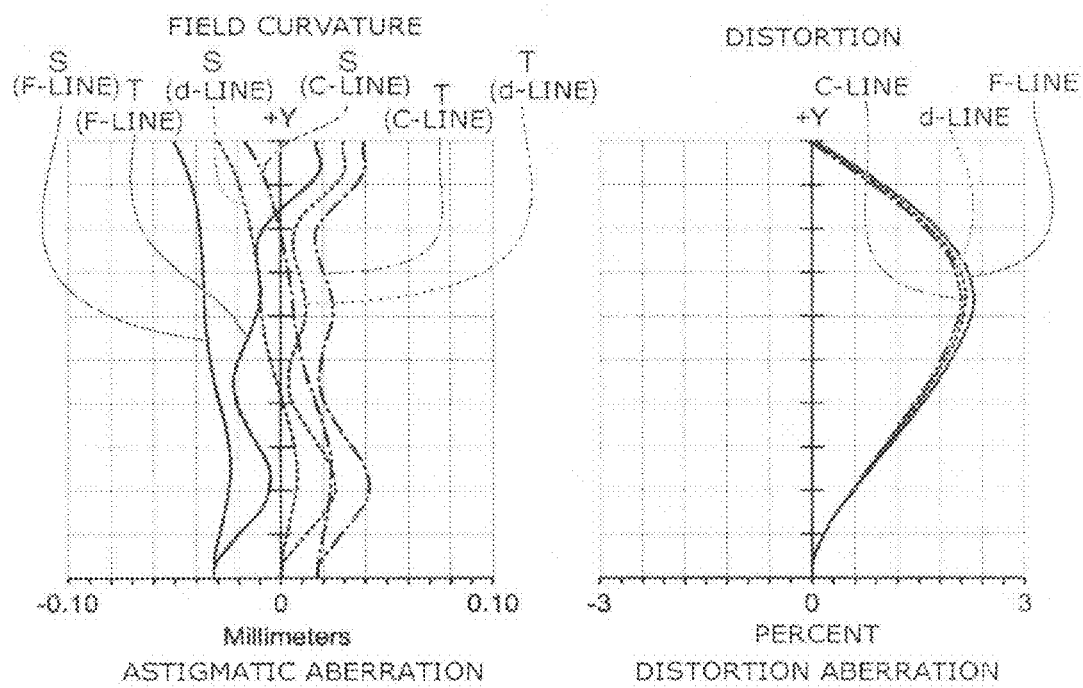
FIG. 47 is various aberration diagrams of the imaging lens according to the sixth example.

FIG. 46 and FIG. 47 are various aberration diagrams of the imaging lens according to the sixth example.

Figure 48:
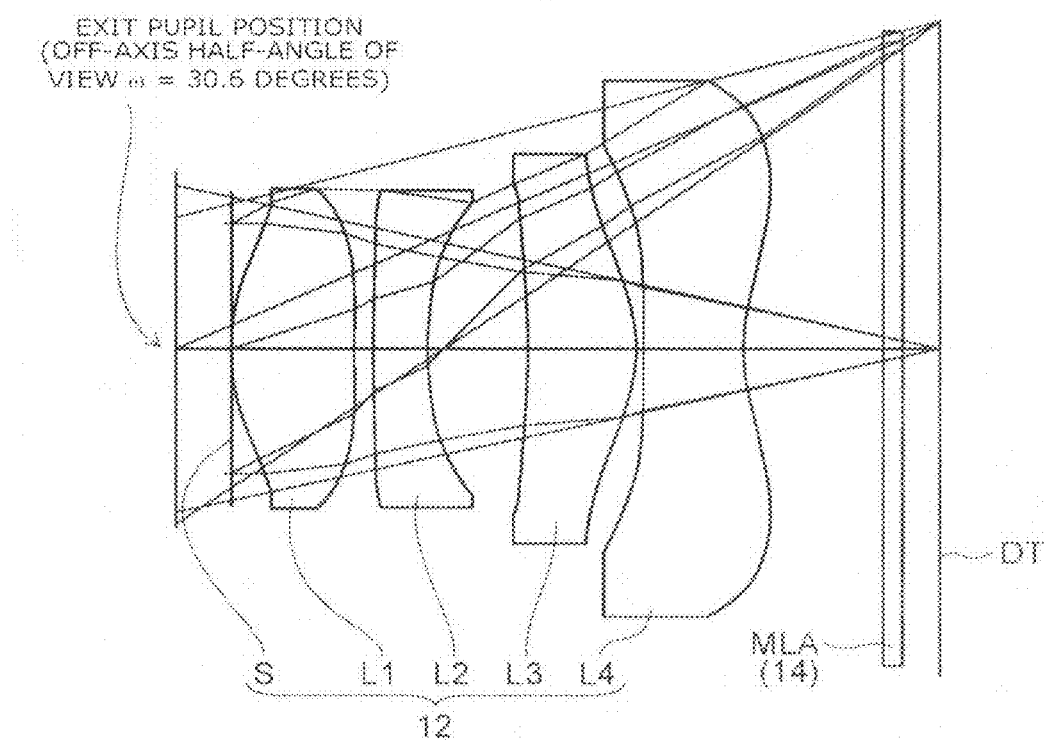
FIG. 48 illustrates the exit pupil position of the imaging lens according to the sixth example.

FIG. 48 illustrates the exit pupil position of the imaging lens according to the sixth example.

Figure 49:
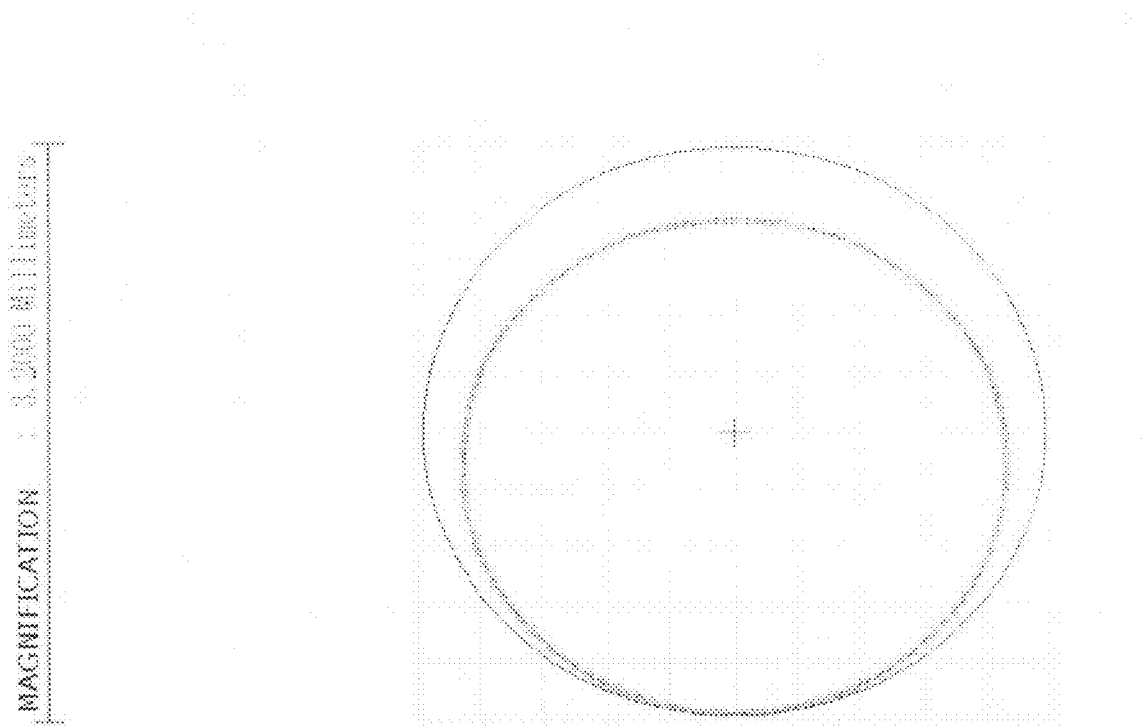
FIG. 49 illustrates the configurations and numerical values of the exit pupils of the imaging lens according to the sixth example.

FIG. 49 illustrates the configurations and numerical values of the exit pupils of the imaging lens according to the sixth example.

Table 7 recited below shows the curvature radius Ri, the spacing Di, the refractive index nd, and the dispersion value vd for the surfaces of the imaging optical system 12 according to the sixth example.

TABLE 7

| f 4.86 mm F-NUMBER = 2.2 ω = 30.6° | | | | |
|---|---|---|---|---|
| SURFACE | Ri | Di | nd | vd |
| APERTURE STOP(s) | INFINITY | 0.00000 | | |
| 1 | 2.18594 | 0.98245 | 1.54414 | 55.98 |
| 2 | 62.07713 | 0.15503 | | |
| 3 | 6.14648 | 0.44849 | 1.63193 | 23.33 |
| 4 | 3.05749 | 0.80591 | | |
| 5 | −5.51893 | 0.88207 | 1.54413 | 55.98 |
| 6 | −1.47215 | 0.06407 | | |
| 7 | 23.17694 | 0.79186 | 1.53438 | 56.20 |
| 8 | 1.53405 | 1.15637 | | |
| 9 (MLA) | INFINITY | 0.15000 | 1.45844 | 67.83 |
| 10 | INFINITY | 0.30000 | | |

The aspherical surface data of the imaging optical system 12 according to the sixth example is as follows.
First Surface:
K=−2.07392069
a4=0.01787130
a6=−0.01135135
a8=0.00202324
a10=−0.00227321
a12=−0.00041114
a14=−0.00038203
Second Surface:
K=−1732.25993
a4=−0.06294481
a6=−0.01786001
a8=0.01531758
a10=−0.00404588
a12=−0.00044407
Third Surface:
K=3.12156320
a4=−0.06908884
a6=0.01053542
a8=−0.03486516
a10=0.05625665
a12=−0.02629561
a14=0.00412059
Fourth Surface:
K=−0.06758017
a4=0.00353160
a6=0.00617328
a8=−0.00910029
a10=0.00606197
a12=0.00725369
a14=−0.00344835
Fifth Surface:
K=12.48362898
a4=0.06149396
a6=−0.01933284
a8=0.01415655
a10=−0.00579223
a12=0.00032084
a14=0.00025107
Sixth Surface:
K=−5.43637748
a4=−0.02276699
a6=0.01935475
a8=0.00171344
a10=−0.00140564
a12=−0.00002822
a14=0.00002629
Seventh Surface:
K=102.12923568
a4=−0.07425301
a6=0.00786627
a8=0.00414421
a10=−0.00155612
a12=0.00019134
a14=−0.00000650
Eighth Surface:
K=−7.31317716
a4=−0.05236823
a6=0.01328854
a8=−0.00322200
a10=0.00041276
a12=−0.00002174
a14=−0.00000070
f1/f=0.852
|f2|/f=2.099
TL/f=1.18
(R7+R8)/(R7−R8)=1.727
D34/f=0.013
hc(G3R)/(D1+D2+D3+D4+D5)=0.432
ρ=0.0062
ν1−ν2=55.98−23.33=32.65
CRA (incident angle of chief ray onto image plane) (angle of view of 31 degrees)=24.9°
|R4/f|=0.629
|R2/R1|=28.4
|R6/f|=0.303
|R4/R3|=0.497

As described below, Condition Formulas (1) to (13) recited above are satisfied in the example. As recited above, it can be seen that the imaging optical system 12 according to the sixth example has good performance.

Seventh Example

Figure 50:
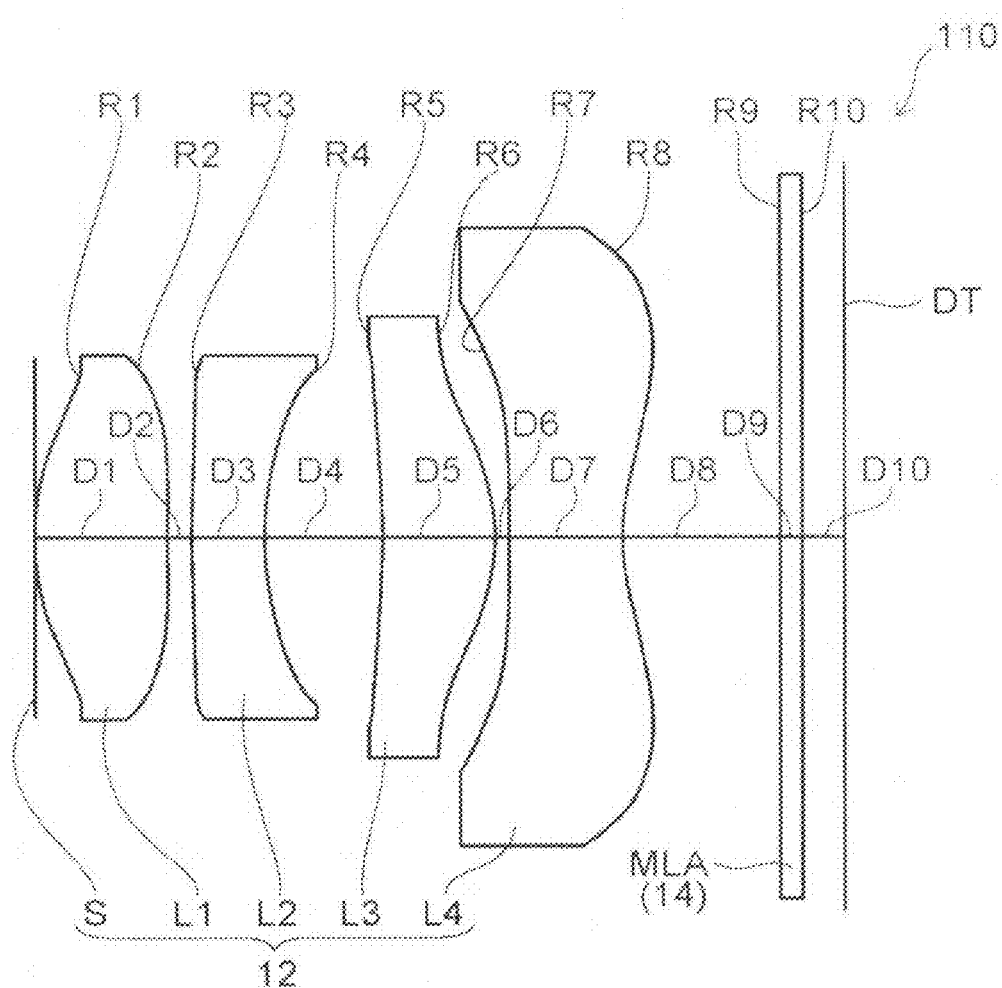
FIG. 50 illustrates the configuration of an imaging lens according to a seventh example.

FIG. 50 illustrates the configuration of an imaging lens according to a seventh example.

Figure 51:
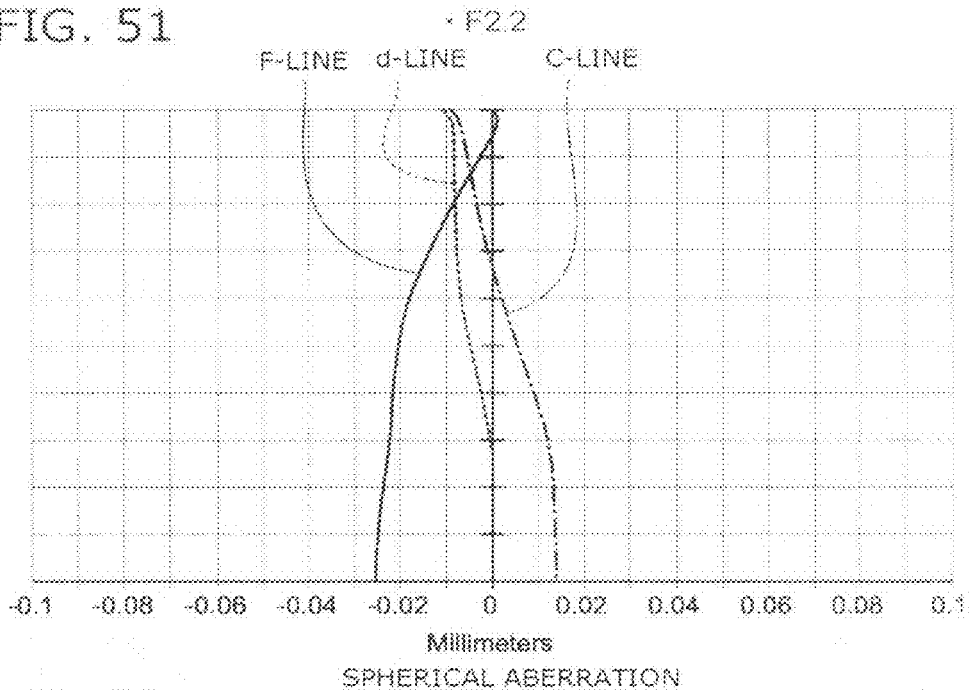
FIG. 51 is various aberration diagrams of the imaging lens according to the seventh example.
Figure 52:
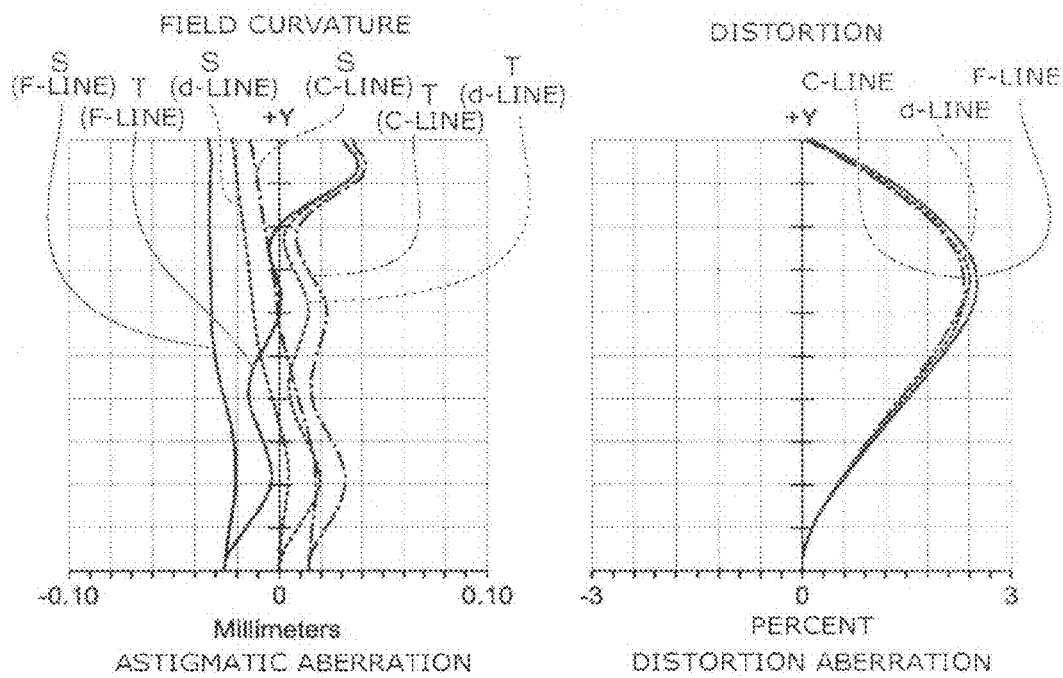
FIG. 52 is various aberration diagrams of the imaging lens according to the seventh example.

FIG. 51 and FIG. 52 are various aberration diagrams of the imaging lens according to the seventh example.

Figure 53:
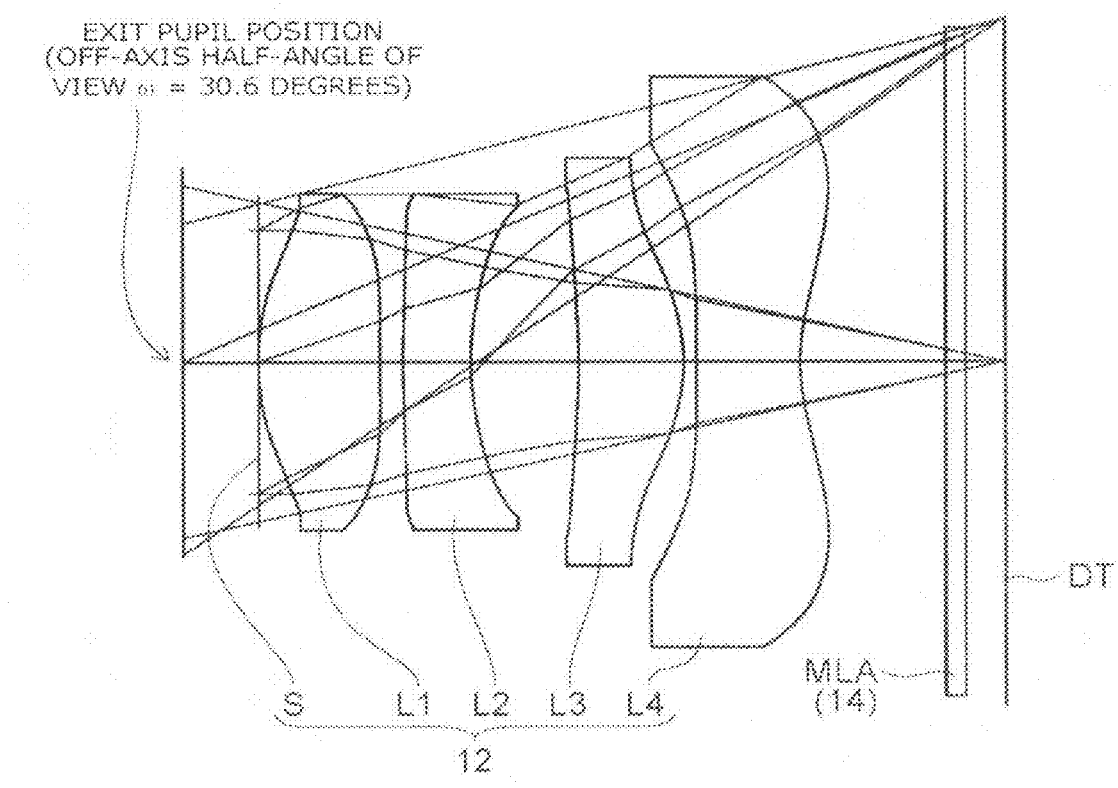
FIG. 53 illustrates the exit pupil position of the imaging lens according to the seventh example.

FIG. 53 illustrates the exit pupil position of the imaging lens according to the seventh example.

Figure 54:
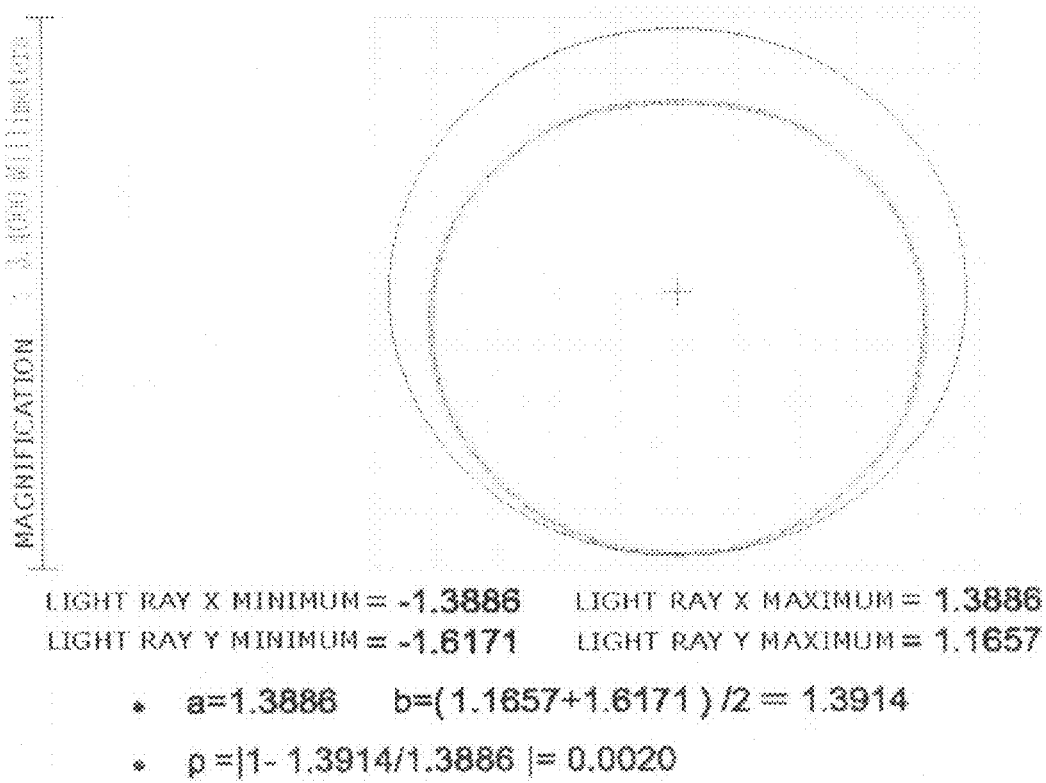
FIG. 54 illustrates the configurations and numerical values of the exit pupils of the imaging lens according to the seventh example.

FIG. 54 illustrates the configurations and numerical values of the exit pupils of the imaging lens according to the seventh example.

Table 8 recited below shows the curvature radius Ri, the spacing Di, the refractive index nd, and the dispersion value vd for the surfaces of the imaging optical system 12 according to the seventh example.

TABLE 8

| f 4.86 mm F-NUMBER = 2.2 ω = 30.6° | | | | |
|---|---|---|---|---|
| SURFACE | Ri | Di | nd | vd |
| APERTURE STOP(s) | INFINITY | 0.00000 | | |
| 1 | 2.12423 | 0.93458 | 1.51990 | 64.20 |
| 2 | 37.39501 | 0.16594 | | |
| 3 | 5.88465 | 0.50792 | 1.63790 | 23.20 |
| 4 | 3.05524 | 0.83653 | | |
| 5 | −5.55943 | 0.80042 | 1.54413 | 55.98 |
| 6 | −1.48018 | 0.08598 | | |

TABLE 8-continued

| f 4.86 mm F-NUMBER = 2.2 ω = 30.6° | | | | |
|---|---|---|---|---|
| SURFACE | Ri | Di | nd | vd |
| 7 | 21.83976 | 0.80006 | 1.53438 | 56.20 |
| 8 | 1.55264 | 1.13420 | | |
| 9 (MLA) | INFINITY | 0.15000 | 1.45844 | 67.83 |
| 10 | INFINITY | 0.30000 | | |

The aspherical surface data of the imaging optical system 12 according to the seventh example is as follows.
First Surface:
K=−2.01072644
a4=0.01838989
a6=−0.01120705
a8=0.00185685
a10=−0.00242617
a12=−0.00046308
a14=−0.00034961
Second Surface:
K=−1305.96793
a4=−0.06279411
a6=−0.01763769
a8=0.01544627
a10=−0.00409325
a12=−0.00059032
Third Surface:
K=3.03239511
a4=−0.06908079
a6=0.01037376
a8=−0.03496048
a10=0.05621924
a12=−0.02629639
a14=0.00412339
Fourth Surface:
K=−0.35011579
a4=0.00205137
a6=0.00550642
a8=−0.00917968
a10=0.00604146
a12=0.00723858
a14=−0.00346392
Fifth Surface:
K=12.18532886
a4=0.06123213
a6=−0.01934789
a8=0.01421314
a10=−0.00576620
a12=0.00031621
a14=0.00023828
Sixth Surface:
K=−5.21074495
a4=−0.02290518
a6=0.01943752
a8=0.00171549
a10=−0.00140683
a12=−0.00002655
a14=0.00002786
Seventh Surface:
K=81.83620738
a4=−0.07469087
a6=0.00777992
a8=0.00416899
a10=−0.00154534
a12=0.00019355
a14=−0.00000648
Eighth Surface:
K=−7.1805299
a4=−0.05132788
a6=0.01330203
a8=−0.00322747
a10=0.00041323
a12=−0.00002165
a14=−0.00000068
f1/f=0.884
|f2|/f=2.205
TL/f=1.177
(R7+R8)/(R7−R8)=1.726
D34/f=0.018
hc(G3R)/(D1+D2+D3+D4+D5)=0.437
ρ=0.002
ν1−ν2=64.2−23.2=41.0
CRA (incident angle of chief ray onto image plane) (angle of view of 31 degrees)=24.5°
|R4/f|=0.629
|R2/R1|=17.604
|R6/f|=0.305
|R4/R3|=0.519

As described below, Condition Formulas (1) to (13) recited above are satisfied in the example. As recited above, it can be seen that the imaging optical system 12 according to the seventh example has good performance.

Eighth Example

Figure 55:
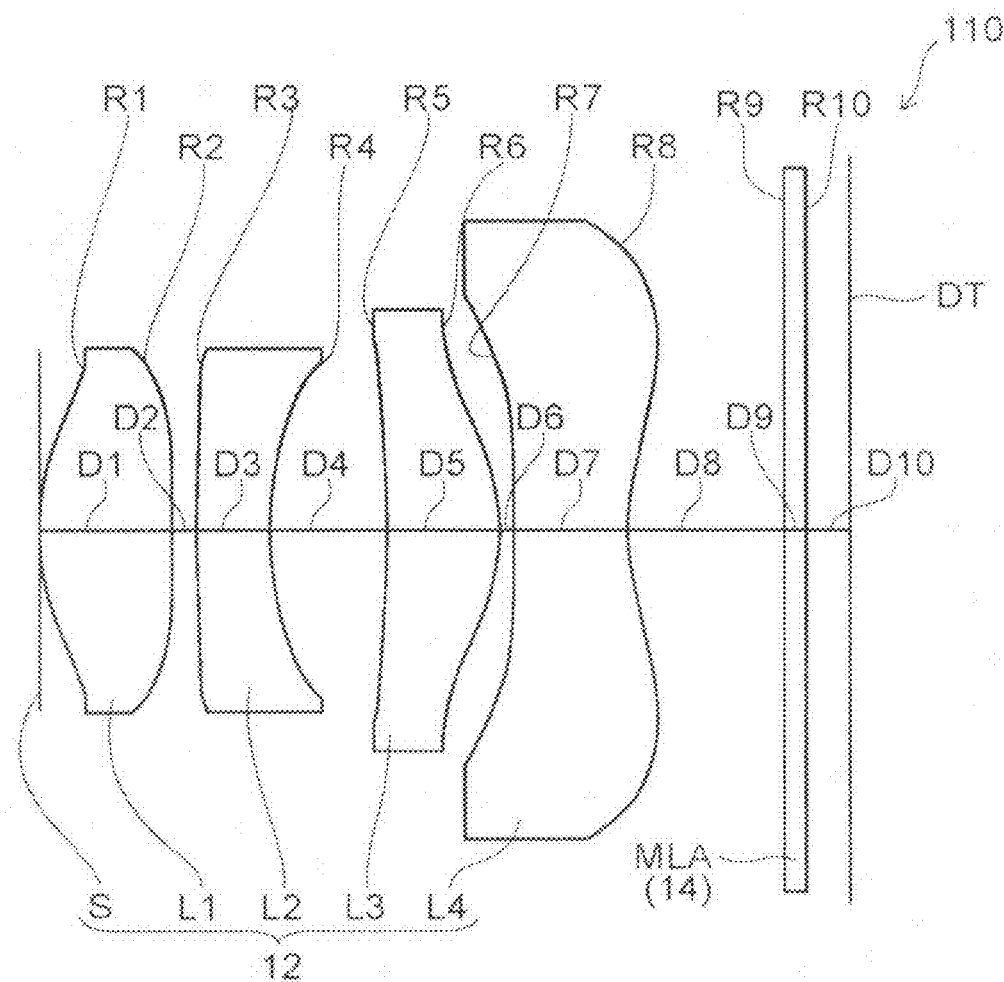
FIG. 55 illustrates the configuration of an imaging lens according to an eighth example.

FIG. 55 illustrates the configuration of an imaging lens according to an eighth example.

Figure 56:
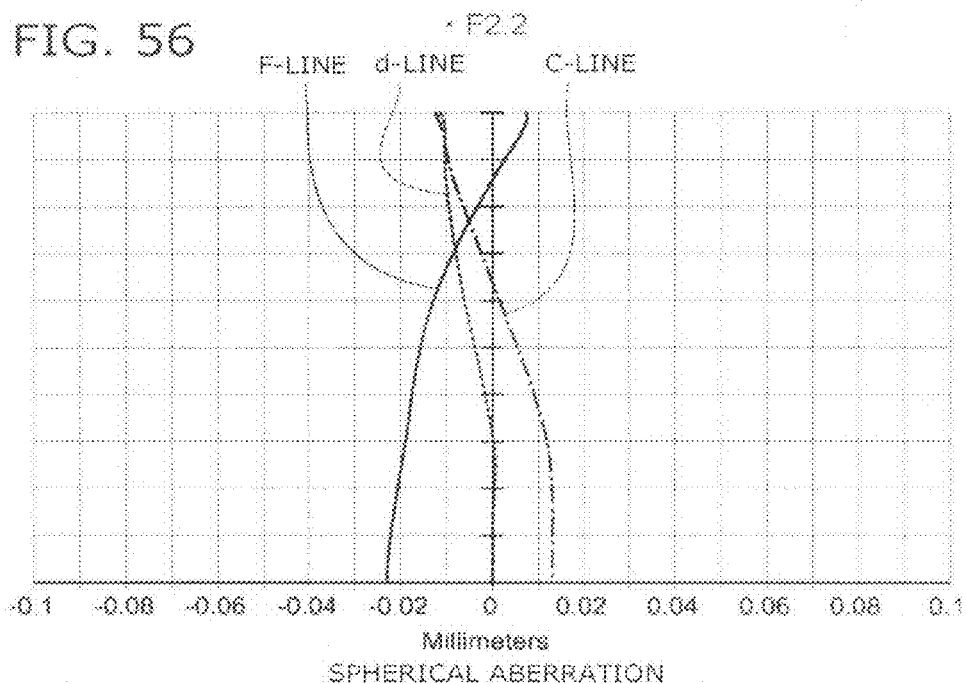
FIG. 56 is various aberration diagrams of the imaging lens according to the eighth example.
Figure 57:
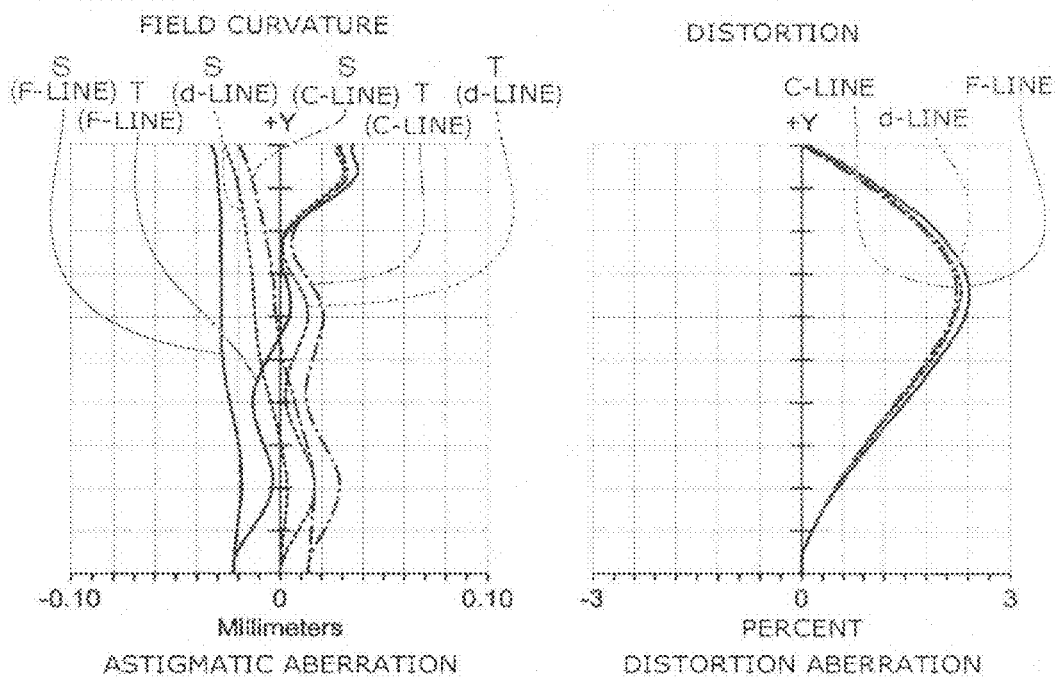
FIG. 57 is various aberration diagrams of the imaging lens according to the eighth example.

FIG. 56 and FIG. 57 are various aberration diagrams of the imaging lens according to the eighth example.

Figure 58:
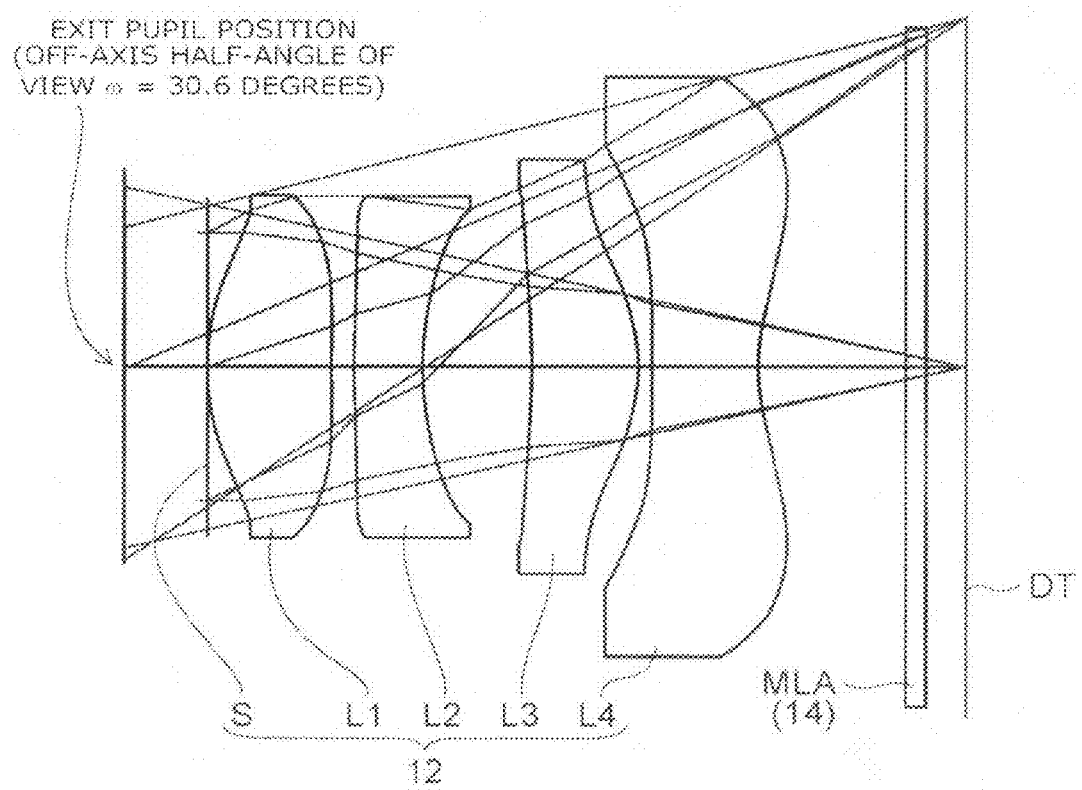
FIG. 58 illustrates the exit pupil position of the imaging lens according to the eighth example.

FIG. 58 illustrates the exit pupil position of the imaging lens according to the eighth example.

Figure 59:
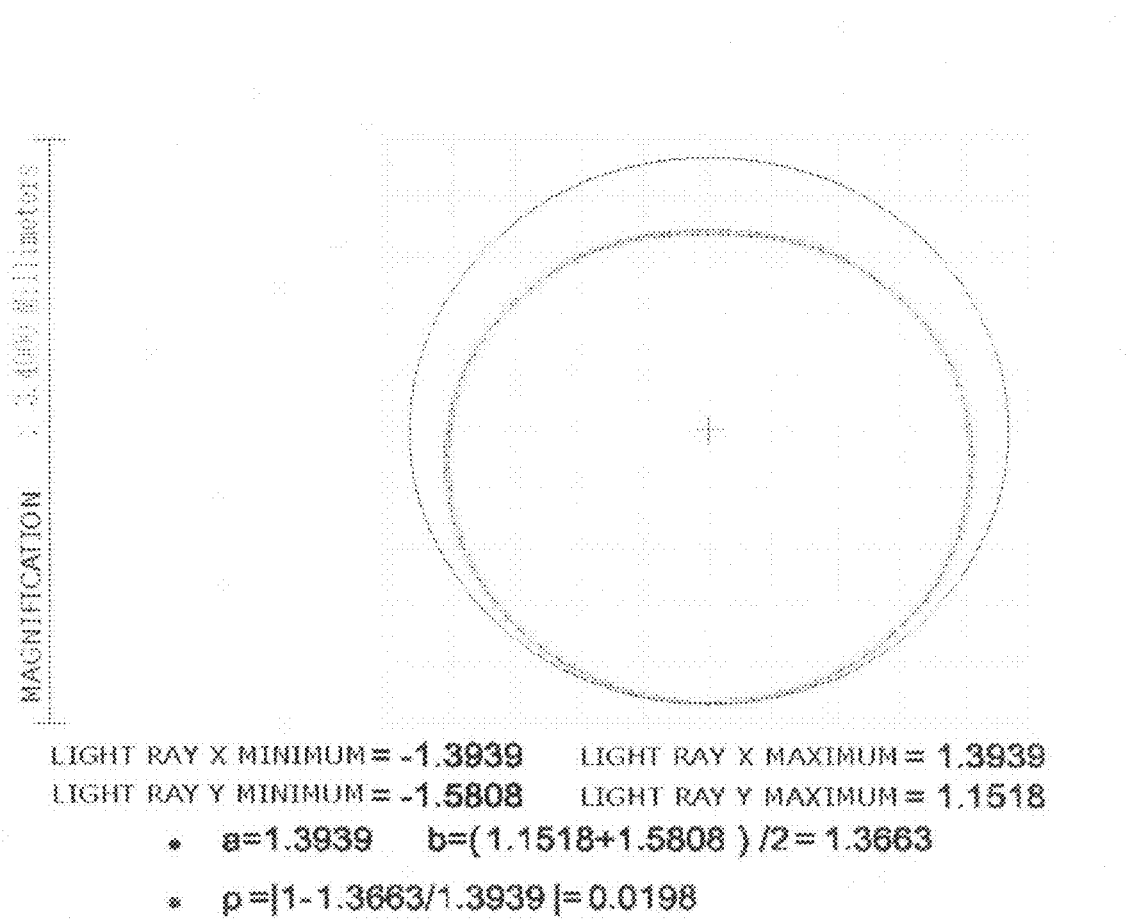
FIG. 59 illustrates the configurations and numerical values of the exit pupils of the imaging lens according to the eighth example.

FIG. 59 illustrates the configurations and numerical values of the exit pupils of the imaging lens according to the eighth example.

Table 9 recited below shows the curvature radius Ri, the spacing Di, the refractive index nd, and the dispersion value vd for the surfaces of the imaging optical system 12 according to the eighth example.

TABLE 9

| f 4.86 mm F-NUMBER = 2.2 ω = 30.6° | | | | |
|---|---|---|---|---|
| SURFACE | Ri | Di | nd | vd |
| APERTURE STOP(s) | INFINITY | 0.00000 | | |
| 1 | 2.12245 | 0.93396 | 1.51990 | 64.20 |
| 2 | 36.06678 | 0.16854 | | |
| 3 | 5.79982 | 0.52564 | 1.65055 | 21.53 |
| 4 | 3.04856 | 0.82517 | | |
| 5 | −5.56787 | 0.80000 | 1.54413 | 55.98 |
| 6 | −1.48105 | 0.09316 | | |
| 7 | 23.66683 | 0.80000 | 1.53438 | 56.20 |
| 8 | 1.55398 | 1.1342 | | |
| 9 (MLA) | INFINITY | 0.15000 | 1.45844 | 67.83 |
| 10 | INFINITY | 0.30000 | | |

The aspherical surface data of the imaging optical system 12 according to the eighth example is as follows.
First Surface:
K=−2.01449298
a4=0.01843795
a6=−0.01105796
a8=0.00186031
a10=−0.00245144 a12=−0.00046593
a14=−0.00034403
Second Surface:
K=−1147.538435
a4=−0.06283036
a6=−0.01765873
a8=0.01550469
a10=−0.00405598
a12=−0.00060426
Third Surface:
K=3.14844805
a4=−0.06897041
a6=0.01039228
a8=−0.03498819
a10=0.05620625
a12=−0.02628939
a14=0.00412580
Fourth Surface:
K=−0.44070840
a4=0.00157574
a6=0.00543905
a8=−0.00910431
a10=0.00611069
a12=0.00728020
a14=−0.00344276
Fifth Surface:
K=12.09442763
a4=0.06095991
a6=−0.01939214
a8=0.01420609
a10=−0.00576103
a12=0.00030948
a14=0.00023678
Sixth Surface:
K=−5.15217881
a4=−0.02285392
a6=0.01946222
a8=0.00171757
a10=−0.00140762
a12=−0.00002669
a14=0.00002854
Seventh Surface:
K=89.41103384
a4=−0.07507780
a6=0.00774836
a8=0.00418726
a10=−0.00154118
a12=0.00019432
a14=−0.00000641
Eighth Surface:
K=−7.14609635
a4=−0.05186921
a6=0.01331282
a8=−0.00322927
a10=0.00041286
a12=−0.00002153
a14=−0.00000069
f1/f=0.885
|f2|/f=2.20
TL/f=1.176
(R7+R8)/(R7−R8)=1.725
D34/f=0.019
hc(G3R)/(D1+D2+D3+D4+D5)=0.436
ρ=0.0198
ν1−ν2=64.2−21.53=42.67

CRA (incident angle of chief ray onto image plane) (angle of view of 31 degrees)=24.4°
|R4/f|=0.628
|R2/R1|=16.993
|R6/f|=0.305
|R4/R3|=0.526

As described below, Condition Formulas (1) to (13) recited above are satisfied in the example. As recited above, it can be seen that the imaging optical system 12 according to the eighth example has good performance.

Ninth Example

Figure 60:
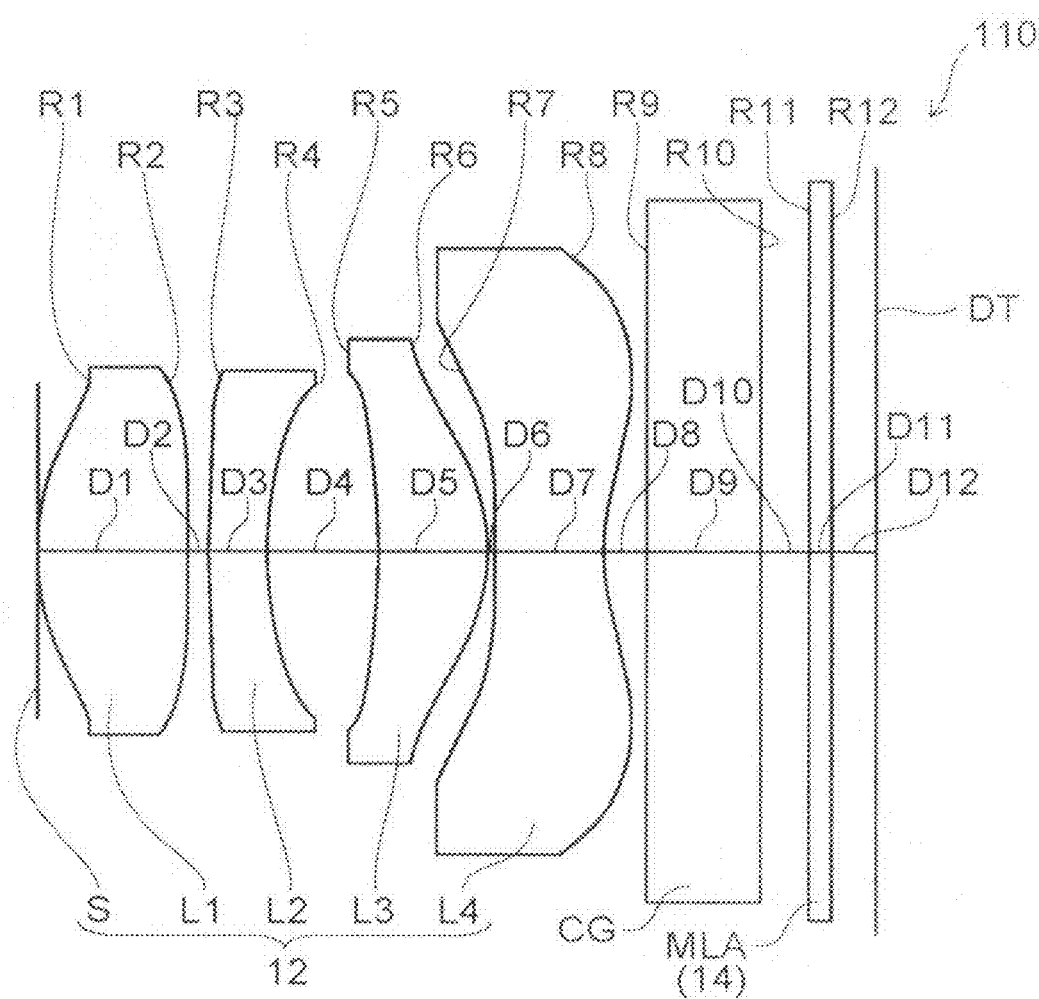
FIG. 60 illustrates the configuration of an imaging lens according to a ninth example.

FIG. 60 illustrates the configuration of an imaging lens according to a ninth example.

Figure 61:
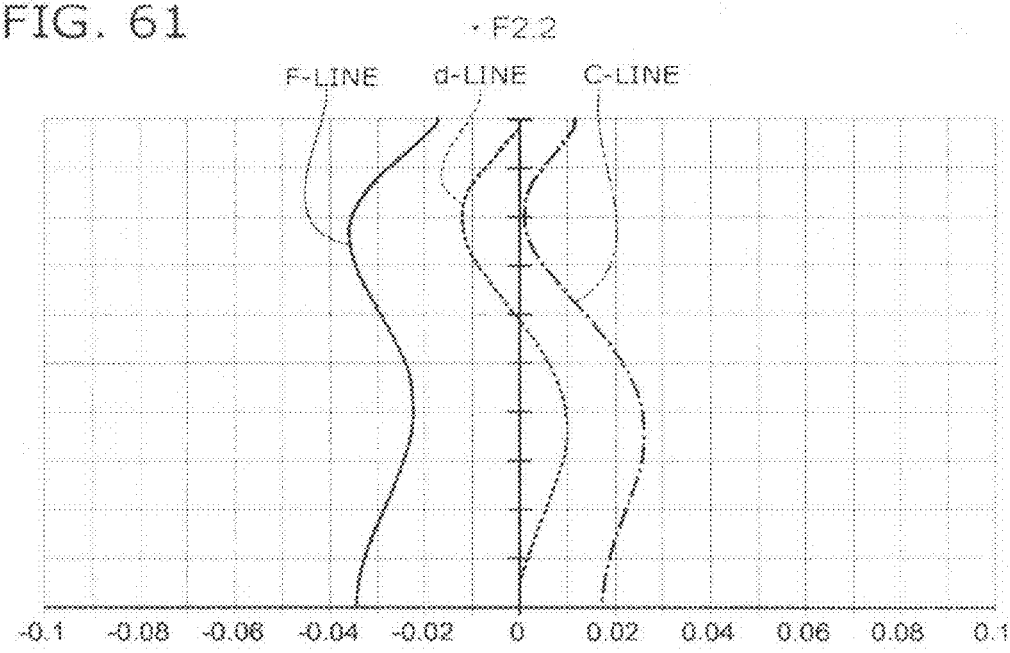
FIG. 61 is various aberration diagrams of the imaging lens according to the ninth example.
Figure 62:
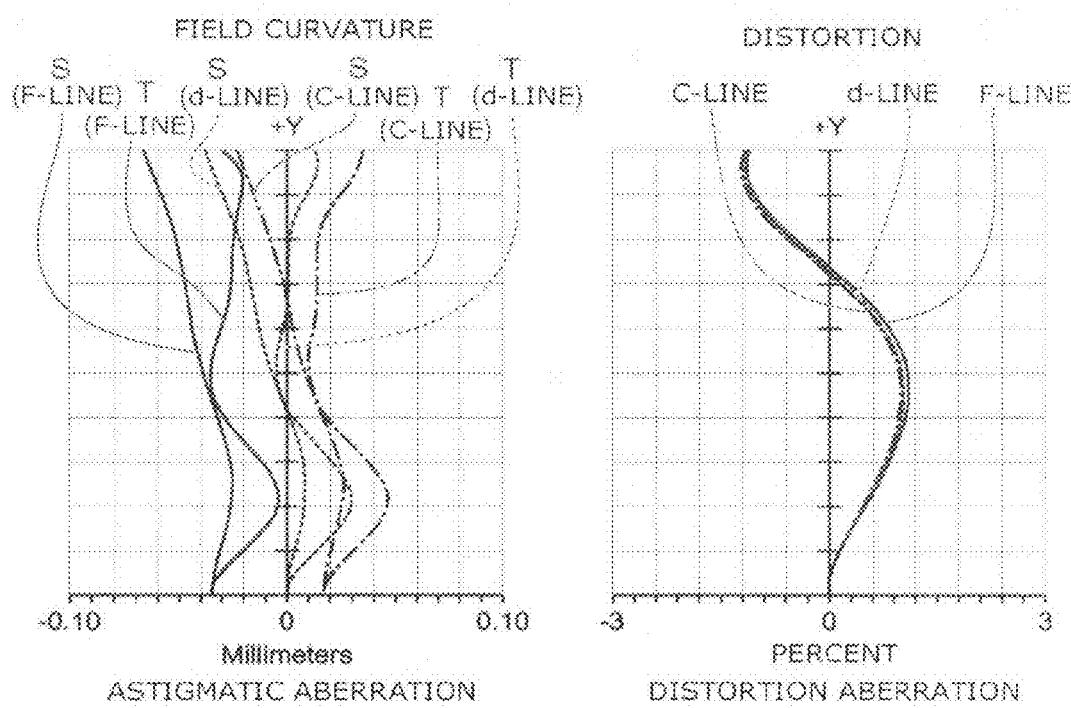
FIG. 62 is various aberration diagrams of the imaging lens according to the ninth example.

FIG. 61 and FIG. 62 are various aberration diagrams of the imaging lens according to the ninth example.

Figure 63:
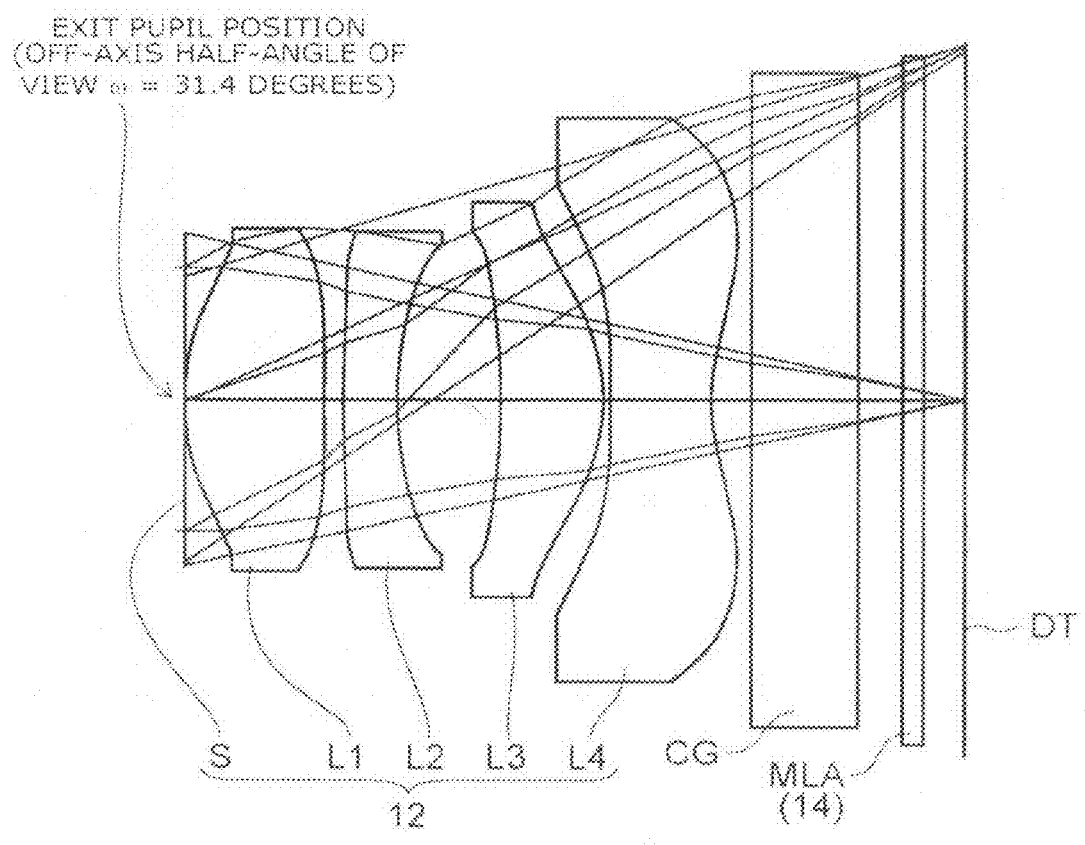
FIG. 63 illustrates the exit pupil position of the imaging lens according to the ninth example.

FIG. 63 illustrates the exit pupil position of the imaging lens according to the ninth example.

Figure 64:
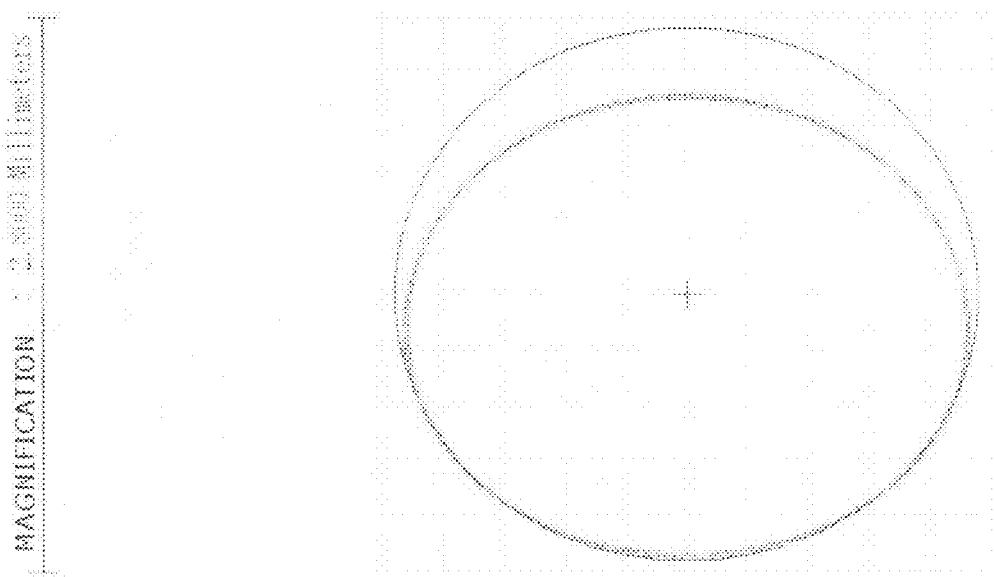
FIG. 64 illustrates the configurations and numerical values of the exit pupils of the imaging lens according to the ninth example.

FIG. 64 illustrates the configurations and numerical values of the exit pupils of the imaging lens according to the ninth example.

Table 10 recited below shows the curvature radius Ri, the spacing Di, the refractive index nd, and the dispersion value νd for the surfaces of the imaging optical system 12 according to the ninth example.

TABLE 10

| f 4.69 mm F-NUMBER = 2.2 ω = 31.4° | | | | |
|---|---|---|---|---|
| SURFACE | Ri | Di | nd | νd |
| APERTURE STOP(s) | INFINITY | 0.00000 | | |
| 1 | 2.12938 | 1.01962 | 1.54413 | 55.98 |
| 2 | 55.48939 | 0.13984 | | |
| 3 | 5.68597 | 0.4059 | 1.61422 | 25.58 |
| 4 | 2.98291 | 0.77601 | | |
| 5 | −5.27774 | 0.74673 | 1.54413 | 55.98 |
| 6 | −1.41245 | 0.04581 | | |
| 7 | 47.51532 | 0.74698 | 1.53438 | 56.20 |
| 8 | 1.53048 | 0.30000 | | |
| 9 (CG) | INFINITY | 0.78000 | 1.51680 | 64.16 |
| 10 | INFINITY | 0.33883 | | |
| 11 (MLA) | INFINITY | 0.15000 | 1.45844 | 67.83 |
| 12 | INFINITY | 0.30000 | | |

The aspherical surface data of the imaging optical system 12 according to the ninth example is as follows.
First Surface:
K=−2.07979281
a4=0.02094394
a6=−0.00584305
a8=0.0128969
a10=−0.00343039
a12=0.00007679
Second Surface:
K=0.000
a4=−0.04801788
a6=−0.02226239
a8=0.02187110
a10=−0.00683319
a12=−0.00000771
Third Surface:
K=3.3647356
a4=−0.07035952
a6=0.01835518
a8=−0.04842281
a10=0.07717032 a12=−0.03752560
a14=0.00602166
Fourth Surface:
K=−0.01144097
a4=−0.01511522
a6=0.01382556
a8=−0.00948128
a10=0.00363352
a12=0.00911895
a14=−0.00304805
Fifth Surface:
K=12.89250473
a4=0.04518569
a6=−0.0319430
a8=0.01874454
a10=−0.00610893
a12=0.00015106
a14=0.00007946
Sixth Surface:
K=−5.50850265
a4=−0.06312643
a6=0.02019360
a8=0.00531823
a10=−0.00159110
a12=−0.00000414
a14=−0.00000252
Seventh Surface:
K=0.00000
a4=−0.11383384
a6=0.01446762 a8=0.00712047
a10=−0.00183171
a12=0.00011129
Eighth Surface:
K=−7.81669316
a4=−0.06252056
a6=0.01564798
a8=−0.00396550
a10=0.00057440
a12=−0.00003921
f1/f=0.86
|f2|/f=2.307
TL/f=1.224
(R7+R8)/(R7−R8)=1.731
D34/f=0.0098
hc(G3R)/(D1+D2+D3+D4+D5)=0.431
ρ=0.106
ν1−ν2=55.98−25.58=30.4
CRA (incident angle of chief ray onto image plane) (angle of view of 31 degrees)=26.4°
|R4/f|=0.635
|R2/R1|=26.06
|R6/f|=0.301
|R4/R3|=0.525

As described below, Condition Formulas (1) to (13) recited above are satisfied in the example. As recited above, it can be seen that the imaging optical system 12 according to the ninth example has good performance.

Tables 11 and 12 show the values of the condition formulas of the examples.

TABLE 11

|  | FIRST EXAMPLE | SECOND EXAMPLE | THIRD EXAMPLE | FOURTH EXAMPLE | FIFTH EXAMPLE |
| --- | --- | --- | --- | --- | --- |
| CONDITION FORMULA (1) | 0.880 | 0.871 | 0.875 | 0.870 | 0.871 |
| CONDITION FORMULA (2) | 2.227 | 2.090 | 2.720 | 2.390 | 2.27 |
| CONDITION FORMULA (3) | 1.177 | 1.190 | 1.170 | 1.170 | 1.170 |
| CONDITION FORMULA (4) | 1.726 | 1.876 | 1.952 | 1.826 | 1.773 |
| CONDITION FORMULA (5) | 0.014 | 0.026 | 0.037 | 0.022 | 0.017 |
| CONDITION FORMULA (6) | 0.427 | 0.442 | 0.436 | 0.433 | 0.432 |
| CONDITION FORMULA (7) | 0.069 | 0.007 | 0.058 | 0.06 | 0.04 |
| CONDITION FORMULA (8) | 40.70 | 36.13 | 36.13 | 42.60 | 42.60 |
| CONDITION FORMULA (9) | 26.0° | 22.6° | 23.9° | 24.2° | 24.1° |
| CONDITION FORMULA (10) | 0.624 | 0.621 | 0.680 | 0.632 | 0.620 |
| CONDITION FORMULA (11) | 16.682 | 16.740 | 20.670 | 18.975 | 18.704 |
| CONDITION FORMULA (12) | 0.302 | 0.344 | 0.363 | 0.329 | 0.314 |
| CONDITION FORMULA (13) | 0.524 | 0.495 | 0.572 | 0.546 | 0.53 |

TABLE 12

|  | SIXTH EXAMPLE | SEVENTH EXAMPLE | EIGHTH EXAMPLE | NINTH EXAMPLE |
| --- | --- | --- | --- | --- |
| CONDITION FORMULA (1) | 0.852 | 0.884 | 0.885 | 0.860 |
| CONDITION FORMULA (2) | 2.099 | 2.205 | 2.200 | 2.307 |
| CONDITION FORMULA (3) | 1.180 | 1.177 | 1.176 | 1.224 |
| CONDITION FORMULA (4) | 1.727 | 1.726 | 1.73 | 1.731 |
| CONDITION FORMULA (5) | 0.013 | 0.018 | 0.019 | 0.010 |
| CONDITION FORMULA (6) | 0.432 | 0.437 | 0.436 | 0.431 |
| CONDITION FORMULA (7) | 0.062 | 0.002 | 0.020 | 0.11 |
| CONDITION FORMULA (8) | 32.65 | 41.00 | 42.67 | 30.40 |
| CONDITION FORMULA (9) | 24.9° | 24.5° | 24.4° | 26.4° |
| CONDITION FORMULA (10) | 0.629 | 0.629 | 0.628 | 0.635 |
| CONDITION FORMULA (11) | 28.40 | 17.60 | 16.99 | 26.06 |
| CONDITION FORMULA (12) | 0.303 | 0.305 | 0.305 | 0.301 |
| CONDITION FORMULA (13) | 0.497 | 0.519 | 0.526 | 0.525 |

As shown in Tables 11 and 12, each of Condition Formulas (1) to (13) recited above are satisfied in the first to ninth examples.

According to the imaging lens and the solid state imaging device according to the embodiment as described above, both a high-precision range image and a good visible image can be acquired.

Although an embodiment and examples are described hereinabove, the invention is not limited to these examples. For example, although the embodiment and examples recited above illustrate examples in which the cover glass (CG) and the microlens array (MLA) are provided, a configuration that includes only the microlens array (MLA) may be used. Also, the values illustrated in the examples recited above are merely examples; and other values may be used as long as the conditions of the invention are satisfied. Further, additions, deletions, or design modifications of the components or appropriate combinations of the features of the embodiments appropriately made by one skilled in the art in regard to the embodiments and the examples described above are within the scope of the invention to the extent that the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An imaging lens, comprising:
a first optical system including an optical axis; and
a microlens array provided between the first optical system and an imaging element,
the microlens array including a plurality of microlens units provided in a first plane,
the imaging element including a plurality of pixel groups, each of the pixel groups including a plurality of pixels,
the microlens units respectively overlapping the pixel groups when projected onto the first plane,
the first optical system including:
an aperture stop;
a first lens provided between the aperture stop and the microlens array, the first lens having a first surface, a second surface, and a positive refractive power, the first surface opposing the aperture stop, the second surface being provided between the first surface and the microlens array;
a second lens provided between the first lens and the microlens array, the second lens having a third surface, a fourth surface, and a negative refractive power, the third surface opposing the second surface, the fourth surface being provided between the third surface and the microlens array;
a third lens provided between the second lens and the microlens array, the third lens having a fifth surface, a sixth surface, and a positive refractive power, the fifth surface opposing the fourth surface, the sixth surface being provided between the fifth surface and the microlens array; and
a fourth lens provided between the third lens and the microlens array, the fourth lens having a seventh surface, an eighth surface, and a negative refractive power, the seventh surface opposing the sixth surface, the eighth surface being provided between the seventh surface and the microlens array,
a curvature radius of the first surface being positive,
each of a curvature radius of the third surface and a curvature radius of the fourth surface being positive,
each of a curvature radius of the fifth surface and a curvature radius of the sixth surface being negative,
each of a curvature radius of the seventh surface and a curvature radius of the eighth surface being positive,
at least one selected from the first to eighth surfaces having an aspherical configuration,
Formulas (1) to (5) being satisfied, where
f is a focal length of the first optical system,
f1 is a focal length of the first lens,
f2 is a focal length of the second lens,
f3 is a focal length of the third lens,
TL is a distance between the aperture stop and the imaging element,
R7 is a curvature radius of the seventh surface,
R8 is a curvature radius of the eighth surface, and
D34 is an air spacing distance along the optical axis between the third lens and the fourth lens:

$$0.85 \leq f1/f < 1.0 \tag{1}$$

$$1.5 < |f2|/f < 3.0 \tag{2}$$

$$TL/f < 1.3 \tag{3}$$

$$1 < (R7+R8)/(R7-R8) < 5 \tag{4}$$

$$0 < D34/f < 0.05 \tag{5}$$

2. The lens according to claim 1, wherein
the microlens array demagnifies an image formed by the first optical system, and
a demagnification ratio of the image due to the microlens array is not less than 0.001 and not more than 0.87.

3. The lens according to claim 1, wherein
Formula (6) is satisfied, where
a distance between the optical axis and a position where a chief ray of off-axis light rays intersects the sixth surface is hc(G3R), the off-axis light rays intersecting the optical axis,
a distance along the optical axis between the aperture stop and the sixth surface is D1+D2+D3+D4+D5,
D1 is a thickness along the optical axis of the first lens,
D2 is a product of a first distance and a first refractive index, the first distance being a distance along the optical axis between the first lens and the second lens, the first refractive index being an index of a region between the first lens and the second lens,
D3 is a thickness along the optical axis of the second lens,
D4 is a product of a second distance and a second refractive index, the second distance being a distance along the optical axis between the second lens and the third lens, the second refractive index being an index of a region between the second lens and the third lens, and
D5 is a thickness along the optical axis of the third lens:

$$0.3 < hc(G3R)/(D1+D2+D3+D4+D5) < 0.5 \tag{6}$$

4. The lens according to claim 1, wherein
the first lens includes at least one selected from glass and a resin, and
each of the second lens, the third lens, and the fourth lens includes a resin.

5. The lens according to claim 1, wherein
a configuration of off-axis light rays at an exit pupil plane of the first optical system has a first diameter and a second diameter when the configuration is treated as an ellipse, the off-axis light rays intersecting the optical axis, the first diameter being along a first direction in the exit pupil plane, the second diameter being along a second direction orthogonal to the first direction and in the exit pupil plane,
Formula (7) is satisfied, where
 a is ½ times the first diameter,
 b is ½ times the second diameter,
 ρ is flattening,
 a=hx(EXTPURX),
 b=(hy(EXTPiUR)−hy(EXTPiDW))/2, and
 ρ=|1−b/a|,
the off-axis light rays include:
 an upper light ray;
 a lower light ray positioned between the upper light ray and the optical axis at the exit pupil plane; and
 a chief ray positioned between the upper light ray and the lower light ray at the exit pupil plane,
hy(EXTPiUR) is a distance along the second direction between the optical axis and a position where the upper light ray passes through the exit pupil plane,
hy(EXTPiDW) is a distance along the second direction between the optical axis and a position where the lower light ray passes through the exit pupil plane, and
hx(EXTPURX) is ½ times a length along the first direction of the off-axis light rays at the exit pupil plane:

$$0 \leq \rho < 0.3 \qquad (7).$$

6. The lens according to claim 1, wherein
Formula (8) is satisfied, where
 ν1 is an Abbe number of the first lens, and
 ν2 is an Abbe number of the second lens:

$$0 < \nu 1 - \nu 2 \qquad (8).$$

7. The lens according to claim 1, wherein
Formula (9) is satisfied, where
 αi is an incident angle of a chief ray on a surface where the pixels are provided, and
the chief ray is a chief ray of off-axis light rays at a maximum angle of view, the off-axis light rays traveling in a direction intersecting the optical axis:

$$0° \leq \alpha i \leq 30° \qquad (9).$$

8. The lens according to claim 1, further comprising an optical filter provided between the first optical system and the microlens array.

9. The lens according to claim 1, wherein the imaging element is provided between the first optical system and a virtual imaging point of the first optical system.

10. A solid state imaging device, comprising:
the imaging lens according to claim 1; and
a solid-state imaging element to convert light passing through the imaging lens into an electrical signal.

11. The device according to claim 10, wherein the solid-state imaging element outputs a plenoptic image.

12. The device according to claim 11, wherein
the plenoptic image includes a plurality of picture cells,
each of the picture cells corresponds to one selected from a plurality of colors, the colors being different from each other, and
the device adjusts a signal balance between the colors of the plenoptic image.

13. The device according to claim 11, wherein
the plenoptic image includes a plurality of picture cells including a first picture cell corresponding to a signal of a first color, and
the device estimates a signal of a second color of the first picture cell by referring to a picture element disposed around the first picture cell, the second color being different from the first color.

14. The device according to claim 11, wherein
the plenoptic image includes a plurality of image points corresponding to a first point on a subject, and
the device calculates a correspondence between the first point and each of the image points.

15. The device according to claim 14, wherein
the device calculates a two-dimensional image by synthesizing a picture cell value of each of the image points based on the correspondence and calculating a post-synthesis signal corresponding to the first point.

* * * * *